(12) United States Patent
Kubo et al.

(10) Patent No.: US 11,606,187 B2
(45) Date of Patent: Mar. 14, 2023

(54) TRANSMITTING DEVICE, RECEIVING DEVICE, REPEATING DEVICE, AND TRANSMISSION/RECEPTION SYSTEM

(71) Applicant: THINE ELECTRONICS, INC., Tokyo (JP)

(72) Inventors: Shunichi Kubo, Tokyo (JP); Satoshi Miura, Tokyo (JP); Takayuki Suzuki, Tokyo (JP)

(73) Assignee: THINE ELECTRONICS, INC., Tokyo (JP)

(*) Notice: Subject to any disclaimer, the term of this patent is extended or adjusted under 35 U.S.C. 154(b) by 0 days.

(21) Appl. No.: 16/669,841

(22) Filed: Oct. 31, 2019

(65) Prior Publication Data

US 2020/0145182 A1 May 7, 2020

(30) Foreign Application Priority Data

Nov. 2, 2018 (JP) .............................. JP2018-207503

(51) Int. Cl.
*H04L 7/00* (2006.01)
*H04L 27/04* (2006.01)
(Continued)

(52) U.S. Cl.
CPC .......... *H04L 7/0331* (2013.01); *H03L 7/0807* (2013.01); *H04L 7/005* (2013.01); *H04L 7/065* (2013.01); *H04L 27/04* (2013.01)

(58) Field of Classification Search
CPC ..... H04L 7/0331; H04L 7/0807; H04L 7/005; H04L 7/065; H04L 27/04
(Continued)

(56) References Cited

U.S. PATENT DOCUMENTS 5,128,934 A * 7/1992 Jasinski .............. H04W 84/022
340/7.26
5,606,317 A * 2/1997 Cloonan ............. H04L 25/4908
341/58
(Continued)

FOREIGN PATENT DOCUMENTS

JP 7-115440 A 5/1995
JP 10-145378 A 5/1998
(Continued)

OTHER PUBLICATIONS

JP02013110694A, English translation (Year: 2013).*

*Primary Examiner* — Ted M Wang
(74) *Attorney, Agent, or Firm* — Sughrue Mion, PLLC

(57) ABSTRACT

One embodiment relates to a transmitting device, a receiving device, and the like for preventing increases in the number of communication links, power consumption, and circuit layout area. The transmitting device includes a high-speed signal generator, a low-speed signal generator, and a signal superimposing unit. The high-speed signal generator generates a high-speed signal having a limited frequency band. The low-speed signal generator generates a low-speed signal having a frequency lower than the frequency band of the high-speed signal. The signal superimposing unit outputs a superimposed signal of the high-speed signal and the low-speed signal. The receiving device includes a signal separator and a recovery unit. The signal separator separates the received signal into the high-speed signal and the low-speed signal. The recovery unit performs frequency tracking based on the separated low-speed signal and performs phase tracking based on the separated high-speed signal.

37 Claims, 33 Drawing Sheets

(51) Int. Cl.
  *H04L 7/033* (2006.01)
  *H03L 7/08* (2006.01)
  *H04L 7/06* (2006.01)

(58) Field of Classification Search
  USPC .......................................................... 375/376
  See application file for complete search history.

(56) References Cited

U.S. PATENT DOCUMENTS

| | | | |
|---|---|---|---|
| 9,019,259 B2 * | 4/2015 | Ozawa | H04L 7/0008 375/358 |
| 2003/0043437 A1 * | 3/2003 | Stough | H04B 10/5055 398/141 |
| 2007/0297804 A1 * | 12/2007 | Honda | H04B 10/25133 398/147 |
| 2009/0148167 A1 * | 6/2009 | Tsunoda | H04L 7/065 398/98 |
| 2011/0280570 A1 * | 11/2011 | Xia | H04B 10/2513 398/29 |
| 2012/0170698 A1 * | 7/2012 | Jinagar | H03L 7/00 375/359 |

FOREIGN PATENT DOCUMENTS

| | | | |
|---|---|---|---|
| JP | 11-98130 A | | 4/1999 |
| JP | 2004-56229 A | | 2/2004 |
| JP | 2005-142872 A | | 6/2005 |
| JP | 2006-217372 A | | 8/2006 |
| JP | 2012-44446 A | | 3/2012 |
| JP | 2012-124573 A | | 6/2012 |
| JP | 2013110694 A | * | 6/2013 |
| JP | 2014-160966 A | | 9/2014 |

* cited by examiner

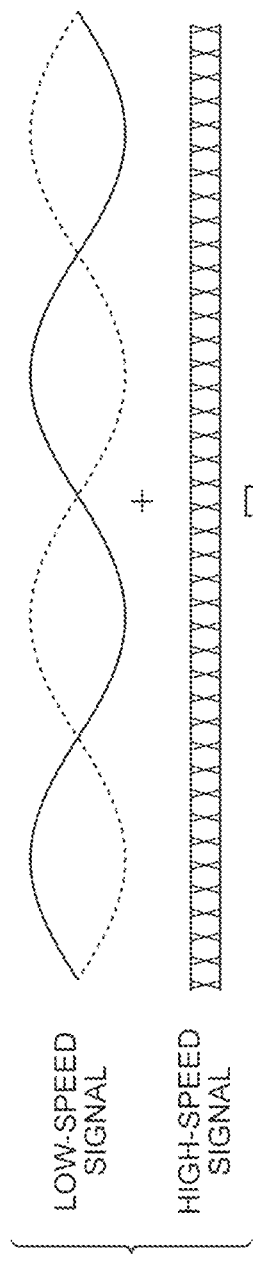 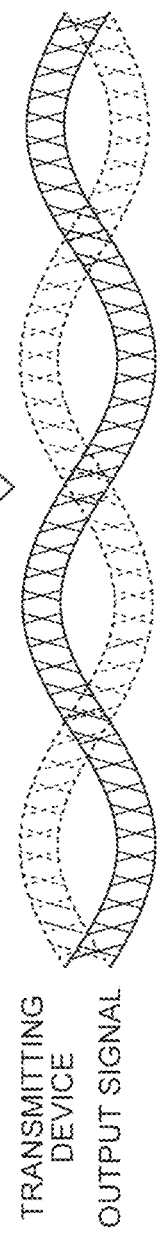  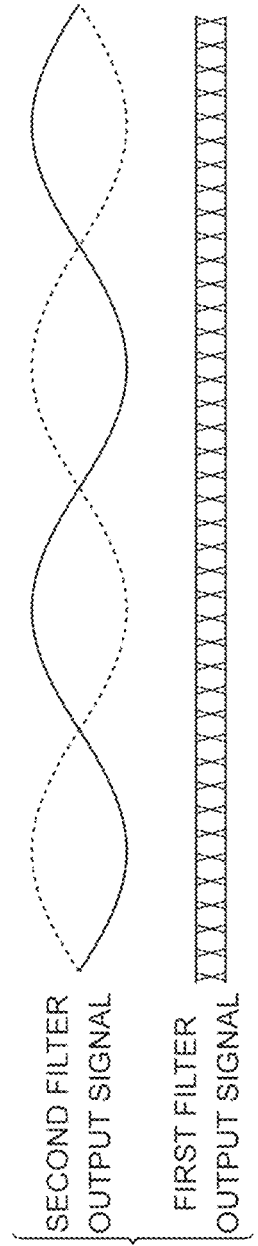
Fig.3A LOW-SPEED SIGNAL / HIGH-SPEED SIGNAL
Fig.3B TRANSMITTING DEVICE OUTPUT SIGNAL
Fig.3C RECEIVING DEVICE INPUT SIGNAL
Fig.3D SECOND FILTER OUTPUT SIGNAL / FIRST FILTER OUTPUT SIGNAL

Fig.9

| PEAK-FREQUENCY | HPF | TRIANGULAR HARMONIC WAVE | INTERFERENCE RATIO |
|---|---|---|---|
| 1MHz (FUNDAMENTAL FREQUENCY) | 0.01 | 1.00 | 0.010 |
| 3MHz | 0.03 | 0.11(1/9) | 0.003 |
| 5MHz | 0.05 | 0.04(1/25) | 0.002 |
| 7MHz | 0.07 | 0.02(1/49) | 0.002 |
| 9MHz | 0.09 | 0.01(1/81) | 0.001 |

TRANSMITTING DEVICE, RECEIVING DEVICE, REPEATING DEVICE, AND TRANSMISSION/RECEPTION SYSTEM

TECHNICAL FIELD

The present invention relates to a transmitting device, a receiving device, a repeating device, and a transmission/reception system.

BACKGROUND

A CDR (Clock Data Recovery) technique in a transmission/reception system is a technique in which a transmitting device outputs data having a clock embedded therein, and a receiving device receives a signal including the clock and recovers the clock and data. The receiving device typically includes a BBPD (Bang-Bang Phase Detector) in order to recover a clock and data from a received signal. The receiving device detects a phase shift between the received signal and the recovered clock by the BBPD, and performs feedback control to reduce the phase shift and recovers the clock and data from the received signal.

The BBPD is capable of detecting a phase shift between the received signal and the recovered clock, but incapable of detecting a frequency shift between the received signal and the recovered data. Thus, the phenomenon of frequency lock at an undesired frequency (hereinbelow, referred to as "erroneous frequency synchronization") occurs in some cases. There is known a technique in which the receiving device is provided with a PFD (Phase Frequency Detector) in addition to the BBPD to perform FTL (Frequency Tracking Loop) and PTL (Phase Tracking Loop) in order to prevent the occurrence of erroneous frequency synchronization.

In this technique for preventing the occurrence of erroneous frequency synchronization, in the first stage, when a reference clock is transmitted from the transmitting device to the receiving device, the receiving device performs frequency tracking on the basis of the reference clock using the PFD to lock frequency. In the second stage after the frequency lock, when data having a clock embedded therein is transmitted from the transmitting device to the receiving device, the receiving device performs phase tracking using the BBPD to lock phase and recovers the clock and data from the received signal.

In this technique, a reference clock communication link for transmitting the reference clock from the transmitting device to the receiving device in FTL and a data communication link for transmitting data having a clock embedded therein from the transmitting device to the receiving device in PTL may be separately provided. In this case, when the receiving device detects that the frequency lock has been completed by FTL based on the reference clock in the first stage, the receiving device performs phase lock by PTL in the second stage and recovers the clock and data from the data having the clock embedded therein. Each of the reference clock communication link and the data communication link may be a wired communication link that transmits an electric signal or may be a wireless communication link that transmits an optical signal or the like. When the reference clock communication link and the data communication link transmit an electric signal, a differential signal line for transmitting a high-speed electric signal (e.g., an electric signal having a bit rate of several Gbps) as a signal line thereof. In this technique, the reference clock communication link and the data communication link are separately provided. Thus, the number of components for transmission and reception increases.

Further, the reference clock and data having a clock embedded therein may be transmitted from the transmitting device to the receiving device using a common communication link. In this case, when the receiving device detects that frequency lock has been completed by FTL based on the reference clock in the first stage, the receiving device transmits a lock signal indicating the completion of the frequency lock to the transmitting device. The transmitting device receives the lock signal and transmits data having a clock embedded therein to the receiving device instead of the reference clock. Then, the receiving device performs phase lock by PTL in the second stage, and recovers the clock and data from the received data and outputs the recovered clock and data. This technique requires a communication link for transmitting the lock signal from the receiving device to the transmitting device in addition to the common communication link for transmitting data following the reference clock from the transmitting device and the receiving device. Thus, the number of components for transmission and reception still increases.

A transmission/reception system including a transmitting device and a receiving device is used as, for example, a television picture transmission interface. Not limited to this example, many pieces of data having clocks embedded therein are parallelly transmitted in some cases. In such a case, an increase in the number of communication links results in upsizing of the system. Thus, it is desired to reduce the number of communication links between the transmitting device and the receiving device. Japanese Patent Application Laid-Open No. H11-98130 (Patent Document 1) and Japanese Patent Application Laid-Open No. 2005-142872 (Patent Document 2) disclose inventions that make it possible to reduce the number of communication links between the transmitting device and the receiving device.

In the invention disclosed in Patent Document 1, a differential signal line is used as a communication link between a transmitting device and a receiving device. The transmitting device transmits a reference clock as a differential signal to the receiving device through the differential signal line in the first stage. When the receiving device detects that frequency lock has been completed by FTL based on the reference clock in the first stage, the receiving device transmits a lock signal to the transmitting device by changing a common level of the differential signal line. The transmitting device receives the lock signal transmitted by the change of the common level of the differential signal line and transmits data having a clock embedded therein as a differential signal to the receiving device through the differential signal line in the second stage. In this invention, a communication link for transmitting the data following the reference clock from the transmitting device and the receiving device and a communication link for transmitting the lock signal from the receiving device to the transmitting device are integrated as a common communication link.

In the invention disclosed in Patent Document 2, a transmitting device multiplexes a word clock indicating a word delimiter including a predetermined number of continuous data items included in serial data to be transmitted with the word and generates a logic signal amplitude-adjusted corresponding to the word clock as output data. The receiving device extracts the serial data the word clock from the received logic signal. In this invention, the word clock and the serial data are superimposed to generate the logic signal with the phase of the word clock indicating the word delimiter in the serial data and the phase of the word in the serial data coinciding with each other, and the logic signal is transmitted from the transmitting device to the receiving device. The logic signal is a four-level logic signal. In this invention, the logic signal obtained by superimposing the word clock and the serial data is transmitted from the transmitting device to the receiving device. Thus, it is not necessary to transmit the lock signal from the receiving device to the transmitting device, and a communication link for transmitting the lock signal is not required.

SUMMARY

The inventors have made studies for the above conventional techniques and found out the following problems. Specifically, the invention disclosed in Patent Document 1 performs two-way signal transmission between the transmitting device and the receiving device using the common communication link. Thus, the invention disclosed in Patent Document 1 is not applicable to a case where a communication link capable of performing only one-way signal transmission (e.g., an optical and wireless communication link) is used. Further, the invention disclosed in Patent Document 1 requires a series of procedures including notifying that frequency lock has been released from the transmitting device to the receiving device when the frequency lock is released in the receiving device, transmitting the reference clock from the transmitting device to the receiving device, performing frequency tracking by FTL based on the reference clock in the receiving device, notifying the completion of the frequency lock in the receiving device to the transmitting device, and transmitting data having a clock embedded therein from the transmitting device to the receiving device. Thus, it takes some time to lock frequency and phase again.

In the invention disclosed in Patent Document 2, the logic signal obtained by superimposing the word clock and the serial data is transmitted from the transmitting device to the receiving device. Thus, it is possible to solve the above problems in the invention disclosed in Patent Document 1. However, the invention disclosed in Patent Document 2 has the following problems.

In the invention disclosed in Patent Document 2, it is necessary to make the phase of the word clock and the phase of the word of the serial data coincide with each other in the transmitting device. If there is a phase difference between the word clock and the word of the serial data, the word delimiter of the serial data indicated by the word clock becomes wrong. Thus, the serial data cannot be correctly converted to parallel data in the receiving device. As the transmission rate increases, a higher phase coincidence accuracy between the word clock and the word of the serial data is required. Thus, in order to achieve high phase coincidence accuracy, power consumption in circuits increases, and the layout area when circuits are integrated on a semiconductor substrate increases.

Further, in the invention disclosed in Patent Document 2, it is necessary to make level transition times (Tr, Tf) of the word clock and the serial data coincide with each other in the transmitting device. If the level transition time of the word clock data and the level transition time of the serial data differ from each other, a problem similar to the above problem in the case where there is a phase difference occurs. In order to adjust the level transition time of the low-speed word clock to the level transition time of the high-speed serial data, a circuit for generating the word clock has to be a high-speed circuit. Thus, also this configuration increases power consumption in circuits and increases the layout area when circuits are integrated on a semiconductor substrate.

Further, in the invention disclosed in Patent Document 2, the logic signal transmitted from the transmitting device to the receiving device is a four-level logic signal. Thus, the receiving device requires three comparators in order to recover the word clock and the serial data from the received logic signal. In the three comparator, the first comparator compares, in magnitude, the level of the logic signal with a first threshold. The second comparator compares, in magnitude, the level of the logic signal with a second threshold. The third comparator compares, in magnitude, the level of the logic signal with a third threshold. The first threshold, the second threshold, and the third threshold are set to different values. When the logic signal is attenuated in a communication link between the transmitting device and the receiving device, it is necessary to change the first threshold, the second threshold, and the third threshold according to the degree of the attenuation. When the attenuation is large, it is difficult to set the first threshold, the second threshold, and the third threshold, which results in a situation where the word clock and the serial data cannot be recovered from the received logic signal. Thus, it is difficult to apply the invention disclosed in Patent Document 2 to long-haul transmission in which the attenuation of the logic signal in the communication link is large.

The present invention has been made to solve the above problems, and an object thereof is to provide a transmitting device, a receiving device, a repeating device disposed between the transmitting device and the receiving device, and a transmission/reception system including the transmitting device and the receiving device that make it possible to prevent increases in the number of communication links, power consumption, and circuit layout area, and are also applicable to long-haul transmission.

One aspect of a transmitting device according to the present invention includes a high-speed signal generator, a low-speed signal generator, and a signal superimposing unit. The high-speed signal generator generates a high-speed signal whose frequency band is limited. The low-speed signal generator generates a low-speed signal of a frequency lower than the frequency band of the high-speed signal. The signal superimposing unit outputs a superimposed signal obtained by superimposing the high-speed signal and the low-speed signal.

One aspect of a receiving device according to the present invention includes a signal separator and a recovery unit. The signal separator receives a superimposed signal obtained by superimposing a high-speed signal whose frequency band is limited and a low-speed signal of a frequency lower than the frequency band of the high-speed signal. The signal separator separates the received superimposed signal into the high-speed signal and the low-speed signal. The recovery unit performs frequency tracking on the basis of the low-speed signal outputted from the signal separator, performs phase tracking on the basis of the high-speed signal outputted from the signal separator, and recovers a clock and data.

One aspect of a repeating device according to the present invention includes a signal separator, a recovery unit, and a signal superimposing unit. The signal separator receives a superimposed signal obtained by superimposing a high-speed signal whose frequency band is limited and a low-speed signal of a frequency lower than the frequency band of the high-speed signal. The signal separator separates the received superimposed signal into the high-speed signal and the low-speed signal. The recovery unit performs frequency tracking on the basis of the low-speed signal outputted from the signal separator, performs phase tracking on the basis of the high-speed signal outputted from the signal separator, and recovers a clock and data. The signal superimposing unit outputs a superimposed signal obtained by superimposing the high-speed signal obtained from the data outputted from the recovery unit and a signal (as the low-speed signal) generated on the basis of the clock outputted from the recovery unit or the low-speed signal outputted from the signal separator.

One aspect of a transmission/reception system according to the present invention includes the transmitting device having the above structure and the receiving device having the above structure and configured to receive a signal outputted from the transmitting device and then arrived at the receiving device through a communication link. Another aspect of the transmission/reception system according to the present invention includes the transmitting device having the above structure, the repeating device having the above structure and configured to receive a signal outputted from the transmitting device and then arrived at the repeating device through a communication link and output the received signal to a communication link, and the receiving device having the above structure and configured to receive a signal outputted from the repeating device and then arrived at the receiving device through the communication link.

BRIEF DESCRIPTION OF THE DRAWINGS

FIG. 3A is a diagram for describing a high-speed signal generated by a high-speed signal generator and a low-speed signal generated by a low-speed signal generator as signals to be superimposed, FIG. 3B is a diagram for describing a signal (superimposed signal) which is superimposed by a signal superimposing unit and then outputted from a transmitting device, FIG. 3C is a diagram for describing a signal (received signal) inputted to a receiving device, and FIG. 3D is a diagram for describing a low-speed signal outputted from the second filter and a high-speed signal outputted from the first filter.

FIG. 9 is a table listing an interference amount of the low-speed signal with the frequency band of the high-speed signal in a case where the low-speed signal is a triangular wave having a fundamental frequency of 1 MHz and the cutoff frequency of the first filter is 100 MHz;

DETAILED DESCRIPTION

Figure 1:
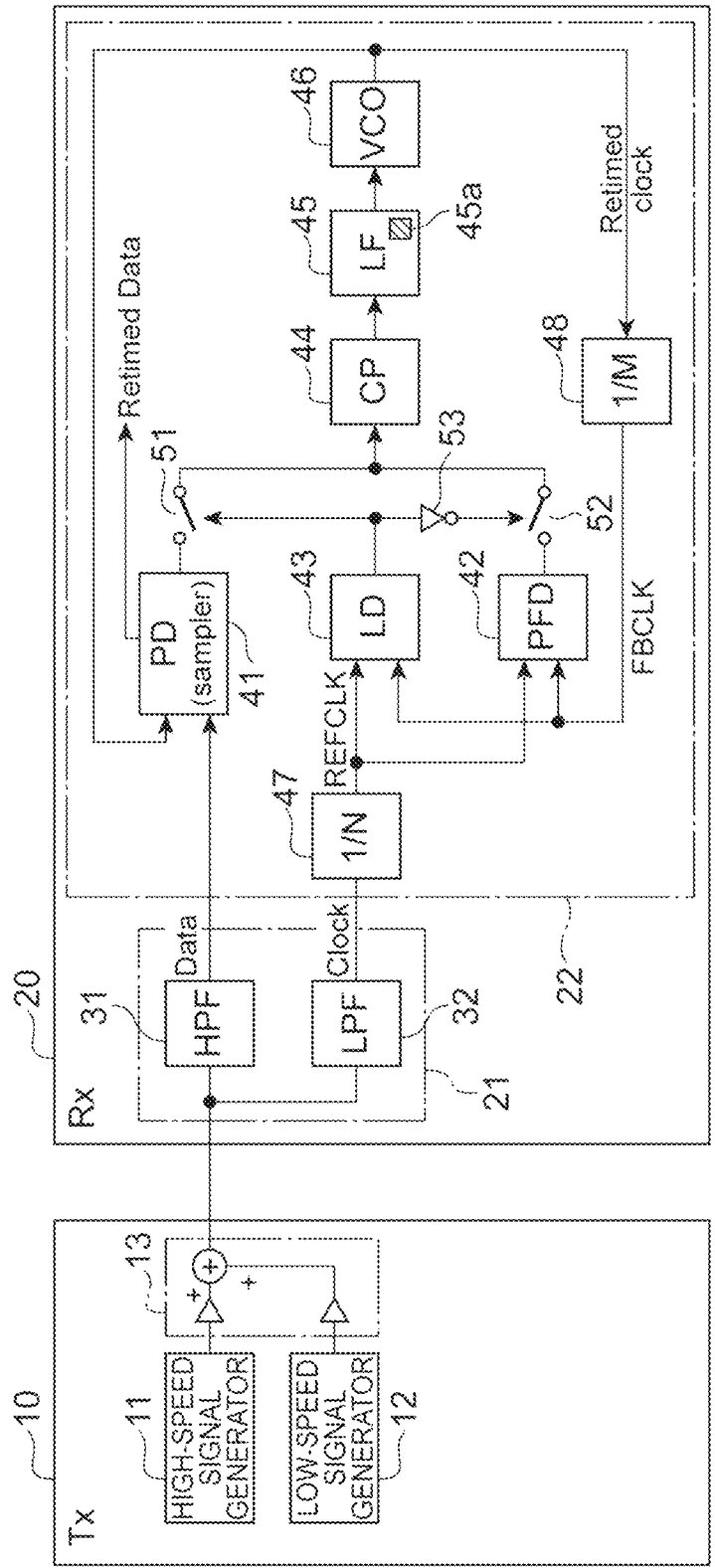
FIG. 1 is a diagram illustrating the configuration of a transmission/reception system.

Description of Embodiment of the Present Invention

First, details of an embodiment of the present invention will be individually listed and described.

(1) A transmitting device according to the present embodiment includes, as one aspect, a high-speed signal generator, a low-speed signal generator, and a signal superimposing unit. The high-speed signal generator generates a high-speed signal whose frequency band is limited. The high-speed signal generator has an output terminal provided to output the high-speed signal. The low-speed signal generator generates a low-speed signal having a frequency lower than the frequency band of the high-speed signal. The low-speed signal generator has an output terminal provided to output the low-speed signal. The signal superimposing unit generates a superimposed signal by superimposing the high-speed signal and the low-speed signal. The signal superimposing unit has a first input terminal, a second input terminal, and an output terminal. The first input terminal is electrically connected to the output terminal of the high-speed signal generator and provided to take the high-speed signal in. The second input terminal is electrically connected to the output terminal of the low-speed signal generator and provided to take the low-speed signal in. The output terminal is provided to output the superimposed signal.

(2) Various aspects are applicable to the transmitting device having the above structure. For example, as one aspect of the present embodiment, a ratio between a data rate of the high-speed signal and the frequency of the low-speed signal is preferably an integer ratio. As one aspect of the present embodiment, the low-speed signal generator preferably generates a low-speed signal having a time waveform of a sine wave or a triangular wave. As one aspect of the present embodiment, the high-speed signal generator preferably generates a high-speed signal whose frequency band is limited by encoding. As one aspect of the present embodiment, the high-speed signal generator preferably generates a high-speed signal whose frequency band is limited by mBnB encoding ensuring a DC balance. As one aspect of the present embodiment, the low-speed signal generator preferably generates a low-speed signal subjected to spread spectrum treatment (spectrum spreading). As one aspect of the present embodiment, the high-speed signal generator preferably generates a high-speed signal with spread spectrum treatment (spectrum spreading).

(3) As one aspect of the present embodiment, the high-speed signal generator preferably includes a serializer. The serializer converts parallel data to serial data and outputs the serial data as the high-speed signal through the output terminal of the high-speed signal generator. The low-speed signal generator preferably includes a phase locked loop circuit and a wiring structure. The phase locked loop (PLL) circuit generates a designation clock designating a timing (output timing) of each bit of the serial data outputted from the serializer and supplies the designation clock to the serializer. The wiring structure outputs a clock inputted to the PLL circuit or a clock outputted from the PLL circuit as the low-speed signal to the signal superimposing unit through the output terminal of the low-speed signal generator.

(4) As one aspect of the present embodiment, the signal superimposing unit preferably includes a first current mode logic (CML) circuit and a second CML circuit configured to share a resistor disposed between a power supply potential feed terminal and a ground potential feed terminal and disposed between the resistor and the ground potential feed terminal. The first CML circuit has an input terminal provided to take the high-speed signal in, and an output terminal electrically connected to the output terminal of the signal superimposing unit. The second CML circuit has an input terminal provided to take the low-speed signal in, and an output terminal electrically connected to the output terminal of the signal superimposing unit. As one aspect of the present embodiment, the signal superimposing unit may include a power supply circuit and a buffer. The power supply circuit outputs a drive voltage amplitude-modulated by the low-speed signal. The buffer is driven to superimpose the high-speed signal and the low-speed signal by the drive voltage applied from the power supply circuit. The buffer has an input terminal provided to take the high-speed signal in, and an output terminal electrically connected to the output terminal of the signal superimposing unit and provided to output the superimposed signal.

(5) As one aspect of the present embodiment, the low-speed signal and the high-speed signal preferably have an independent phase relationship.

(6) A receiving device according to the present embodiment includes, as one aspect, a signal separator and a recovery unit. The signal separator separates a superimposed signal obtained by superimposing a high-speed signal whose frequency band is limited and a low-speed signal of a frequency lower than the frequency band of the high-speed signal into the high-speed signal and the low-speed signal. The signal separator has an input terminal provided to receive the superimposed signal, a first output terminal provided to output the high-speed signal separated from the superimposed signal, and a second output terminal provided to output the low-speed signal separated from the superimposed signal. The recovery unit has a first input terminal and a second input terminal. The first input terminal is electrically connected to the first output terminal of the signal separator and provided to take the high-speed signal in. The second input terminal is electrically connected to the second output terminal of the signal separator and provided to take the low-speed signal in. The recovery unit performs frequency tracking on the basis of the low-speed signal outputted from the second output terminal of the signal separator, performs phase tracking on the basis of the high-speed signal outputted from the first output terminal of the signal separator, and recovers a clock and data.

(7) As one aspect of the present embodiment, a data rate DR of the high-speed signal, a coefficient K corresponding to a data communication system of the high-speed signal, a frequency F of the low-speed signal, and a ratio (M/N) of a frequency of the clock to the frequency of the low-speed signal at an end of frequency tracking by the recovery unit preferably satisfy a relationship represented by the following Formula (1).

$$\frac{DR}{K} = F \cdot \frac{M}{N} \qquad (1)$$

(8) As one aspect of the present embodiment, the signal separator preferably includes a first filter disposed between the input terminal and the first output terminal of the signal separator and a second filter disposed between the input terminal and the second output terminal of the signal separator. The first filter selectively outputs the high-speed signal in the received superimposed signal. The second filter selectively outputs the low-speed signal in the received superimposed signal.

(9) As one aspect of the present embodiment, a frequency F of the low-speed signal, a data rate DR of the high-speed signal, a coefficient L corresponding to a data encoding system of the high-speed signal, a ratio Vr of an amplitude of the high-speed signal to an amplitude of the low-speed signal, and an allowable interference amount Gd of the low-speed signal with the frequency band of the high-speed signal preferably satisfy a relationship represented by the following Formula (2).

$$F \leq \frac{DR}{L} \cdot \frac{1}{\sqrt{\left(\frac{1}{Gd \cdot Vr}\right)^2 - 1}} \quad (2)$$

(10) As one aspect of the present embodiment, the recovery unit preferably includes a first phase detector, a second phase detector, a lock detector, a charge pump, a loop filter, and a voltage controlled oscillator. The first phase detector has a third input terminal, a fourth input terminal, and an output terminal. The third input terminal is electrically connected to the first output terminal of the signal separator and provided to take in the high-speed signal as the first input terminal of the recovery unit. The fourth input terminal is provided to take an oscillation signal in. The output terminal is provided to output a first phase difference signal indicating a phase difference between the high-speed signal and the oscillation signal. The second phase detector has a fifth input terminal, a sixth input terminal, and an output terminal. The fifth input terminal is electrically connected to the second output terminal of the signal separator and provided to take in the low-speed signal or a signal obtained by frequency-dividing the low-speed signal as the second input terminal of the recovery unit. The sixth input terminal is provided to take in the oscillation signal or a signal obtained by frequency-dividing the oscillation signal. The output terminal is provided to output a second phase difference signal indicating a phase difference between a first input signal took-in through the fifth input terminal and a second input signal took-in through the sixth input terminal. The lock detector detects whether frequency lock is established between the first input signal and the second input signal. The charge pump has an input terminal and an output terminal. In the charge pump, the input terminal is provided to take in the second phase difference signal during a period in which the lock detector detects that frequency lock is not established or take in the first phase difference signal during a period in which the lock detector detects that frequency lock is established. The output terminal is provided to output a corrected voltage value configured to reduce the phase difference indicated by the first phase difference signal or the second phase difference signal. The loop filter has an input terminal and an output terminal. In the loop filter, the input terminal is electrically connected to the output terminal of the charge pump and provided to take the corrected voltage value in. The output terminal is provided to output a controlled voltage value increased or reduced in response to fluctuations in the took-in corrected voltage value. The voltage controlled oscillator has an input terminal and an output terminal. In the voltage controlled oscillator, the input terminal is electrically connected to the output terminal of the loop filter and provided to take the controlled voltage value in. The output terminal is provided to output the oscillation signal having a frequency corresponding to the took-in controlled voltage value. In the recovery unit having the above structure, the first phase detector outputs the recovered data and the voltage controlled oscillator outputs the recovered clock as the oscillation signal during the period in which the lock detector detects that frequency lock is established.

(11) As one aspect of the present embodiment, the receiving device may further includes a signal detector configured to detect presence or absence of the low-speed signal. The signal detector has an input terminal electrically connected to the second output terminal of the signal separator and provided to take the low-speed signal in.

(12) As one aspect of the present embodiment, the receiving device may further includes an error detector configured to detect whether the low-speed signal is normal. The error detector has an input terminal electrically connected to the second output terminal of the signal separator and provided to take the low-speed signal in. In this case, the recovery unit stops a recovery operation when the error detector detects that the low-speed signal is abnormal and resumes the recovery operation when the error detector detects that the low-speed signal is normal after the stop of the recovery operation.

(13) As one aspect of the present embodiment, the receiving device may further includes a first error detector configured to detect whether the high-speed signal is normal and a second error detector configured to detect whether the low-speed signal is normal. The first error detector has an input terminal electrically connected to the first output terminal of the signal separator (or the output terminal of the first phase detector) and provided to take the high-speed signal in. The second error detector has an input terminal electrically connected to the second output terminal of the signal separator and provided to take the low-speed signal in. The recovery unit stops a recovery operation when the first error detector detects that the high-speed signal is abnormal and resumes the recovery operation when the second error detector detects that the low-speed signal is normal after the stop of the recovery operation.

(14) As one aspect of the present embodiment, the low-speed signal and the high-speed signal preferably have an independent phase relationship.

(15) A repeating device according to the present embodiment includes, as one aspect, a signal separator, a recovery unit, and a signal superimposing unit. The signal separator separates a superimposed signal obtained by superimposing a high-speed signal whose frequency band is limited and a low-speed signal of a frequency lower than the frequency band of the high-speed signal into the high-speed signal and the low-speed signal. The signal separator has an input terminal, a first output terminal, and a second output terminal. The input terminal is provided to receive the superimposed signal. The first output terminal is provided to output the high-speed signal separated from the superimposed signal. The second output terminal is provided to output the low-speed signal separated from the superimposed signal. The recovery unit includes a first input terminal and a second input terminal. The first input terminal is electrically connected to the first output terminal of the signal separator and provided to take the high-speed signal in. The second input terminal is electrically connected to the second output terminal of the signal separator and provided to take the low-speed signal in. The recovery unit performs frequency tracking on the basis of the low-speed signal outputted from the second output terminal of the signal separator, performs phase tracking on the basis of the high-speed signal outputted from the first output terminal of the signal separator, and recovers a clock and data. The signal superimposing unit outputs a superimposed signal obtained by superimposing the high-speed signal obtained from the recovered data and a signal generated on the basis of the recovered clock or the low-speed signal outputted from the second output terminal of the signal separator. The signal superimposing unit has a first input terminal, a second input terminal, and an output terminal. The first input terminal is provided to take the high-speed signal in. The second input terminal is provided to take in the signal generated on the basis of the recovered clock or the low-speed signal. The output terminal is provided to output the superimposed signal.

(16) A transmission/reception system according to the present embodiment preferably includes, as one aspect, the transmitting device having the above structure (the transmitting device according to the present embodiment) and the receiving device having the above structure. As one aspect of the present embodiment, the transmission/reception system may include the transmitting device having the above structure (the transmitting device according to the present embodiment), one or more repeating devices (the repeating devices according to the present embodiment) each having the above structure, and the receiving device having the above structure (the receiving device according to the present embodiment). Each of the one or more repeating devices is disposed on a communication link, and receives the superimposed signal arrived at the repeating device from the transmitting device through the communication link and outputs the superimposed signal to the receiving device through the communication link.

(17) As one aspect of the present embodiment, the transmission/reception system may include a plurality of communication units each having the same structure as a communication unit including the transmitting device (the transmitting device according to the present embodiment) and the receiving device (the receiving device according to the present embodiment) connected through a communication link. In particular, any of the transmitting devices included in the communication units outputs a superimposed signal obtained by superimposing the high-speed signal and the low-speed signal, and the rest of the transmitting devices outputs the high-speed signal in a non-superimposed state. Any of the receiving devices included in the communication units that has received the superimposed signal separates the received superimposed signal into the high-speed signal and the low-speed signal and supplies the separated low-speed signal to the rest of the receiving devices.

(18) As one aspect of the present embodiment, each of the receiving devices included in the communication units preferably detects whether the superimposed signal has been received using the signal detector configured to detect the presence or absence of the low-speed signal.

Each of the aspects listed in the [Description of Embodiment of the Present Invention] is applicable to all the other aspects or all combinations of the other aspects.

Details of Embodiment of the Present Invention

Hereinbelow, a specific structure of the present embodiment will be described in detail with reference to the accompanying drawings. Note that the present invention is not limited to the following examples, and it is intended that the present invention is defined by the claims and includes all changes within the meaning and range equivalent to the claims. In the following description, identical elements are designated by the same reference signs throughout the drawings to omit redundant description.

FIG. 1 is a diagram illustrating the configuration of a transmission/reception system 1. The transmission/reception system 1 illustrated in FIG. 1 includes a transmitting device 10 and a receiving device 20 which are connected to each other through a communication link. The transmitting device 10 outputs a signal to the communication link. The receiving device 20 receives the signal outputted to the communication link from the transmitting device 10. The communication link may be a wired link or a wireless link. The communication link may be a link capable of performing communication only in one direction from the transmitting device 10 to the receiving device 20. The communication link may be a differential communication link or a single link.

The transmitting device 10 includes a high-speed signal generator 11, a low-speed signal generator 12, and a signal superimposing unit 13. The high-speed signal generator 11 generates a high-speed signal whose frequency band is limited and outputs the high-speed signal from an output terminal. The low-speed signal generator 12 generates a low-speed signal of a frequency lower than the frequency band of the high-speed signal and outputs the low-speed signal from an output terminal. The signal superimposing unit 13 inputs the high-speed signal generated by the high-speed signal generator 11 from a first input terminal and inputs the low-speed signal generated by the low-speed signal generator 12 from a second input terminal. Further, the signal superimposing unit 13 outputs a superimposed signal, which is obtained by superimposing the high-speed signal and the low-speed signal, to the communication link through an output terminal.

The receiving device 20 includes a signal separator 21 and a recovery unit 22. The signal separator 21 receives the superimposed signal, outputted from the transmitting device 10 to the communication link, from an input terminal, separates the received superimposed signal into the high-speed signal and the low-speed signal, and outputs the high-speed signal from a first output terminal and outputs the low-speed signal from a second output terminal. The recovery unit 22 performs frequency tracking on the basis of the low-speed signal outputted from the second output terminal of the signal separator 21, performs phase tracking on the basis of the high-speed signal outputted from the first output terminal of the signal separator 21, and recovers a clock and data.

The signal separator 21 includes a first filter (HPF) 31 which selectively outputs the high-speed signal in the received superimposed signal and a second filter (LPF) 32 which selectively outputs the low-speed signal in the received superimposed signal. The first filter 31 includes a high-pass filter or a band-pass filter. The second filter 32 includes a low-pass filter or a band-pass filter.

The recovery unit 22 includes a first input terminal for taking the high-speed signal in, a second input terminal for taking the low-speed signal in, a first phase detector (PD) 41, a second phase detector (PFD) 42, a lock detector (LD) 43, a charge pump (CP) 44, a loop filter (LF) 45, a voltage controlled oscillator (VCO) 46, a frequency divider (indicated by "1/N" in the drawing) 47, a feedback frequency divider (indicated by "1/M" in the drawing) 48, a switch 51, a switch 52, and an inverter circuit 53.

The first phase detector 41 inputs the high-speed signal, outputted from the first filter 31 of the signal separator 21, from one input terminal (a third input terminal corresponding to the first input terminal of the recovery unit 22), inputs an oscillation signal, outputted from the voltage controlled oscillator 46, from the other input terminal (a fourth input terminal), and outputs a first phase difference signal indicating a phase difference between these two signals from an output terminal. The first phase detector 41 is a Bang-Bang phase detector (BBPD).

The second phase detector 42 inputs a signal obtained by frequency-dividing the low-speed signal outputted from the second filter 32 of the signal separator 21 by the frequency divider 47 (may be the low-speed signal before frequency-divided) from one input terminal (a fifth input terminal corresponding to the second input terminal of the recovery unit 22), inputs a signal obtained by frequency-dividing the oscillation signal outputted from the output terminal of the voltage controlled oscillator 46 by the feedback frequency divider 48 (may be the oscillation signal before frequency-divided) from the other input terminal (a sixth input terminal), and outputs a second phase difference signal indicating a phase difference between these two signals from an output terminal. The second phase detector 42 is a phase frequency detector (PFD).

The lock detector 43 detects whether frequency lock is established between the two signals inputted to the second phase detector 42. An on/off state of each of the switch 51 and the switch 52 is set in accordance with an output signal of the lock detector 43. The inverter circuit 53 is disposed between an output terminal of the lock detector 43 and the switch 52. When one of the switch 51 and the switch 52 is in an on state, the other one is brought into an off state by the inverter circuit 53. During a period in which the lock detector 43 determines that frequency lock is not established, the switch 51 is in an off state, and the switch 52 is in an on state. On the contrary, during a period in which the lock detector 43 determines that frequency lock is established, the switch 51 is in an on state, and the switch 52 is in an off state.

The charge pump 44 inputs the second phase difference signal, outputted from the second phase detector 42, from an input terminal during the period in which the lock detector 43 detects that frequency lock is not established. The charge pump 44 inputs the first phase difference signal, outputted from the first phase detector 41, from the input terminal during the period in which the lock detector 43 detects that frequency lock is established. The charge pump 44 outputs a charging current by an amount corresponding to the phase difference indicated by the input first phase difference signal or the input second phase difference signal to the loop filter 45 from an output terminal (or a discharging current by an amount corresponding to the phase difference flows from the loop filter 45 to the charge pump 44 through the output terminal). That is, the input terminal of the charge pump 44 is provided to take in the second phase difference signal during the period in which the lock detector 43 detects that frequency lock is not established or take in the first phase difference signal during the period in which the lock detector 43 detects that frequency lock is established. The output terminal of the charge pump 44 is provided to output a corrected voltage value which reduces the phase difference indicated by the first phase difference signal or the second phase difference signal.

The loop filter 45 inputs the charging current outputted from the charge pump 44 to a capacitor unit 45a and outputs a voltage value corresponding to an accumulated charge amount of the capacitor unit 45a to the voltage controlled oscillator 46. Alternatively, the loop filter 45 passes the discharging current from the capacitor unit 45a to the charge pump 44 and outputs a voltage value corresponding to the accumulated charge amount of the capacitor unit 45a to the voltage controlled oscillator 46. That is, an input terminal of the loop filter 45 is electrically connected to the output terminal of the charge pump 44 and provided to take the corrected voltage value in. An output terminal of the loop filter 45 is provided to output a controlled voltage value increased or reduced in response to fluctuations in the took-in corrected voltage value. The voltage controlled oscillator 46 inputs the voltage value, outputted from the loop filter 45, from an input terminal and outputs an oscillation signal having a frequency corresponding to the controlled voltage value to the first phase detector 41 and the frequency divider 48 from an output terminal.

The recovery unit 22 performs frequency tracking on the basis of the low-speed signal outputted from the output terminal of the second filter 32 of the signal separator 21 during the period in which the lock detector 43 detects that frequency lock is not established. The recovery unit 22 performs phase tracking on the basis of the high-speed signal outputted from the output terminal of the first filter 31 of the signal separator 21 and outputs recovered data from the output terminal of the first phase detector 41, and, on the other hand, outputs the oscillation signal outputted from the output terminal of the voltage controlled oscillator 46 as a recovered clock during the period in which the lock detector 43 detects that frequency lock is established. Further, when the lock detector 43 detects that the frequency lock is released during the phase tracking, frequency tracking can be immediately performed on the basis of the low-speed signal outputted from the second filter 32 of the signal separator 21.

In this manner, the receiving device 20 is capable of constantly inputting the low-speed signal used in frequency tracking by transmitting the signal obtained by superimposing the low-speed signal and the high-speed signal from the transmitting device 10 to the receiving device 20. The receiving device 20 may not request the transmission of the low-speed signal to the transmitting device 10 when the frequency lock is released. Thus, a communication link for requesting the transmission of the low-speed signal is not required.

Further, in the receiving device 20, the signal separator 21 separates the received superimposed signal into the high-speed signal and the low-speed signal. Thus, the high-speed signal and the low-speed signal may have any phase relationship, and the phase relationship between the low-speed signal and the high-speed signal may be independent. The phase of the high-speed signal and the phase of the low-speed signal may not coincide with each other. In addition, it is not necessary to make level transition times (Tr, Tf) of the high-speed signal and the low-speed signal coincide with each other.

Thus, it is possible to prevent an increase in the number of communication links, prevent an increase in power consumption in circuits, and also prevent an increase in the circuit layout area.

Figure 2A:
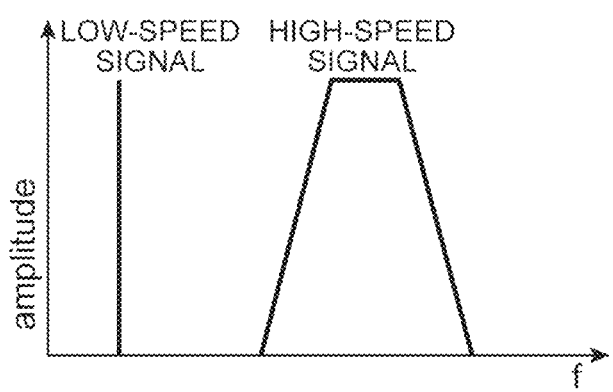
FIG. 2A is a diagram for describing a frequency band of each of a high-speed signal and a low-speed signal.
Figure 2B:
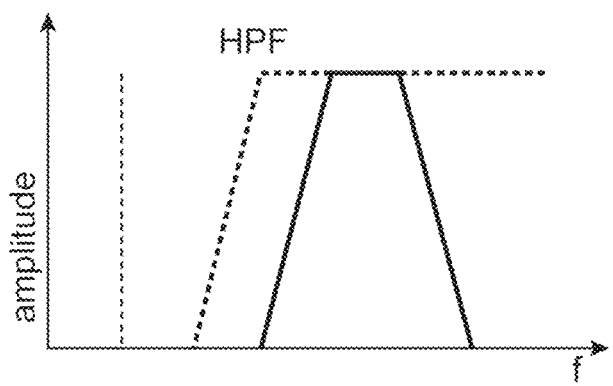
FIG. 2B is a diagram for describing a passband of a first filter, and FIG. 2C a diagram for describing a passband of a second filter.
Figure 2C:
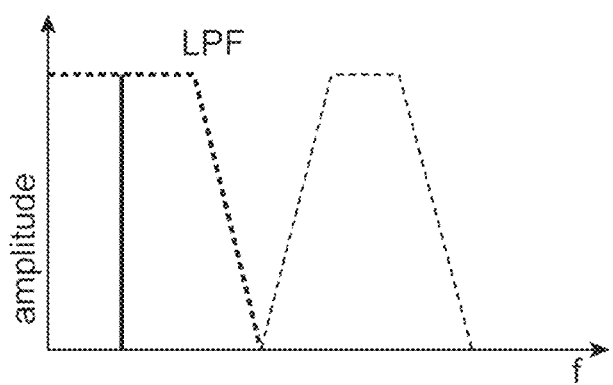

FIG. 2A is a diagram for describing a frequency distribution of each of the high-speed signal and the low-speed signal. FIG. 2B is a diagram for describing a passband of the first filter 31. FIG. 2C is a diagram for describing a passband of the second filter 32. Specifically, FIG. 2A illustrates the frequency distribution of each signal outputted from the transmitting device 10. FIG. 2B illustrates the passband of the first filter 31 of the receiving device 20 together with the frequency distribution of the signal outputted from the first filter 31. FIG. 2C illustrates the passband of the second filter 32 of the receiving device 20 together with the frequency distribution of the signal outputted from the second filter 32. As illustrated, the frequency distribution of the high-speed signal is limited, and the low-speed signal has a frequency lower than the frequency distribution of the high-speed signal (FIG. 2A). The first filter 31 is capable of selectively outputting the high-speed signal in the received signals (FIG. 2B). The second filter 32 is capable of selectively outputting the low-speed signal in the received signals (FIG. 2C).

FIG. 3A is a diagram for describing a set of the high-speed signal generated by the high-speed signal generator 11 and the low-speed signal generated by the low-speed signal generator 12 as signals to be superimposed. FIG. 3B is a diagram for describing a signal (superimposed signal) which is superimposed by the signal superimposing unit 13 and then outputted from the output terminal of the transmitting device 10. FIG. 3C is a diagram for describing a signal (received signal) inputted to the input terminal of the receiving device 20. FIG. 3D is a diagram for describing a set of the low-speed signal outputted from the second filter 32 and the high-speed signal outputted from the first filter 31. In FIGS. 3A to 3D, each signal is represented as a differential signal.

Figure 4A:
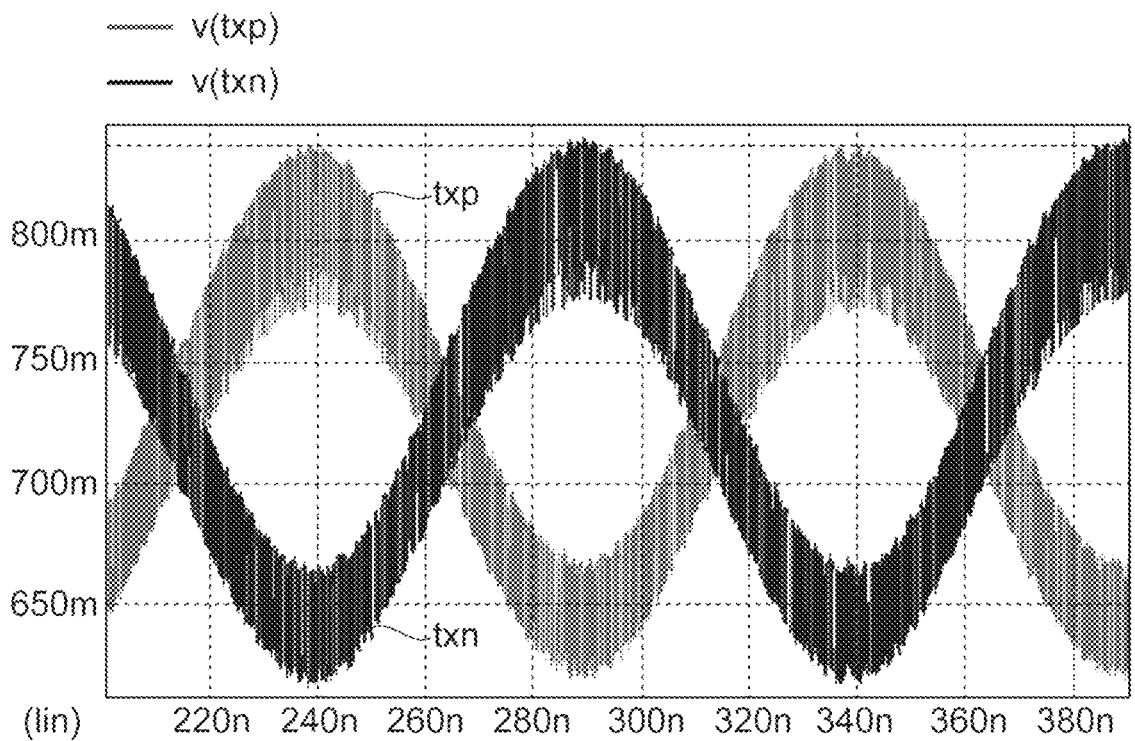
FIGS. 4A to 4C are diagrams illustrating a simulation result (eye pattern) in a case where the amplitude ratio between the high-speed signal and the low-speed signal is 2:8.
Figure 4B:
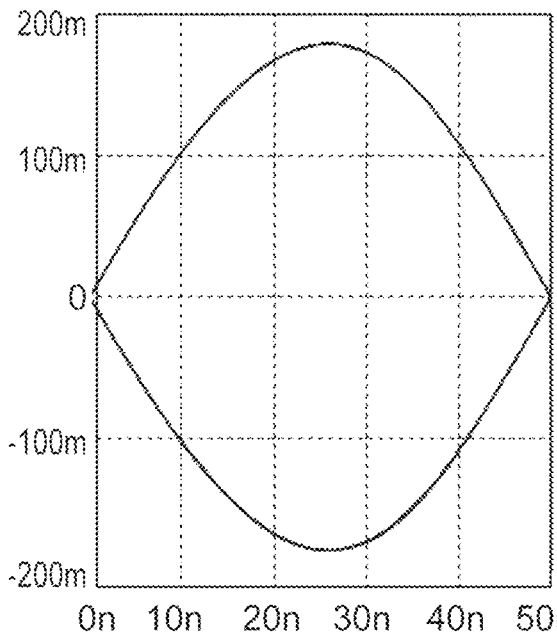
Figure 4C:
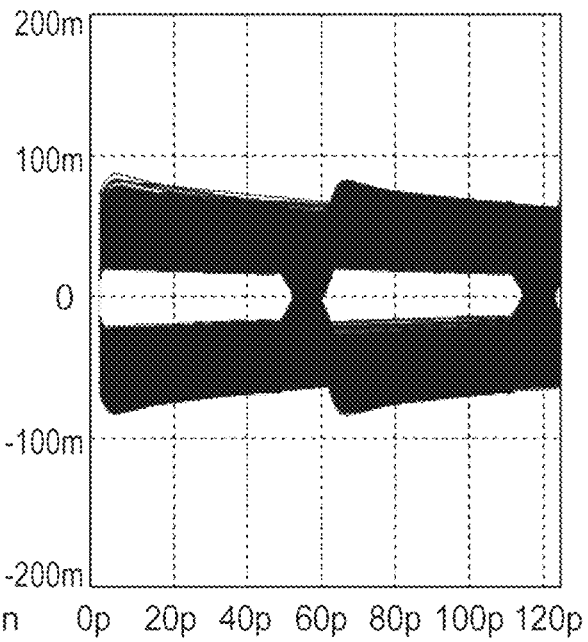
Figure 5A:
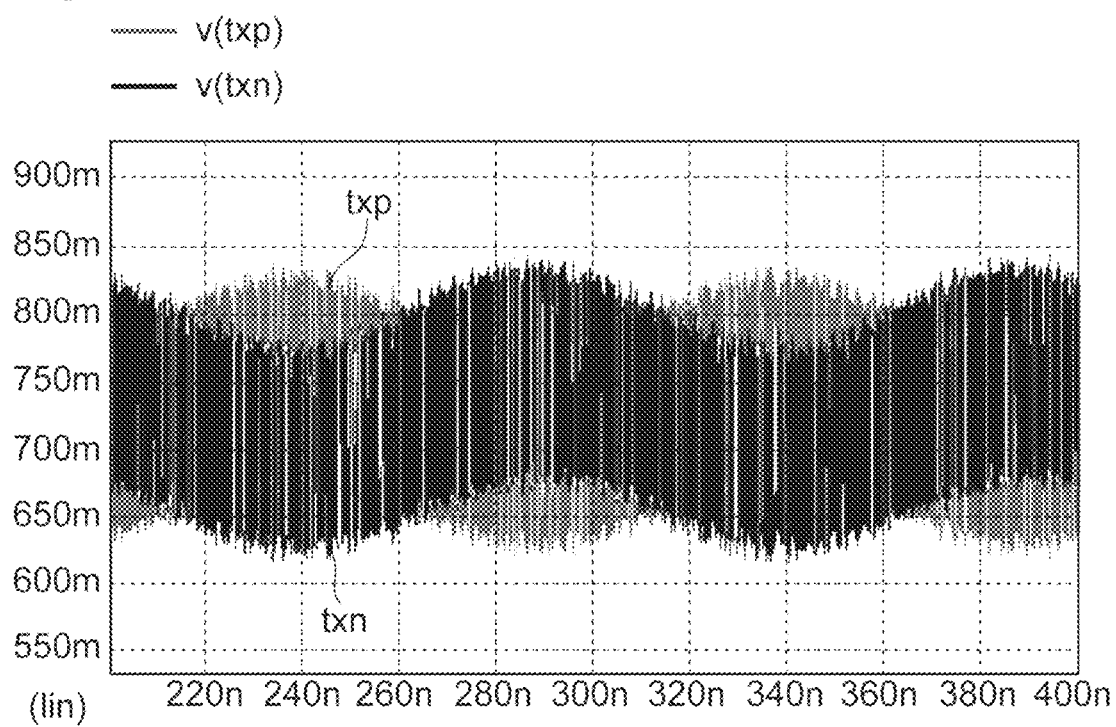
FIGS. 5A to 5C are diagrams illustrating a simulation result (eye pattern) in a case where the amplitude ratio between the high-speed signal and the low-speed signal is 8:2.
Figure 5B:
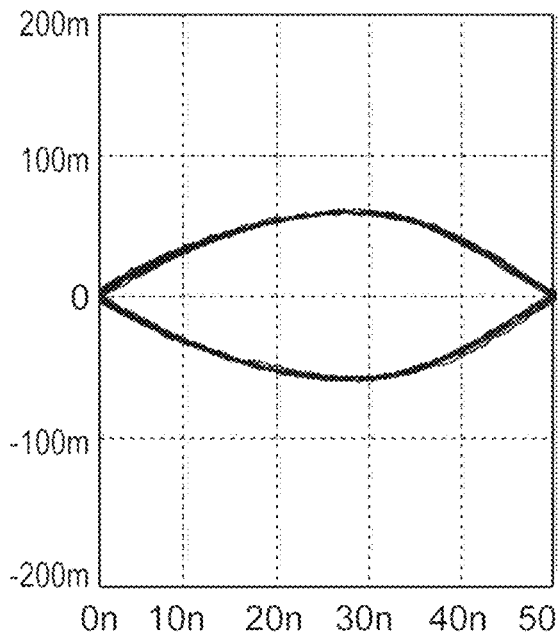
Figure 5C:
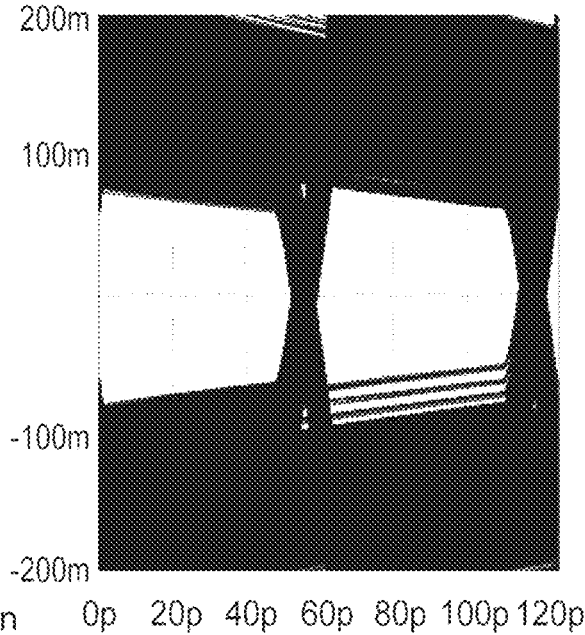

FIGS. 4A to 4C are diagrams illustrating a simulation result (eye pattern) in a case where the amplitude ratio between the high-speed signal and the low-speed signal is 2:8. In FIGS. 4A to 4C, the horizontal axis represents time and the vertical axis represents voltage. FIGS. 5A to 5C are diagrams illustrating a simulation result (eye pattern) in a case where the amplitude ratio between the high-speed signal and the low-speed signal is 8:2. In FIGS. 5A to 5C, the horizontal axis represents time and the vertical axis represents voltage. Specifically, each of the FIGS. 4A and 5A illustrates the eye pattern of the signal superimposed by the signal superimposing unit 13 and outputted from the transmitting device 10. Each of FIGS. 4B and 5B illustrates the eye pattern of the low-speed signal outputted from the second filter 32. Each of FIGS. 4C and 5C illustrates the eye pattern of the high-speed signal outputted from the first filter 31. As illustrated in FIGS. 4A to 4C and 5A to 5C, the superimposed signal received by the receiving device 20 can be separated into the high-speed signal and the low-speed signal by the first filter 31 and the second filter 32 of the signal separator 21.

In order to facilitate the separation of the high-speed signal and the low-speed signal, it is desired to minimize the interference amount of the low-speed signal with the frequency band of the high-speed signal. Thus, the low-speed signal desirably does not include information other than frequency.

The comparison between the configuration of the present embodiment and the configuration of the invention disclosed in Patent Document 2 is as follows.

In the invention disclosed in Patent Document 2, a logic signal obtained by superimposing a word clock and serial data is transmitted from the transmitting device to the receiving device. Thus, the transmitting device obtains an exclusive OR of the word clock and the serial data and superimposes the exclusive OR signal and the serial data to generate a four-level differential signal corresponding to each level of the word clock and the serial data. Thus, although a current output transitions to +I, −I if the word clock and the serial data are not superimposed, a current output transitions to +3I, +I, −I, −3I in the invention disclosed in Patent Document 2. The maximum value of current consumption is 3I.

On the other hand, in the present embodiment, not a four-level differential signal, but the signal obtained by superimposing the high-speed signal and the low-speed signal is transmitted from the transmitting device 10 to the receiving device 20. The low-speed signal has a frequency lower than the frequency band of the high-speed signal so that the low-speed signal can be separated from the high-speed signal in the receiving device 20. Thus, the low-speed signal generator 12 of the transmitting device 10 only has to operate at low speed, which makes it possible to prevent an increase in power consumption. Further, as illustrated in FIGS. 5A to 5C, the amplitude of the low-speed signal can be made smaller than the amplitude of the high-speed signal. Thus, also in this point, the low-speed signal generator 12 can prevent an increase in power consumption. For example, when the amplitude of the low-speed signal is ½ of the amplitude of the high-speed signal, and I denotes a current amount required to generate the high-speed signal, the maximum value of current consumption is 1.5I. This is ½ of the maximum value of current consumption in the invention disclosed in Patent Document 2.

Further, in the invention disclosed in Patent Document 2, the receiving device requires three comparators having different thresholds in order to separate the received four-level differential signal into the word clock and the serial data. These three comparators require a high-speed operation in order to compare the high-speed four-level differential signal with the threshold and thus have large power consumption. Further, the receiving device requires a selector which selects and outputs any one of output signals of two comparators according to a value of the serial data in order to extract the word clock. Further, the receiving device requires a low-pass filter in order to reduce glitch of the word clock which may be generated according to the selection timing of the serial data.

On the other hand, in the present embodiment, the receiving device 20 separates the received signal into the high-speed signal and the low-speed signal by the signal separator 21 and then compares the high-speed signal with a threshold by a comparator included in the first phase detector 41. Thus, only one comparator is required. Even when a comparator which compares the low-speed signal with a threshold is provided, the comparator only has to operate at low speed. Thus, the power consumption of this comparator can be approximately ¹⁄₁₀ of the power consumption of the comparator for high-speed signal. The invention disclosed in Patent Document 2 requires the three high-speed comparators. On the other hand, in the present embodiment, it is only required to use one high-speed comparator and one low-speed comparator. Thus, the power consumption can be reduced.

Figure 6:
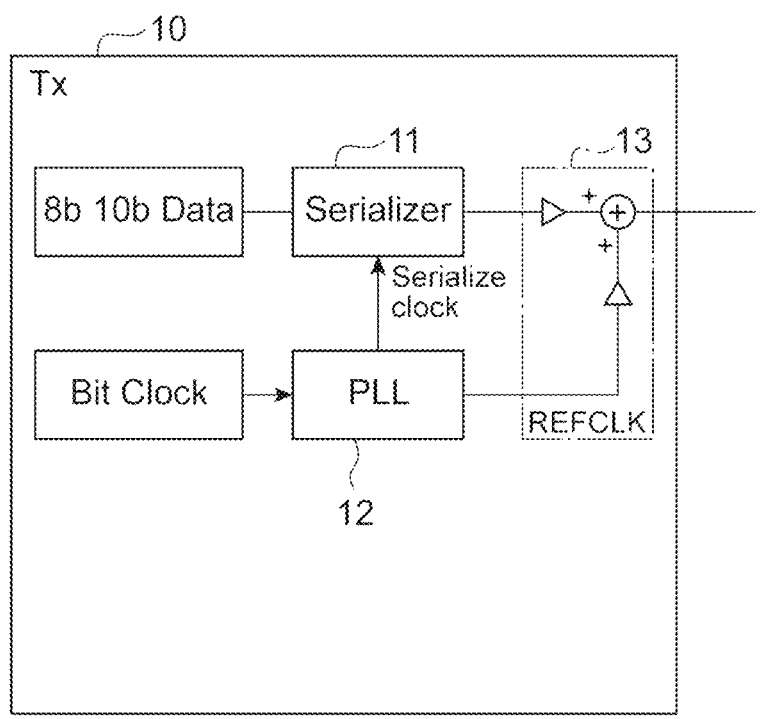
FIG. 6 is a diagram illustrating a configuration example of the transmitting device.

FIG. 6 is a diagram illustrating a configuration example of the transmitting device 10. In the configuration example illustrated in FIG. 6, the transmitting device 10 includes a serializer which converts 8b/10b encoded parallel data (in FIG. 6, represented by "8b 10b Data") took-in from an input terminal to serial data as the high-speed signal generator 11. The transmitting device 10 includes a PLL (Phase Locked Loop) circuit as the low-speed signal generator 12. The serializer as the high-speed signal generator 11 inputs a clock which is generated on the basis of a bit clock (in FIG. 6, represented by "Bit Clock") by the PLL circuit as the low-speed signal generator 12 from another input terminal and outputs each bit of serial data from an output terminal at a timing designated by the clock. Further, the PLL circuit as the low-speed signal generator 12 generates a low-speed signal on the basis of the bit clock took-in from an input terminal and outputs the generated low-speed signal from an output terminal.

Figure 7:
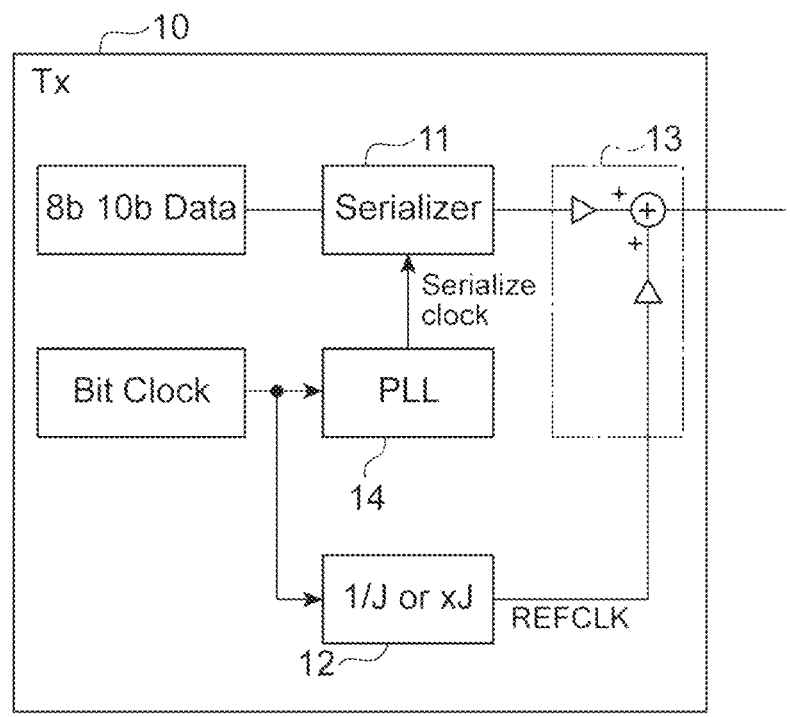
FIG. 7 is a diagram illustrating another configuration example of the transmitting device.

FIG. 7 is a diagram illustrating another configuration example of the transmitting device 10. In the configuration example illustrated in FIG. 7, the transmitting device 10 includes a serializer which converts 8b/10b encoded parallel data to serial data as the high-speed signal generator 11. The serializer as the high-speed signal generator 11 inputs a clock which is generated on the basis of a bit clock by a PLL circuit 14 and outputs each bit of serial data at a timing designated by the clock. The transmitting device 10 includes a multiplying circuit as the low-speed signal generator 12. The multiplying circuit (represented by "1/J or xJ" in the drawing) as the low-speed signal generator 12 generates a low-speed signal on the basis of a bit clock took-in from an input terminal and outputs the generated low-speed signal from an output terminal.

DR denotes the data rate of the high-speed signal. K denotes a coefficient corresponding to a data communication system of the high-speed signal. F denotes the frequency of the low-speed signal. N denotes the frequency dividing ratio of the frequency divider 47. M denotes the frequency dividing ratio of the frequency divider 48. The ratio of the frequency of a recovered clock to the frequency of the low-speed signal at the end of frequency tracking in the recovery unit 22 is M/N. When the data communication system of the high-speed signal is RZ (Return to Zero), K=0.5. When the data communication system of the high-speed signal is NRZ (Non Return to Zero), K=1. When the data communication system of the high-speed signal is PAM (Pulse Amplitude Modulation) 4, K=2. When the data communication system of the high-speed signal is PAM16, K=4. These parameters desirably have a relationship represented by the following Formula (3).

$$\frac{DR}{K} = F \cdot \frac{M}{N} \quad (3)$$

When the ratio between the data rate DR of the high-speed signal and the frequency F of the low-speed signal (DR/F), the high-speed signal and the low-speed signal being included in the superimposed signal outputted from the transmitting device 10, is an integer ratio, it is possible to satisfy the relationship of the above Formula (3) by appropriately setting the frequency dividing ratio N of the frequency divider 47 and the frequency dividing ratio M of the feedback frequency divider 48 in the receiving device 20. For example, when the data rate DR of the high-speed signal is 1 Gbps, the coefficient K is 2, the frequency dividing ratio N of the frequency divider 47 is 1, and the frequency dividing ratio M of the frequency divider 48 is 50, the frequency F of the low-speed signal is 10 MHz. The transmitting device 10 generates the low-speed signal by multiplying the bit clock according to the frequency F of the low-speed signal required in the receiving device 20.

The high-speed signal generator 11 of the transmitting device 10 desirably generates a high-speed signal having a limited frequency band by encoding so that the received signal can be separated into the high-speed signal and the low-speed signal by the signal separator 21 of the receiving device 20. As the encoding, mBnB encoding which ensures a DC balance is desirably used or Manchester encoding is also desirably used.

Further, when the signal separator 21 of the receiving device 20 separates the received signal into the high-speed signal and the low-speed signal, the interference amount of the low-speed signal with the frequency distribution of the high-speed signal is desirably approximately 1/100 or less. When a noise amount is several mV, and the interference amount of the low-speed signal with the frequency band of the high-speed signal can be reduced to the level of noise, the influence of the interference can be treated equally to noise and excluded. Assuming that the amplitude of the low-speed signal is several hundred mV, when the interference amount of the low-speed signal with the frequency band of the high-speed signal is approximately 1/100, the interference amount is several mV which is equal to noise. Accordingly, the influence of the interference can be eliminated.

For example, when the data rate of a high-speed signal encoded using 8b10b encoding is 1 Gbps, the frequency distribution of the high-speed signal is approximately 100 MHz or higher. A high-pass filter which is a primary filter and has a cutoff frequency of 100 MHz is used as the first filter 31. The attenuation of the filter is 0.01 at the frequency of 1 MHz, and 0.1 at the frequency of 10 MHz. In this case, when the amplitude ratio between the high-speed signal and the low-speed signal is 1:1, and the frequency of the low-speed signal is 1 MHz, the interference amount of the low-speed signal with the high-speed signal is 1/100. When the amplitude ratio between the high-speed signal and the low-speed signal is 10:1, and the frequency of the low-speed signal is 10 MHz, the interference amount of the low-speed signal with the high-speed signal is 1/100. The attenuation amount at 1 MHz and 10 MHz can be increased by increasing the order of the filter. However, increasing the order of the filter has a possibility of increasing the area of an IC caused by an increase in the number of elements in the IC or increasing the area of a circuit board caused by an additional element outside the IC. Thus, increasing the order of the filter is not preferred.

The low-speed signal generator 12 of the transmitting device 10 desirably generates a low-speed signal having a time waveform of a sine wave or a triangular wave in order to reduce the interference of the low-speed signal with the frequency band of the high-speed signal. In particular, when the low-speed signal is a sine wave, the interference of the low-speed signal with the frequency band of the high-speed signal can be minimized. Accordingly, even when the high-speed signal and the low-speed signal are superimposed, there is no loss in the communication quality.

F denotes the frequency of the low-speed signal. DR denotes the data rate of the high-speed signal. L denotes a coefficient corresponding to a data encoding system of the high-speed signal. Fc denotes the cutoff frequency of the first filter 31. Vr denotes the ratio of the amplitude of the high-speed signal to the amplitude of the low-speed signal. Gd denotes an allowable interference amount of the low-speed signal with the frequency band of the high-speed signal. In this case, these parameters desirably have a relationship represented by the following Formula (4). When Fc=DR/L is used, Formula (4) is represented by the following Formula (5). The coefficient L is a value corresponding to the data encoding system of the high-speed signal. When the data encoding system of the high-speed signal is 8b10b encoding, L=10. When the data encoding system of the high-speed signal is Manchester encoding, L=2.

$$F \leq \frac{Fc}{\sqrt{\left(\frac{1}{Gd \cdot Vr}\right)^2 - 1}} \quad (4)$$

$$F \leq \frac{DR}{L} \cdot \frac{1}{\sqrt{\left(\frac{1}{Gd \cdot Vr}\right)^2 - 1}} \quad (5)$$

For example, the data rate DR of the high-speed signal encoded using 8b10b encoding is 1 Gbps, and L=10. Further, the amplitude ratio Vr is 10, and the allowable interference amount Gd is 0.01. In this case, the frequency F of the low-speed signal is 10 MHz or lower.

The low-speed signal generator 12 of the transmitting device 10 desirably generates a low-speed signal with spread spectrum. EMI (Electro Magnetic Interference) radiation from the communication link can be reduced by subjecting the low-speed signal to spread spectrum. Further, in addition to the generation of the low-speed signal with spread spectrum by the low-speed signal generator 12, the high-speed signal generator 11 also desirably generates a high-speed signal with spread spectrum. In this case, the low-speed signal and the high-speed signal desirably have the same modulation period of SS (Spread Spectrum) and desirably have the same modulation intensity of SS. This is because when the frequencies of two signals input by the lock detector 43 of the receiving device 20 largely differ from each other, the lock detector 43 determines that frequency lock is released, and frequency tracking is performed. During a period in which frequency tracking is performed, the second phase detector 42 is used, and data thus cannot be recovered on the basis of the high-speed signal.

Limitations to the modulation period and the modulation intensity of SS can be adjusted by lowering the sensitivity of the lock detector 43. However, a too low sensitivity reduces the accuracy of frequency tracking and causes erroneous frequency synchronization. Thus, data cannot be correctly recovered.

Figure 8A:
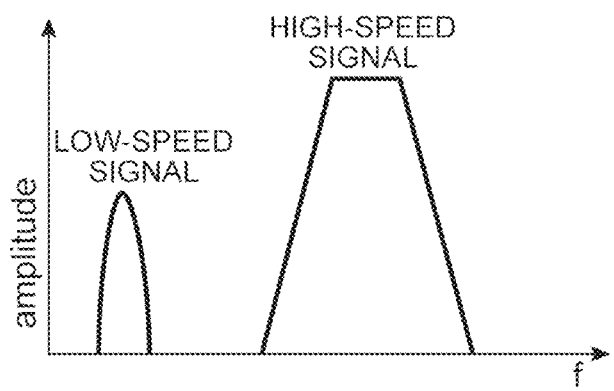
FIG. 8A is a diagram for describing a frequency band of each of a high-speed signal and an SS low-speed signal.
Figure 8B:
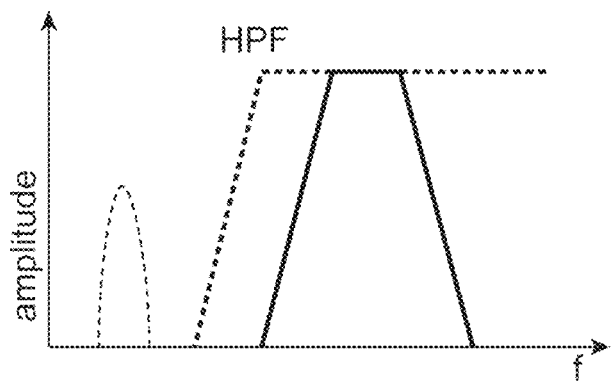
FIG. 8B is a diagram for describing a passband of the first filter.
Figure 8C:
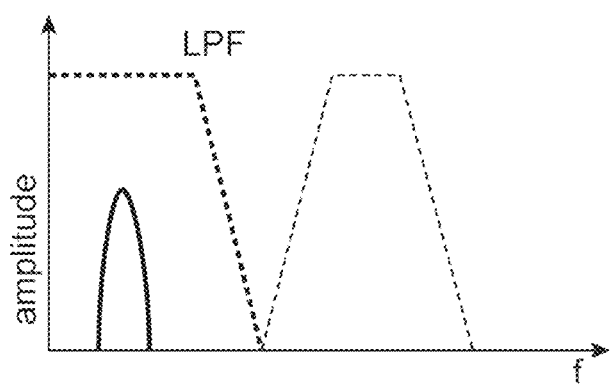
FIG. 8C is a diagram for describing a passband of the second filter.

FIG. 8A is a diagram for describing a frequency distribution of each of the high-speed signal and the low-speed signal subjected to SS. FIG. 8B is a diagram for describing a passband of the first filter 31. FIG. 8C is a diagram for describing a passband of the second filter 32. Specifically, FIG. 8A illustrates the frequency distribution of each signal outputted from the transmitting device 10. FIG. 8B illustrates the passband of the first filter 31 of the receiving device 20 together with the frequency distribution of the signal outputted from the first filter 31. FIG. 8C illustrates the passband of the second filter 32 of the receiving device 20 together with the frequency distribution of the signal outputted from the second filter 32. As compared to the low-speed signal which is not subjected to SS (FIGS. 2A to 2C), the low-speed signal subjected to SS (FIGS. 8A to 8C) has a wide frequency band and a small amplitude.

When the low-speed signal is subjected to SS, the above Formulae (3) to (5) may be satisfied on the condition that DR denotes the central data rate of the high-speed signal and F denotes the central frequency of the low-speed signal.

The low-speed signal generator 12 of the transmitting device 10 may generate a low-speed signal having a time waveform of a triangular wave in order to reduce the interference of the low-speed signal with the frequency band of the high-speed signal. A sine wave has a single frequency component. On the other hand, a triangular wave also has a harmonic component in addition to a fundamental frequency component. However, differently from a rectangular wave, the amplitude of an odd-order (n-th) harmonic component is attenuated by $n^2$ in the triangular wave. For example, the amplitude of the 11th harmonic component of the triangular wave is $1/121$ of the amplitude of the fundamental frequency component. The following Formula (6) represents a triangular wave function by a Fourier series. The following Formula (7) represents a rectangular wave function by a Fourier series. A table of FIG. 9 shows the interference amount of the low-speed signal with the frequency band of the high-speed signal in a case where the low-speed signal is a triangular wave having a fundamental frequency of 1 MHz and the cutoff frequency of the first filter 31 is 100 MHz.

$$f(x) = \sum_{n=1}^{\infty} \frac{8}{\pi} \cdot \frac{1}{n^2} \cdot \sin\left(\frac{n\pi}{2}\right) \cdot \sin(nx) \quad (6)$$

-continued $$= \frac{8}{\pi}\left\{\sin(x) - \frac{1}{9}\sin(3x) + \frac{1}{25}\sin(5x) - \frac{1}{49}\sin(7x) + ...\right\}$$

$$f(x) = \sum_{n=1}^{\infty} \frac{4}{\pi} \cdot \frac{1}{2n-1} \cdot \sin\{(2n-1)x\} \quad (7)$$

$$= \frac{4}{\pi}\left\{\sin(x) + \frac{1}{3}\sin(3x) + \frac{1}{5}\sin(5x) + \frac{1}{7}\sin(7x) + ...\right\}$$

The interference amount of a triangular wave is equal to that of a sine wave at 1 MHz, but becomes smaller by one-digit or more than that of a sine wave at 3 MHz. Thus, the influence of the interference becomes extremely small. In a case where the low-speed signal is a triangular wave having a fundamental frequency of 1 MHz and an amplitude of 100 mV, the amplitude of the third harmonic component is 0.3 mV. This is smaller than a noise level (several mV). In this manner, the influence by the harmonic component of the low-speed signal of a triangular wave is also extremely small.

In the low-speed signal generator 12 of the transmitting device 10, the low-speed signal may also include low-speed data in addition to frequency information. There are the following first to third methods as examples.

In the first method, the amplitude of the low-speed signal corresponds to the level of the low-speed data. For example, the amplitude of the low-speed signal is set to 100 mV when the low-speed data is at a low level and set to 200 mV when the low-speed data is at a high level.

In the second method, the frequency of the low-speed signal corresponds to the level of the low-speed data. In this case, the central frequency of the low-speed signal is desirably constant. Formulae (3) to (5) may be satisfied on the condition that F denotes the central frequency of the low-speed signal. The central frequency of the low-speed signal can be made constant by employing mBnB encoding or Manchester encoding.

In the third method, the duty of the low-speed signal corresponds to the level of the low-speed data. In this case, a moving average of the duty of the low-speed signal for several periods is desirably approximately 50%. The moving average of the duty of the low-speed signal for several periods can be set to approximately 50% by employing mBnB encoding or Manchester encoding.

Figure 10:
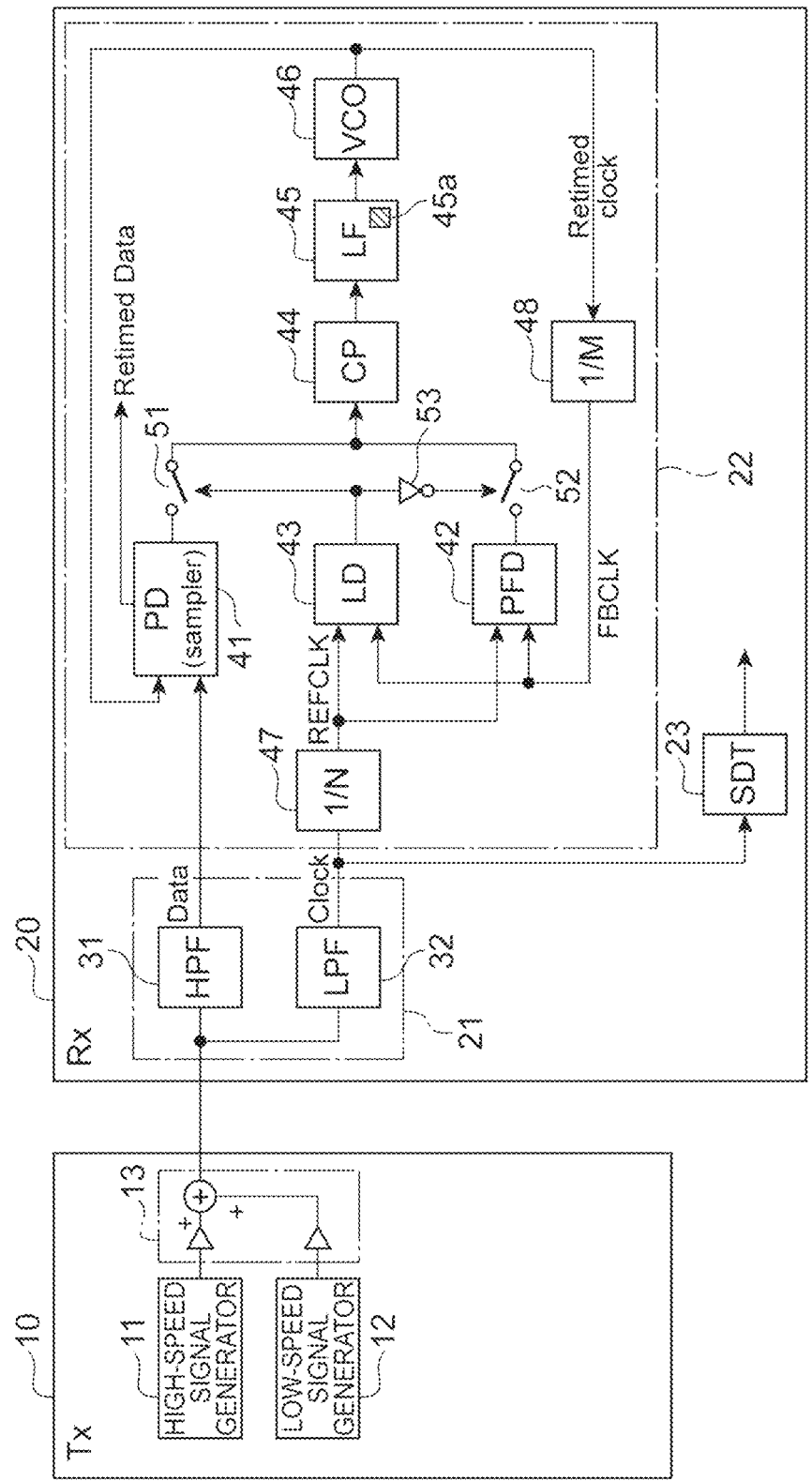
FIG. 10 is a diagram illustrating another configuration example of the receiving device.

FIG. 10 is a diagram illustrating another configuration example of the receiving device 20. In the configuration example illustrated in FIG. 10, the receiving device 20 further includes a signal detector 23 which detects the presence or absence of the low-speed signal in addition to the configuration of the receiving device illustrated in FIG. 1. The signal detector 23 detects the presence or absence of the low-speed signal on the basis of an output of the second filter 32 of the signal separator 21.

If the signal detector is not provided, the receiving device operates assuming that any signal is input even during a period in which the transmitting device outputs no signal. The receiving device treats and processes noise as a signal during a period in which no signal is actually input, and outputs unintended data to a circuit in the subsequent stage. In a case where the circuit in the subsequent stage is a video system, no image is displayed. In a case where the circuit in the subsequent stage is a communication system, normal communication is not established. Thus, in a state in which no signal is input, the receiving device desirably does not transmit wrong data to the circuit in the subsequent stage. Further, in a state in which no signal is input, the receiving device desirably does not operate in view of power consumption. Thus, desirably, the receiving device detects whether a signal is input by the signal detector so as to prevent wrong data from being transmitted to the circuit in the subsequent stage and stop part of the operation during a period in which no signal is input.

In a system that transmits information indicating whether a transmitting device outputs a signal to a receiving device using another line, the receiving device does not require a signal detector. However, in this case, a communication link for transmitting information indicating whether the transmitting device outputs a signal is additionally required in addition to a communication link for transmitting signals. Thus, such a system is not preferred in this point.

Also in a system that transmits information by changing a common level of a differential signal line like the invention disclosed in Patent Document 1, a receiving device does not require a signal detector. Further, an additional communication link is not required. However, in such a system, since a signal transmitted through the differential signal line is a high-speed signal, the signal arriving at a receiving device is attenuated. It is necessary for the receiving device to extract information indicating whether the transmitting device outputs a signal from the attenuated signal. Thus, the receiving device requires a high-speed amplifier or the like, which increases power consumption and design man-hours.

On the other hand, the receiving device 20 illustrated in FIG. 10 further includes the signal detector (SDT) 23 which detects the presence or absence of the low-speed signal. The signal detector 23 can include a simple circuit Thus, it is possible to prevent increases in power consumption and design man-hours. The signal detector 23 detects the presence or absence of the low-speed signal on the basis of an output of the signal separator 21 which separates the received signal into the high-speed signal and the low-speed signal. Thus, the signal detector 23 does not require a high-speed amplifier or the like. For example, a band of the amplifier used in the invention disclosed in Patent Document 1 requires several GHz. On the other hand, a band of the amplifier used in the receiving device 20 of the present embodiment only requires several ten MHz.

In the present embodiment, the signal detector 23 of the receiving device 20 also detects the presence or absence of the high-speed signal by detecting the presence or absence of the low-speed signal. Thus, the transmitting device 10 either outputs both the high-speed signal and the low-speed signal or outputs none of them. If the transmitting device 10 outputs a high-speed signal, but, on the other hand, outputs no low-speed signal, the receiving device 20 detects the absence of a signal by the signal detector 23 and does not transmit data to the circuit in the subsequent stage. Further, if the transmitting device 10 outputs no high-speed signal, but, on the other hand, outputs a low-speed signal, the receiving device 20 detects the presence of a signal by the signal detector 23. However, since no high-speed signal is actually input, wrong data is transmitted to the circuit in the subsequent stage.

Figure 11A:
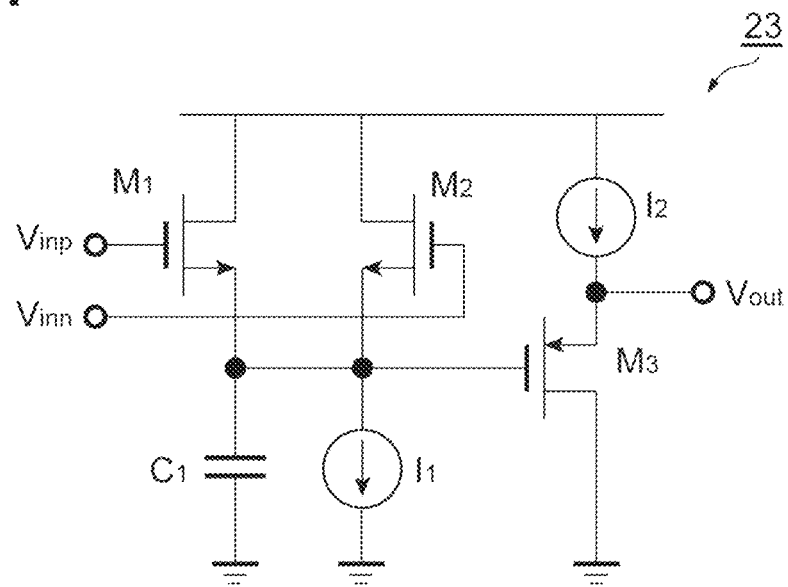
FIG. 11A is a diagram illustrating a circuit example of a signal detector.
Figure 11B:
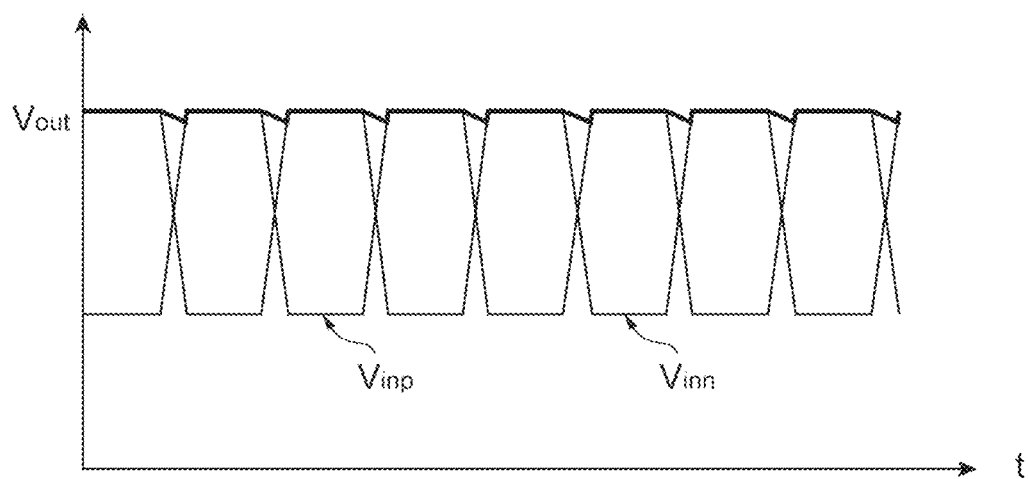
FIG. 11B is a timing chart of a signal waveform in each part.

FIG. 11A is a diagram illustrating a circuit example of the signal detector 23. FIG. 11B is a timing chart of a signal waveform in each part. In the circuit example illustrated in FIG. 11A, the signal detector 23 includes an NMOS transistor $M_1$, an NMOS transistor $M_2$, a PMOS transistor $M_3$, a capacitor $C_1$, a constant current source $I_1$, and a constant current source $I_2$. As illustrated in FIG. 11B, the signal detector 23 inputs a low-speed signal as differential signals Vinp, Vinn, and outputs a signal Vout indicating whether a period in which both the signals Vinp, Vinn are at a low level (a period in which no signal is input) has continued for a certain time.

A drain of the NMOS transistor $M_1$ is connected to a power supply potential feed terminal. A source of the NMOS transistor $M_1$ is connected to a ground potential feed terminal through the capacitor $C_1$. Vinp is inputted to a gate of the NMOS transistor $M_1$.

A drain of the NMOS transistor $M_2$ is connected to the power supply potential feed terminal. A source of the NMOS transistor $M_2$ is connected to the ground potential feed terminal through the constant current source $I_1$. Vinn is inputted to a gate of the NMOS transistor $M_2$.

A source of the PMOS transistor $M_3$ is connected to the power supply potential feed terminal through the constant current source $I_2$. A drain of the PMOS transistor $M_3$ is connected to the ground potential feed terminal. A gate of the PMOS transistor $M_3$ is connected to the source of the NMOS transistor $M_1$ and the source of the NMOS transistor $M_2$. The potential of the source of the PMOS transistor $M_3$ corresponds to the output signal Vout.

During a period in which no signal is input, both Vinp and Vinn are at a low level. Thus, a state in which both the NMOS transistor $M_1$ and the NMOS transistor $M_2$ are in an off state is continued. During this period, no charge is accumulated on the capacitor $C_1$ through the NMOS transistor $M_1$ or the NMOS transistor $M_2$, but only charge flows out of the capacitor $C_1$ by the constant current source $I_1$. As a result, the PMOS transistor $M_3$ becomes an on state, and the output signal Vout becomes a low level.

During a period in which a signal is input, Vinp and Vinn alternately become a high level. Thus, a time in which both the NMOS transistor $M_1$ and the NMOS transistor $M_2$ are in an off state is short. During this period, the amount of charge accumulated on the capacitor $C_1$ through the NMOS transistor $M_1$ or the NMOS transistor $M_2$ is substantially equal to the amount of charge flowing out of the capacitor $C_1$ by the constant current source $I_1$. As a result, the PMOS transistor $M_3$ remains in an off state, and the output signal Vout becomes a high level.

The signal detector 23 is capable of detecting whether a signal is input on the basis of the level of the output signal Vout.

Figure 12A:
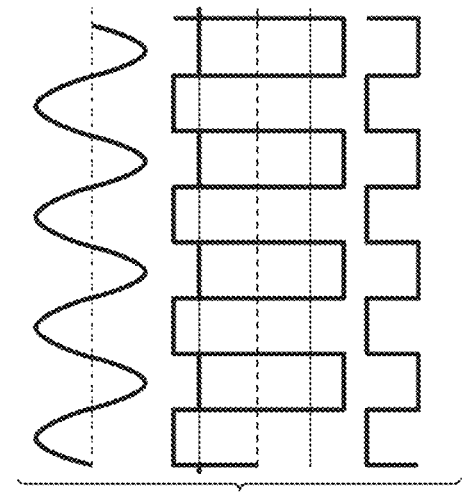
FIG. 12A is a diagram illustrating another circuit example of the signal detector.
Figure 12B:
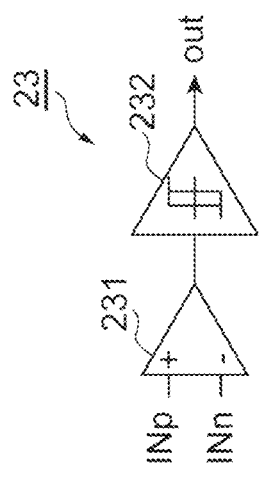
FIGS. 12B to 12D are timing charts of a signal waveform in each part.
Figure 12C:
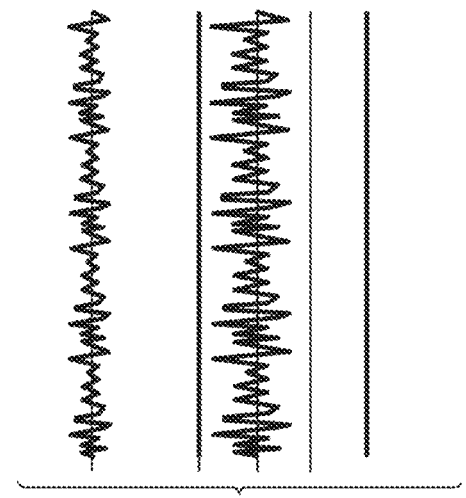
Figure 12D:
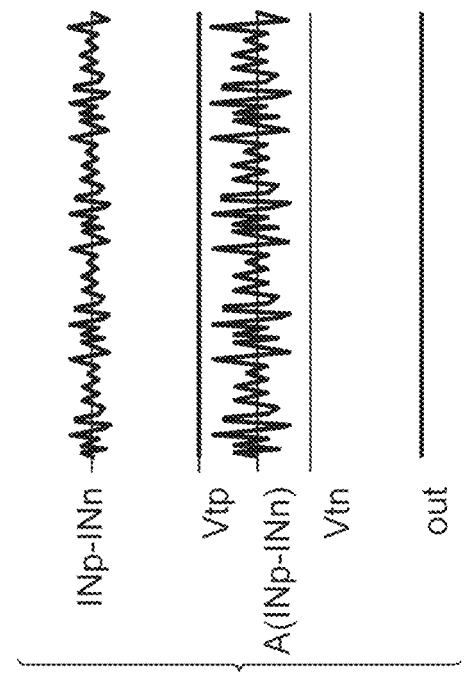

FIG. 12A is a diagram illustrating another circuit example of the signal detector 23. FIGS. 12B to 12D are timing charts of the signal waveform in each part. In the circuit example illustrated in FIG. 12A, the signal detector 23 includes an amplifier 231 and a Schmitt trigger buffer 232. The amplifier 231 inputs a low-speed signal as differential signals INp, INn, amplifies the input signal by a gain A, and outputs the amplified signal to the Schmitt trigger buffer 232. The amplifier 231 may be an amplifier that performs a low-speed operation (e.g., several ten MHz). Each of FIGS. 12B to 12D illustrates a value of the low-speed signal (INp−INn), a value of the signal inputted to the Schmitt trigger buffer 232 (A (INp−INn)) (having a median value between an upper threshold Vtp and a lower threshold Vtn), and an output signal out of the Schmitt trigger buffer 232 in this order from top to bottom.

During a period in which no signal is input, the value (A (INp−INn)) of the signal which is outputted from the amplifier 231 and inputted to the Schmitt trigger buffer 232 is continuously maintained in a range between the threshold Vtp and the threshold Vtn of the Schmitt trigger buffer 232. Thus, a value of the output signal out from the Schmitt trigger buffer 232 does not change (FIGS. 12B and 12C).

During a period in which a signal is input, the value (A (INp−INn)) of the signal which is outputted from the amplifier 231 and inputted to the Schmitt trigger buffer 232 may fall out of the range between the threshold Vtp and the threshold Vtn of the Schmitt trigger buffer 232. Thus, the value of the output signal out from the Schmitt trigger buffer 232 changes (FIG. 12D).

The signal detector 23 is capable of detecting whether a signal is input on the basis of a state of changes in the value of the output signal out from the Schmitt trigger buffer 232.

Figure 13:
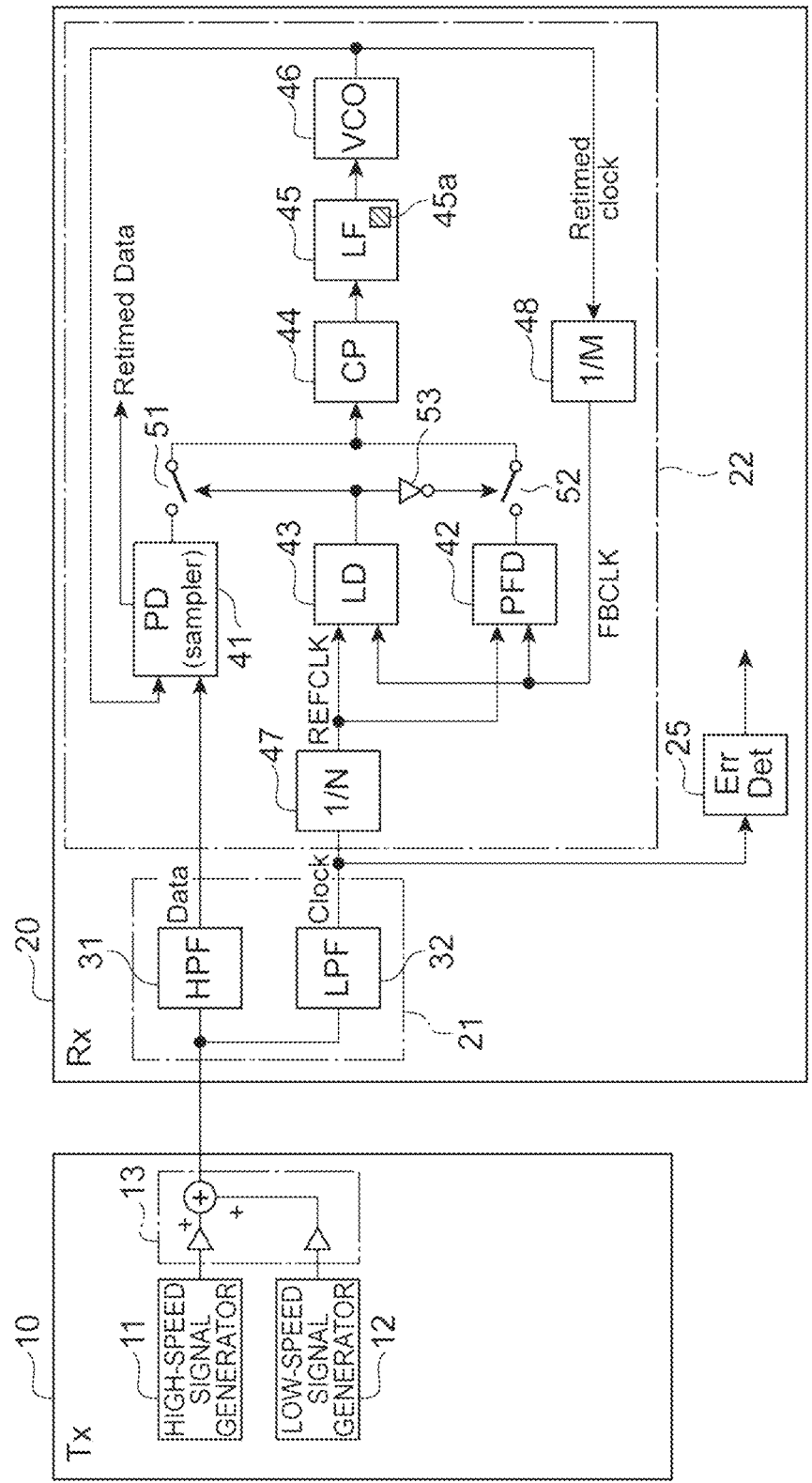
FIG. 13 is a diagram illustrating another configuration example of the receiving device.

FIG. 13 is a diagram illustrating another configuration example of the receiving device 20. In the configuration example illustrated in FIG. 13, the receiving device 20 further includes an error detector (Err Det) 25 which detects whether the low-speed signal is normal in addition to the configuration of the receiving device illustrated in FIG. 1. The error detector 25 detects whether the low-speed signal is normal on the basis of an output of the second filter 32 of the signal separator 21. The recovery unit 22 stops a recovery operation when the error detector 25 detects that the low-speed signal is abnormal and resumes the recovery operation when the error detector 25 detects that the low-speed signal is normal.

If the error detector is not provided, the first phase detector 41 makes an erroneous determination when a signal received by the receiving device has a disturbed waveform due to noise applied thereto, frequency lock is thereby released, and a recovery operation by the recovery unit (recovery of data and a clock based on the high-speed signal) is not correctly performed. The receiving device has to perform frequency tracking and phase tracking after the noise application is stopped. Thus, it takes some time to resume the recovery operation by the recovery unit.

On the other hand, there is a method that detects noise application using error detection of the high-speed signal and stops a recovery operation by the recovery unit. The recovery operation by the recovery unit can be stopped by stopping a phase detector or a charge pump.

Figure 14:
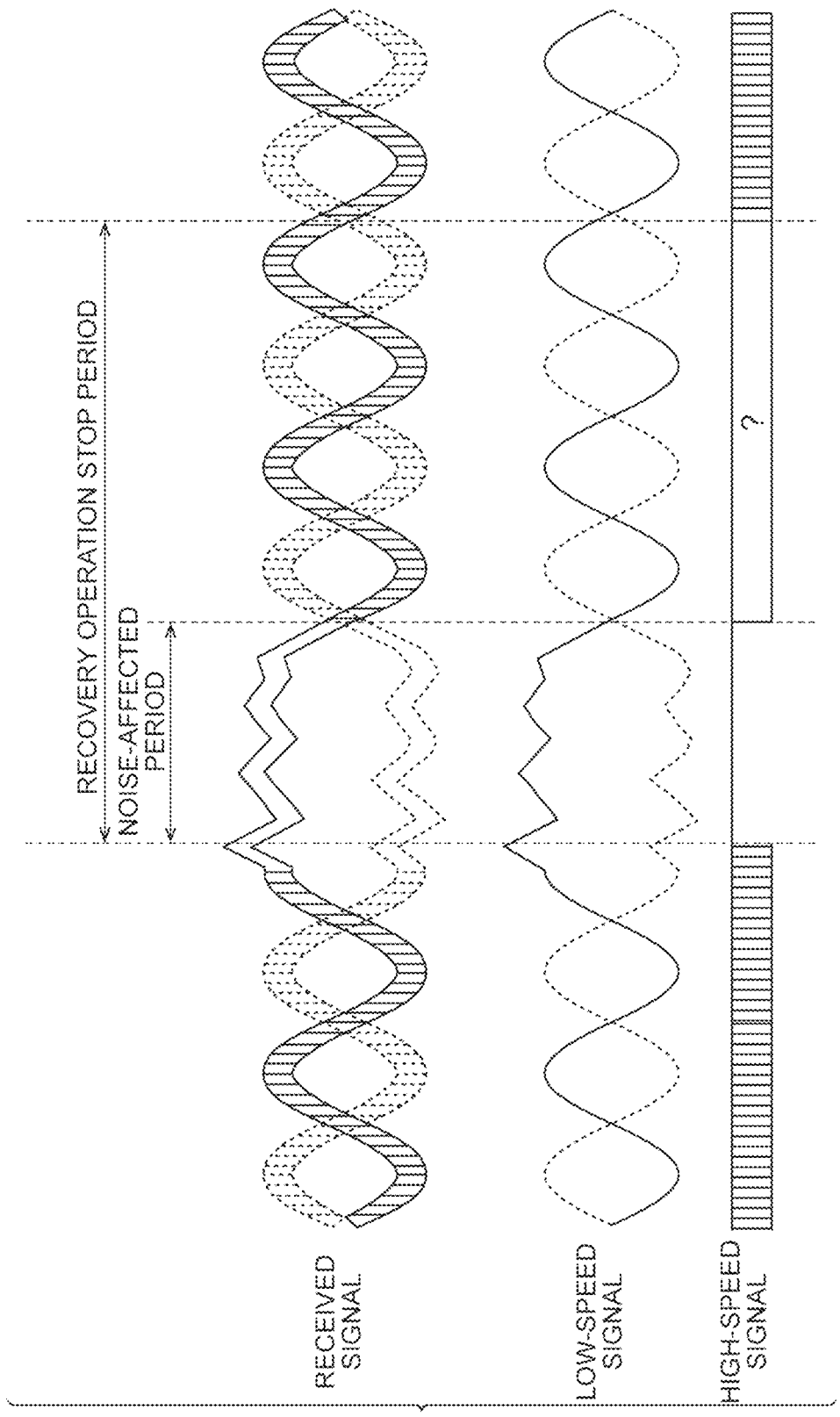
FIG. 14 is a diagram for describing noise application to a signal.

However, this method cannot detect that noise application is stopped because of the following reason. Since the frequency and phase of a signal become abnormal after noise application, the receiving device cannot correctly receive the high-speed signal, and cannot determine that the noise application is stopped by waiting for a return of the high-speed signal to a normal state. Thus, the receiving device stops the recovery operation for a certain time after the detection of noise application and resumes the recovery operation after a lapse of a certain time. Thus, the receiving device cannot resume the recovery operation until the certain time passes even through the noise application is stopped (refer to FIG. 14).

On the other hand, the receiving device 20 illustrated in FIG. 13 further includes the error detector 25 which detects whether the low-speed signal is normal. The error detector 25 is capable of detecting application of noise at an early stage on the basis of the low-speed signal and also detecting a stop of the noise application at an early stage.

Figure 15:
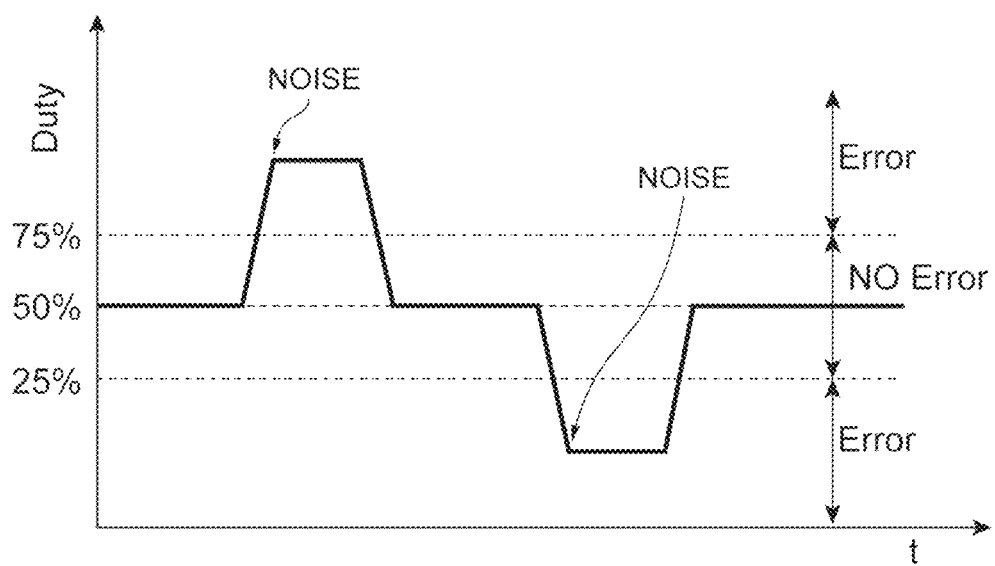
FIG. 15 is a diagram for describing the relationship between the noise application and a clock duty.

The error detector 25 is capable of detecting the presence or absence of the influence of noise application by monitoring a clock duty of the low-speed signal (refer to FIG. 15). The error detector 25 determines that the low-speed signal is not affected by noise and normal when the duty of the low-speed signal falls within a normal range. The error detector 25 determines that the low-speed signal is affected by noise and abnormal when the duty of the low-speed signal falls out of the normal range.

When the error detector 25 determines that the signal is normal, the recovery unit 22 resumes the recovery operation. When the error detector 25 determines that the signal is normal after determining that the signal is abnormal for a long time, the recovery unit 22 desirably resumes the recovery operation after performing frequency tracking.

Figure 16:
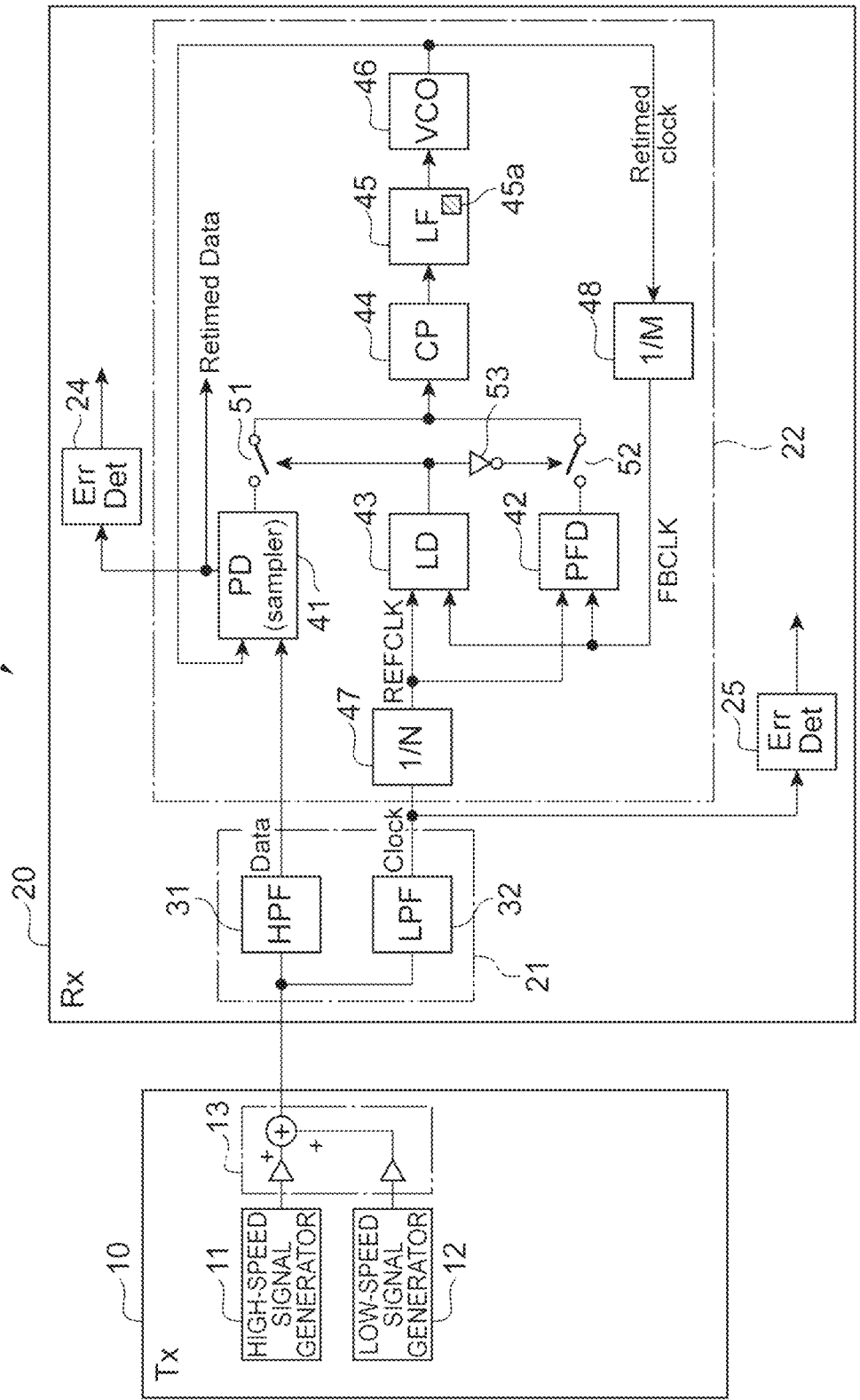
FIG. 16 is a diagram illustrating another configuration example of the receiving device.

FIG. 16 is a diagram illustrating another configuration example of the receiving device 20. In the configuration example illustrated in FIG. 16, the receiving device 20 further includes a first error detector 24 which detects whether the high-speed signal is normal and a second error detector 25 which detects whether the low-speed signal is normal in addition to the configuration of the receiving device illustrated in FIG. 1.

The first error detector 24 detects whether the high-speed signal is normal on the basis of an output of the first filter 31 of the signal separator 21 or an output of the first phase detector 41 of the recovery unit 22. The second error detector 25 detects whether the low-speed signal is normal on the basis of an output of the second filter 32 of the signal separator 21. The recovery unit 22 stops the recovery operation when the first error detector 24 detects that the high-speed signal is abnormal and then resumes the recovery operation when the second error detector 25 detects that the low-speed signal is normal.

The above configuration of FIG. 13 is not provided with an error detector that detects whether the high-speed signal is normal. In the configuration of FIG. 13, the error detector 25, which detects whether the low-speed signal is normal, monitors the low-speed signal having a low data rate or a low frequency. Thus, it takes some time to detect an error. As a result, frequency lock is released in the recovery unit 22 during a period from when the influence of noise application appears in the signal to when the error detector 25 detects an error in some cases. When the frequency lock is released, frequency tracking and phase tracking are performed after the noise application is stopped. Thus, it takes some time to resume the recovery operation in the recovery unit 22.

On the other hand, the configuration of FIG. 16 is provided with the first error detector 24 which detects whether the high-speed signal is normal in addition to the second error detector 25 which detects whether the low-speed signal is normal. The first error detector 24 is capable of monitoring the high-speed signal having a data rate several ten times to several hundred times higher than that of the low-speed signal. A period from when the influence of noise application appears in the signal to when the first error detector 24 detects an error is short. Thus, it is possible to prevent frequency lock from being released in the recovery unit 22 in this period and shorten the time required for resuming the recovery operation in the recovery unit 22 after the noise application is stopped.

Figure 17:
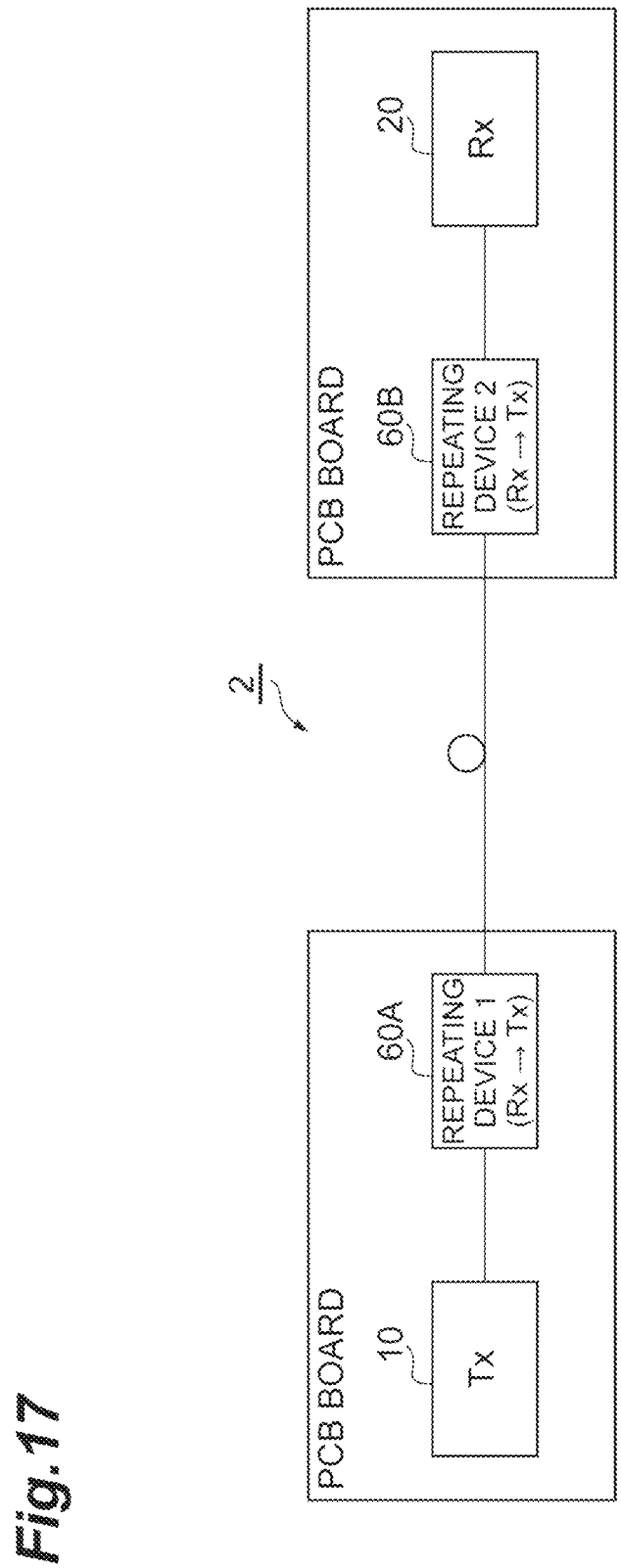
FIG. 17 is a diagram illustrating the configuration of a transmission/reception system.

FIG. 17 is a diagram illustrating the configuration of a transmission/reception system 2. The transmission/reception system 2 illustrated in FIG. 17 differs from the configuration of the transmission/reception system 1 illustrated in FIG. 1 in that a repeating device 60A and a repeating device 60B are disposed on the communication link between the transmitting device 10 and the receiving device 20. Each of the repeating devices 60A, 60B is a device that receives a signal from the preceding stage through a communication link, and relays and outputs the received signal to the subsequent stage. One or more stages of repeating devices may be provided.

A repeating device specialized in signal waveform shaping can reduce power. However, when a deterioration in the waveform of a received signal is large, the waveform of the signal cannot be completely shaped in some cases even if a plurality of stages of repeating devices are used.

On the other hand, a repeating device (retimer) that temporarily converts a signal to digital data in relay is capable of outputting a completely shaped signal to the subsequent stage when a deterioration in the waveform of the received signal is large. Thus, the latter repeating device is useful when the communication link is long.

One or more repeating devices are disposed between the transmitting device 10 and the receiving device 20. The configuration illustrated in FIG. 17 is provided with the two repeating devices 60A, 60B. The transmitting device 10 and the repeating device 60A are mounted on a first board. The repeating device 60B and the receiving device 20 are mounted on a second board. Further, the data rate of the high-speed signal is 8 GHz. In this case, typically, an attenuation of a signal in a communication link on the first board between the transmitting device 10 and the repeating device 60A is several dB. An attenuation of a signal in a communication link on the second board between the repeating device 60B and the receiving device 20 is several dB. On the other hand, an attenuation of a signal in a communication link between the repeating device 60A and the repeating device 60B may be 20 dB. The repeating devices 60A, 60B are provided in a case where the attenuation of a signal in a communication link is large in this manner.

In a case where the repeating device is a retimer, since a signal obtained by superimposing a high-speed signal and a low-speed signal is outputted from the transmitting device 10 to the receiving device 20, the repeating devices 60A, 60B disposed between the transmitting device 10 and the receiving device 20 receive the superimposed signal of the high-speed signal and the low-speed signal, separate the received signal into the high-speed signal and the low-speed signal, temporarily convert the high-speed signal to digital data, and then superimpose the high-speed signal and the low-speed signal and output the superimposed signal to the subsequent stage. Hereinbelow, the configuration of a repeating device 60, which is preferably used as the repeating devices 60A, 60B, will be described with reference to FIGS. 18 to 21.

Figure 18:
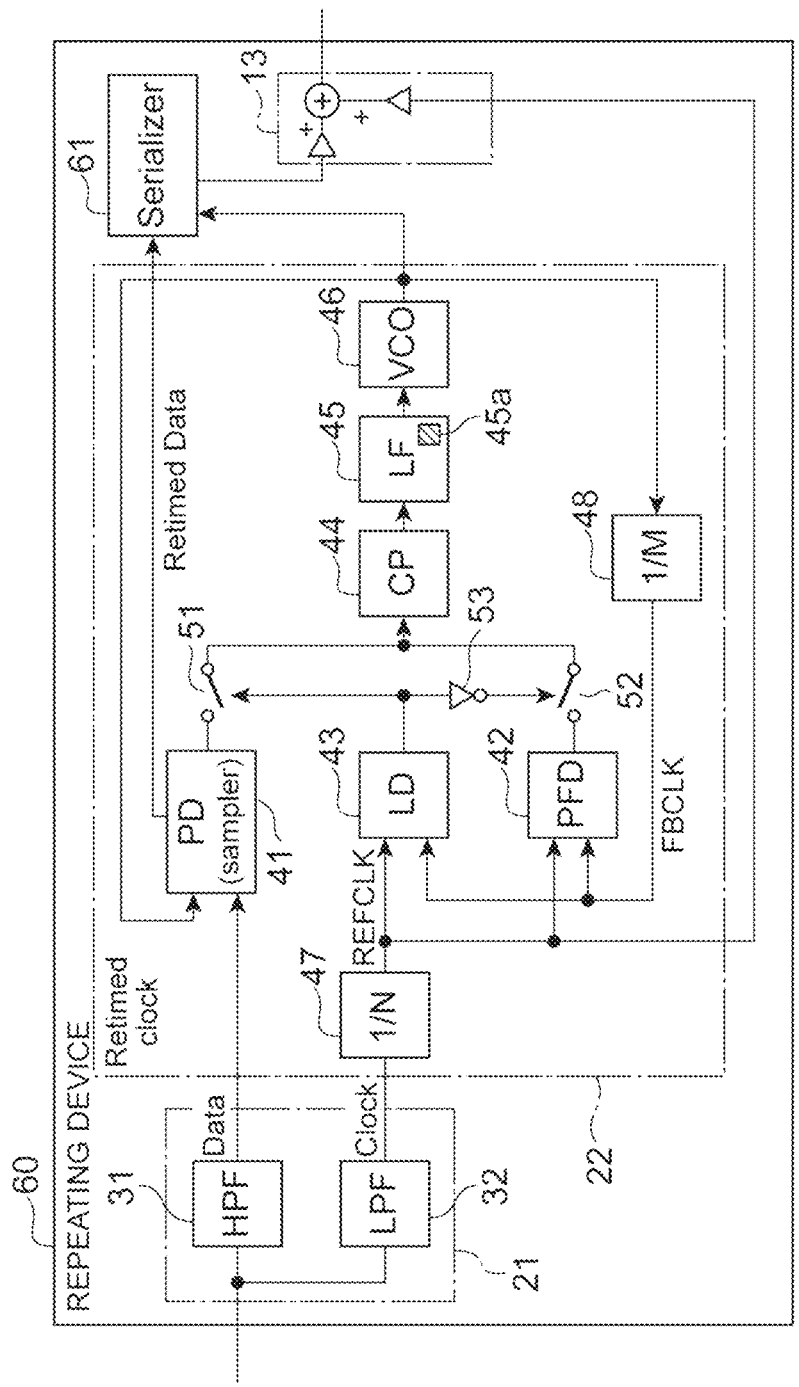
FIG. 18 is a diagram illustrating a configuration example of a repeating device.

FIG. 18 is a diagram illustrating a configuration example of the repeating device 60. The repeating device 60 illustrated in FIG. 18 includes a signal superimposing unit 13, a signal separator 21, a recovery unit 22, and a serializer 61. The signal superimposing unit 13 of the repeating device 60 has a configuration similar to the configuration of the signal superimposing unit 13 of the transmitting device 10 and operates in a manner similar to the signal superimposing unit 13 of the transmitting device 10. The signal separator 21 of the repeating device 60 has a configuration similar to the configuration of the signal separator 21 of the receiving device 20 and operates in a manner similar to the signal separator 21 of the receiving device 20. The recovery unit 22 of the repeating device 60 has a configuration similar to the configuration of the recovery unit 22 of the receiving device 20 and operates in a manner similar to the recovery unit 22 of the receiving device 20. A first phase detector 41 of the recovery unit 22 outputs recovered data (digital data) based on a high-speed signal.

The serializer 61 serializes the recovered data outputted from the first phase detector 41 to obtain serial data and outputs the serial data to the signal superimposing unit 13. The serializer 61 outputs data of each bit of the serial data at a timing designated by a recovered clock outputted from a voltage controlled oscillator 46. The signal superimposing unit 13 superimposes the high-speed signal (serial data) outputted from the serializer 61 and a low-speed signal outputted from a frequency divider 47 and outputs the superimposed signal.

Figure 19:
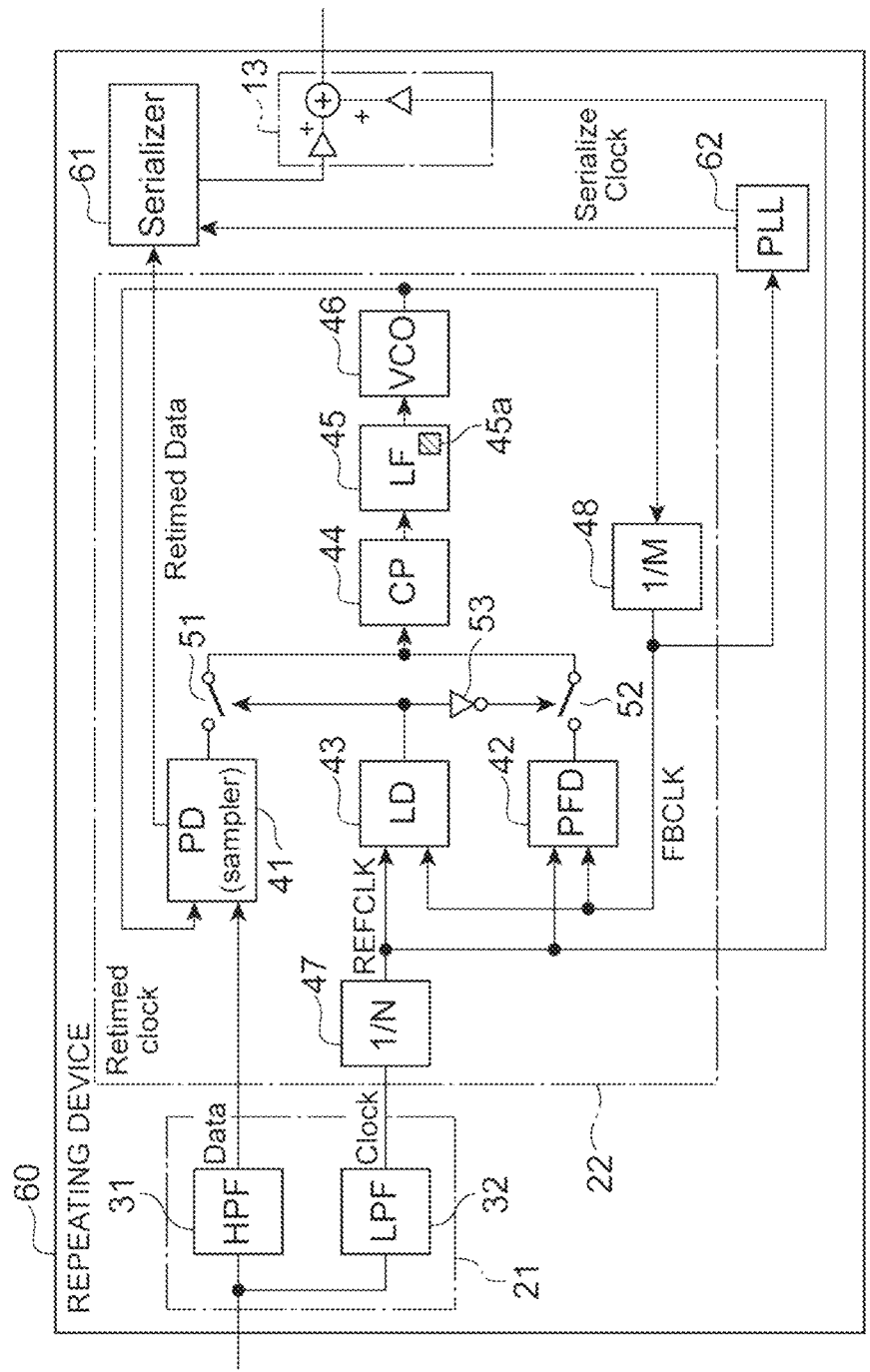
FIG. 19 is a diagram illustrating another configuration example of the repeating device.

FIG. 19 is a diagram illustrating another configuration example of the repeating device 60. The repeating device 60 illustrated in FIG. 19 includes a signal superimposing unit 13, a signal separator 21, a recovery unit 22, a serializer 61, and a PLL circuit 62. The serializer 61 serializes recovered data outputted from a first phase detector 41 to obtain serial data and outputs the serial data to the signal superimposing unit 13. The serializer 61 outputs data of each bit of the serial data at a timing designated by a clock outputted from the PLL circuit 62. The PLL circuit 62 generates the clock on the basis of an oscillation signal outputted from a frequency divider 48 and supplies the clock to the serializer 61. The signal superimposing unit 13 superimposes the high-speed signal (serial data) outputted from the serializer 61 and a low-speed signal outputted from a frequency divider 47, and outputs the superimposed signal.

Figure 20:
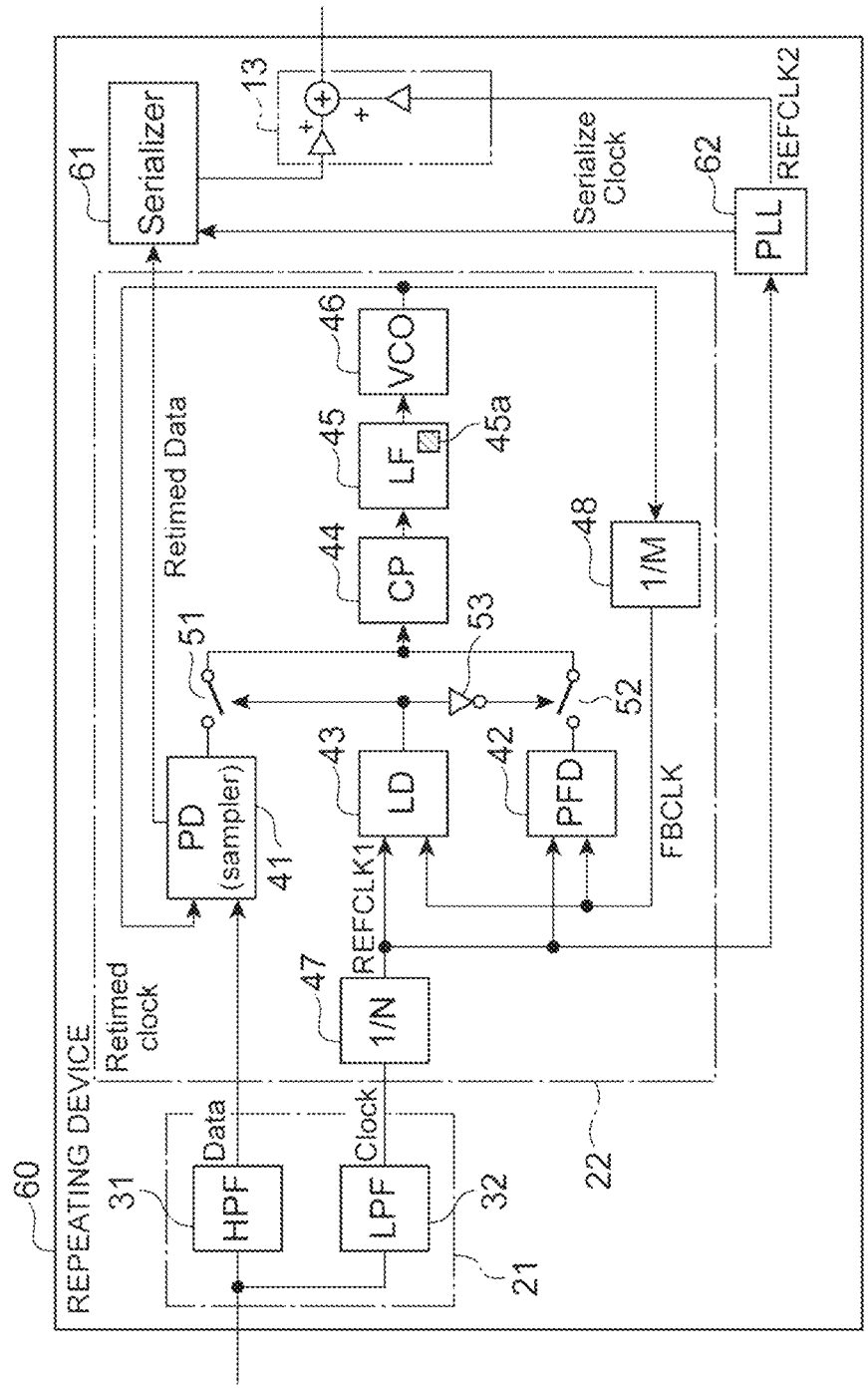
FIG. 20 is a diagram illustrating another configuration example of the repeating device.

FIG. 20 illustrates another configuration example of the repeating device 60. The repeating device 60 illustrated in FIG. 20 includes a signal superimposing unit 13, a signal separator 21, a recovery unit 22, a serializer 61, and a PLL circuit 62. The serializer 61 serializes recovered data outputted from a first phase detector 41 to obtain serial data and outputs the serial data to the signal superimposing unit 13. The serializer 61 outputs data of each bit of the serial data at a timing designated by a clock outputted from the PLL circuit 62. The PLL circuit 62 generates the clock on the basis of an oscillation signal outputted from a frequency divider 47 and supplies the clock to the serializer 61, and generates a low-speed signal. The signal superimposing unit 13 outputs a superimposed signal obtained by superimposing the high-speed signal (serial data) outputted from the serializer 61 and the low-speed signal outputted from the PLL circuit 62.

Figure 21:
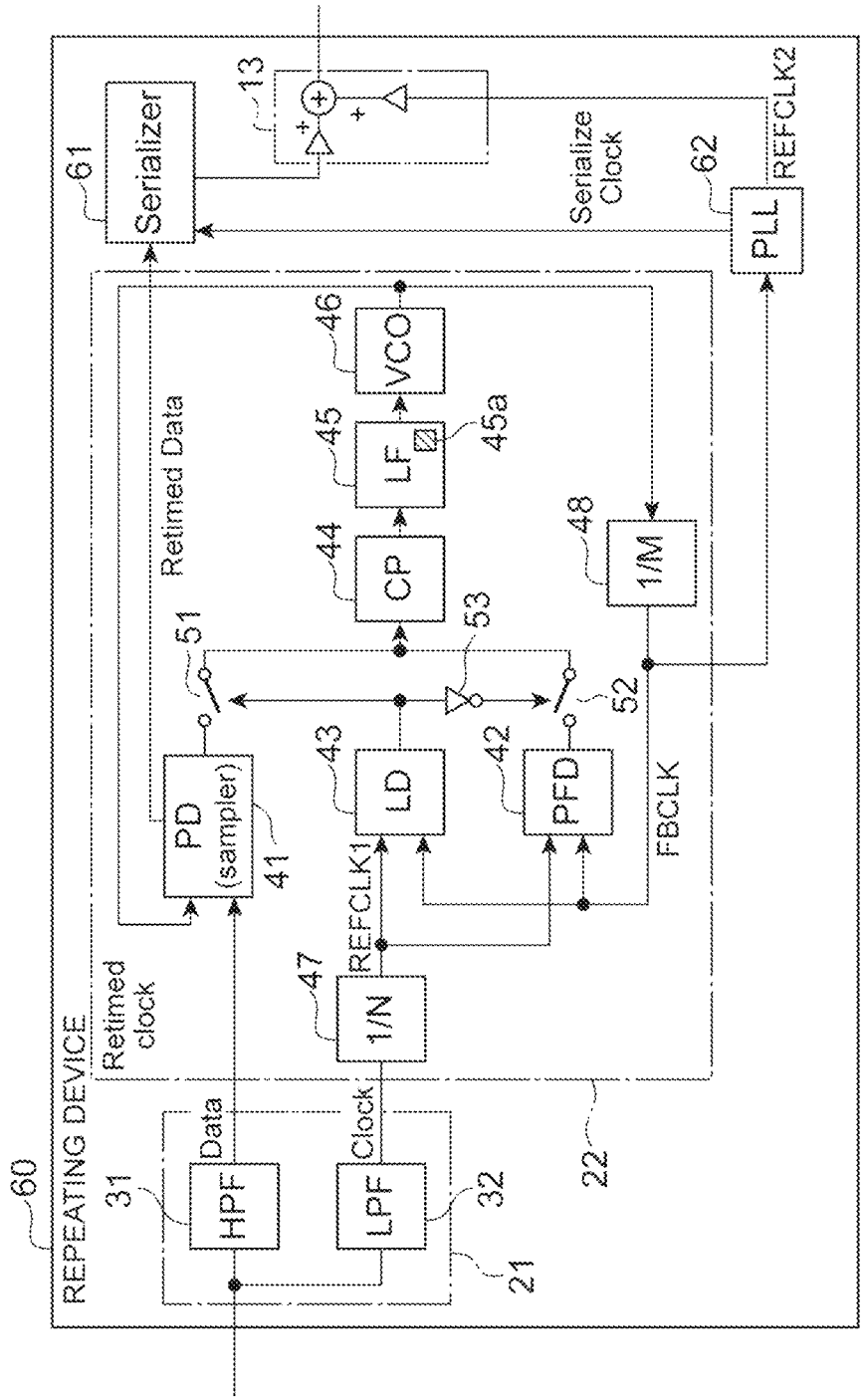
FIG. 21 is a diagram illustrating another configuration example of the repeating device.

FIG. 21 is a diagram illustrating another configuration example of the repeating device 60. The repeating device 60 illustrated in FIG. 21 includes a signal superimposing unit 13, a signal separator 21, a recovery unit 22, a serializer 61, and a PLL circuit 62. The serializer 61 serializes recovered data outputted from a first phase detector 41 to obtain serial data and outputs the serial data to the signal superimposing unit 13. The serializer 61 outputs data of each bit of the serial data at a timing designated by a clock outputted from the PLL circuit 62. The PLL circuit 62 generates the clock on the basis of an oscillation signal outputted from a frequency divider 48 and supplies the clock to the serializer 61, and generates a low-speed signal. The signal superimposing unit 13 outputs a superimposed signal obtained by superimposing the high-speed signal (serial data) outputted from the serializer 61 and the low-speed signal outputted from the PLL circuit 62.

In all the configurations illustrated in FIGS. 18 to 21, the serializer 61 is provided in a case where recovered data is deserialized in the first phase detector 41 or a case where recovered data outputted from the first phase detector 41 is serial data and deserialized in the subsequent stage. Deserializing recovered data enables any processing which cannot be easily performed at high speed (e.g., error detection or calibration of an equalizer) to be easily performed by a logic circuit. However, the serializer 61 is not required in a case where recovered data outputted from the first phase detector 41 is serial data, and the serial data can be inputted to the signal superimposing unit 13.

In the serializer 61, a frequency Fin of the low-speed signal inputted to the repeating device and a frequency Fout of the low-speed signal outputted from the repeating device may be equal to each other or may differ from each other. The frequency dividing ratio N of the repeating device in the subsequent stage or the frequency divider 47 of the receiving device and the frequency dividing ratio M of the feedback frequency divider 48 may be appropriately set according to the input and output frequency ratio (Fout/Fin) of the repeating device. When the frequency of the low-speed signal is varied in the repeating device, EMI can be reduced. Thus, such a configuration is preferred.

The comparison between the configurations of FIGS. 18 to 21 is as follows. In the configuration of FIG. 18, the clock outputted from the voltage controlled oscillator 46 is directly inputted to the serializer 61. Thus, jitter caused by the first phase detector 41 is outputted from the serializer 61. The waveform of the signal outputted from the repeating device fluctuates due to the influence of the jitter, and the repeating device in the subsequent stage or the receiving device cannot normally receive the signal in some cases. On the other hand, in the configuration of FIG. 19, the clock outputted from the PLL circuit 62 is inputted to the serializer 61. Thus, the influence of jitter caused by the first phase detector 41 can be reduced.

In the configuration of FIG. 19, the low-speed signal is transmitted from the transmitting device 10 to the receiving device 20 through a plurality of buffers connected in series. Thus, noise is amplified in each of the buffers, and jitter of the low-speed signal increases. On the other hand, in the configuration of FIG. 20, the PLL circuit 62 is disposed on a path of the low-speed signal. Thus, jitter of the low-speed signal can be eliminated. Further, the clock outputted from the PLL circuit 62 is inputted to the serializer 61. Thus, the influence of jitter caused by the first phase detector 41 can also be reduced.

In the configuration of FIG. 20, when the phase of the low-speed signal outputted from the frequency divider 47 and the phase of the recovered clock outputted from the voltage controlled oscillator 46 do not coincide with each other, the serializer 61 requires a FIFO (First-In First-Out) memory in order to eliminate the non-coincidence between the phase of the low-speed signal and the phase of the recovered clock. Thus, there is a possibility of increasing the circuit scale, circuit layout area, and power consumption. On the other hand, in the configuration of FIG. 21, the PLL circuit 62 generates the low-speed signal on the basis of the oscillation signal which is obtained by frequency-dividing recovered clock outputted from the voltage controlled oscillator 46 by the feedback frequency divider 48 and outputted to the PLL circuit 62. The relationship between the phase of the low-speed signal outputted from the frequency divider 47 and the phase of the recovered clock outputted from the voltage controlled oscillator 46 can be easily acquired. Thus, it is possible to eliminate the necessity of the FIFO or reduce the circuit scale of the FIFO.

Figure 22:
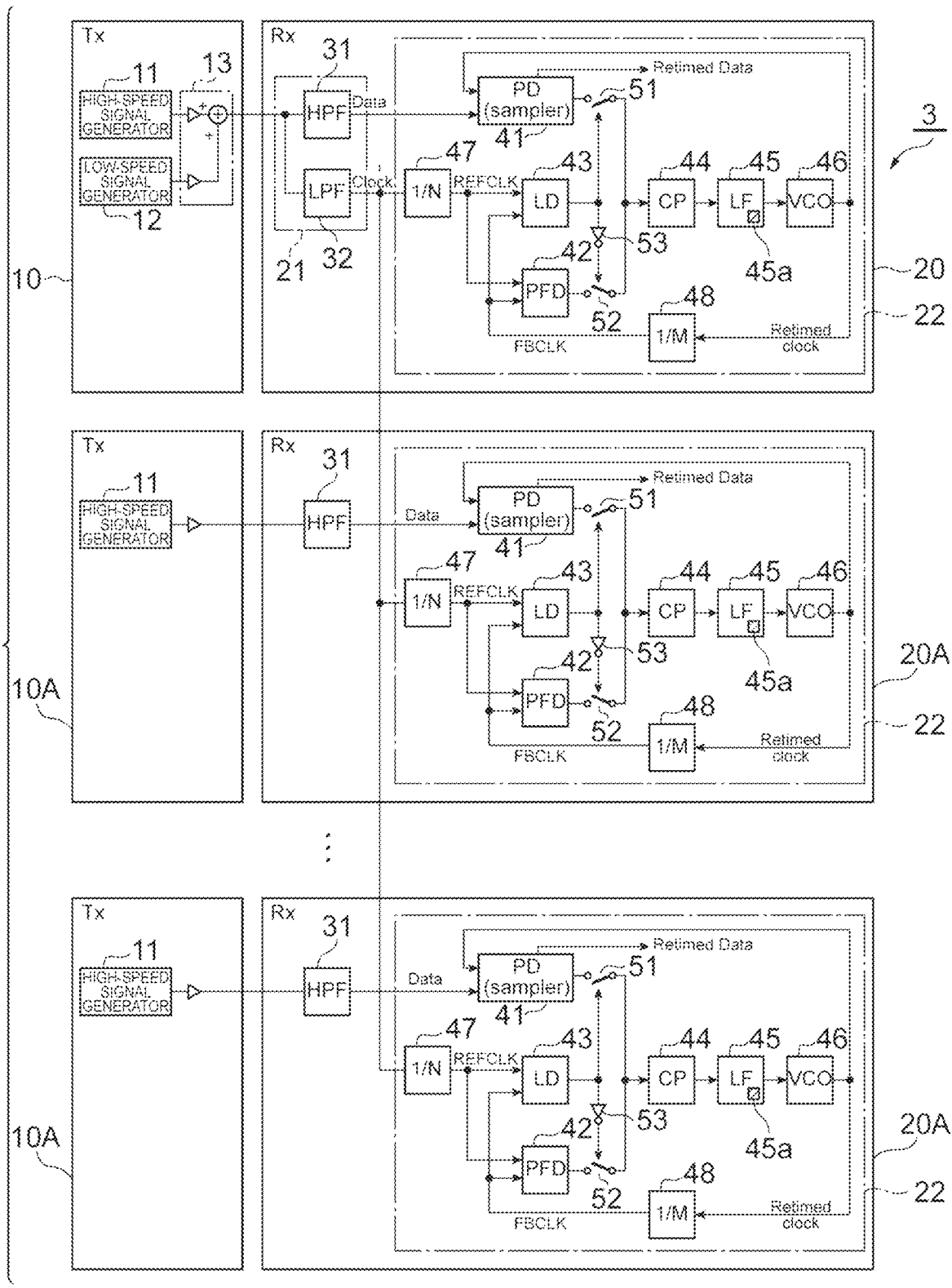
FIG. 22 is a diagram illustrating the configuration of a transmission/reception system.

FIG. 22 is a diagram illustrating the configuration of a transmission/reception system 3. The transmission/reception system 3 illustrated in FIG. 22 includes one or more sets of transmitting devices 10A and receiving devices 20A in addition to the configuration (a set of the transmitting device 10 and the receiving device 20) of the transmission/reception system 1 illustrated in FIG. 1. That is, the transmission/reception system 3 includes a plurality of lanes.

In the transmission/reception system 3, a signal obtained by superimposing a high-speed signal and a low-speed signal by the signal superimposing unit 13 is transmitted from the transmitting device 10 to the receiving device 20. The signal received by the receiving device 20 is separated into the high-speed signal and the low-speed signal by the signal separator 21 of the receiving device 20.

The low-speed signal outputted from the signal separator 21 of the receiving device 20 is inputted to the frequency divider 47 of the recovery unit 22 of the receiving device 20 and also inputted to a frequency divider 47 of a recovery unit 22 of another receiving device 20A.

The receiving device 20A receives a high-speed signal o outputted from the transmitting device 10A which is connected to the receiving device 20A through a communication link. The received high-speed signal is inputted to a first phase detector 41 through a first filter 31.

The transmitting device 10A does not have to generate a low-speed signal by a low-speed signal generator 12 and also does not have to superimpose a high-speed signal and a low-speed signal by a signal superimposing unit 13. The receiving device 20A does not have to perform signal separation by a signal separator 21.

Such a configuration requires only one lane for transmitting the signal obtained by superimposing the high-speed signal and the low-speed signal. Thus, EMI can be reduced. Further, when each receiving device includes a signal detector 23 which detects the presence or absence of the low-speed signal, it is possible to detect whether each receiving device has received a low-speed signal, and the receiving device that has received a low-speed signal can transmit the low-speed signal to another receiving device. Further, it is possible to disperse a radiation position of EMI and thus reduce EMI by sequentially switching the lane in which the low-speed signal is transmitted.

Next, a circuit configuration example of each of the signal superimposing unit 13 of the transmitting device 10 and the signal separator 21 of the receiving device 20 will be described.

Figure 23:
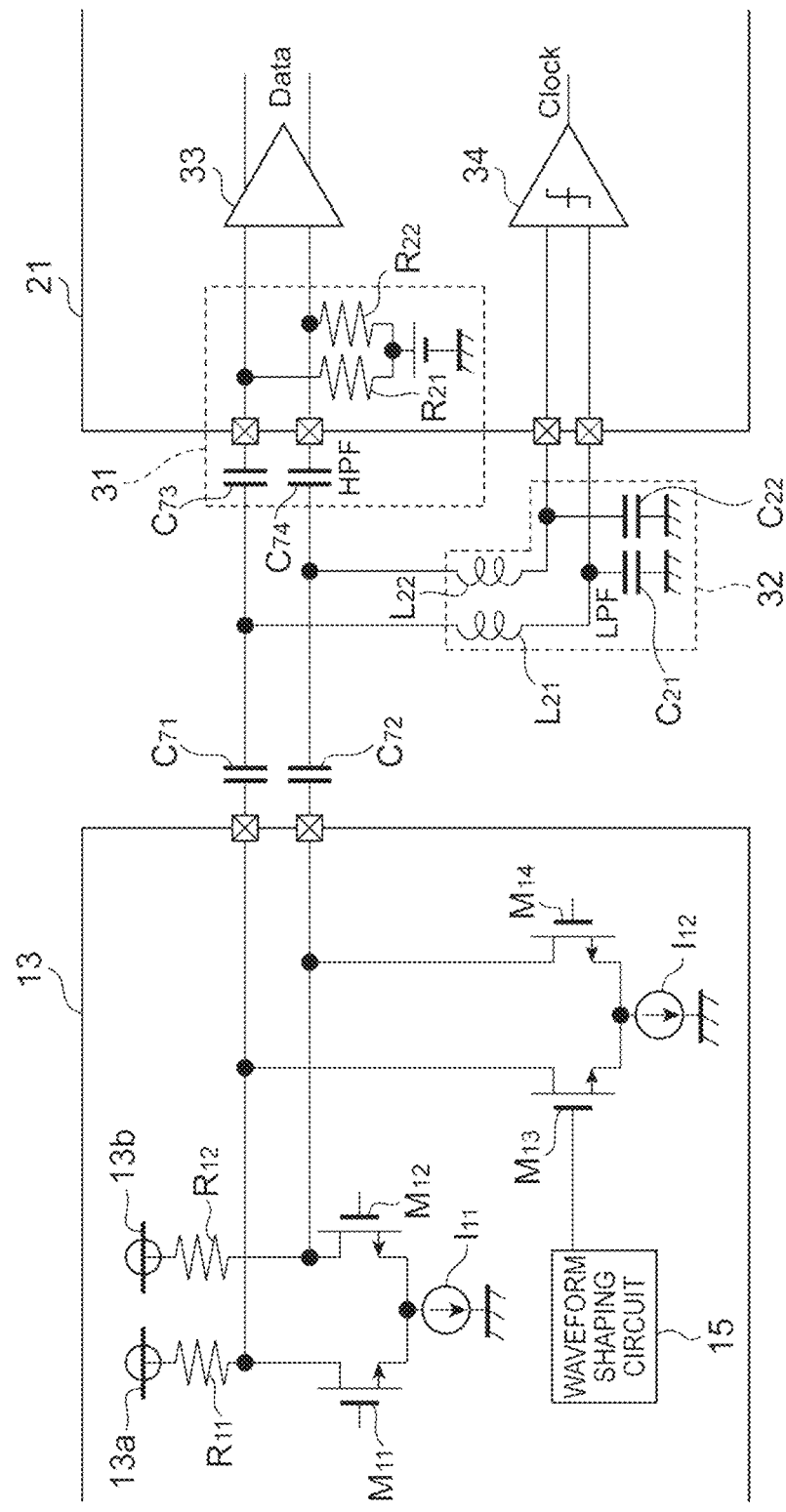
FIG. 23 is a diagram illustrating a circuit configuration example of each of a signal superimposing unit and a signal separator.

FIG. 23 is a diagram illustrating a circuit configuration example of each of the signal superimposing unit 13 and the signal separator 21. The signal superimposing unit 13 and the signal separator 21 are connected through a differential signal line. Coupling capacitors $C_{71}$, $C_{73}$ are disposed on one signal line of the differential signal line, and coupling capacitors $C_{72}$, $C_{74}$ are disposed on the other signal line. The coupling capacitors $C_{71}$, $C_{72}$ are disposed near an output terminal of the signal superimposing unit 13. The coupling capacitors $C_{73}$, $C_{74}$ are disposed near an input terminal of the signal separator 21.

The signal superimposing unit 13 includes resistors $R_{11}$, $R_{12}$, NMOS transistors $M_{11}$ to $M_{14}$, constant current sources $I_{11}$, $I_{12}$, and a waveform shaping circuit 15.

A drain of the NMOS transistors $Mn_{11}$ is connected to a power supply potential feed terminal 13a through the resistor $R_{11}$. A drain of the NMOS transistors $M_{12}$ is connected to a power supply potential feed terminal 13b (may be common with the power supply potential feed terminal 13a) through the resistor $R_{12}$. Each of sources of the NMOS transistors $M_{11}$, $M_{12}$ is connected to a ground potential feed terminal through the constant current sources $I_{11}$. The resistors $R_{11}$, $R_{12}$, the NMOS transistors $M_{11}$, $M_{12}$, and the constant current source $I_{11}$ constitute a first CML (Current Mode Logic) circuit. In the first CML circuit, a high-speed signal is inputted to each of gates of the NMOS transistors $M_{11}$, $M_{12}$.

A drain of the NMOS transistors $M_{13}$ is connected to the power supply potential feed terminal 13a through the resistor $R_{11}$. A drain of the NMOS transistors $M_{14}$ is connected to the power supply potential feed terminal 13b through the resistor $R_{12}$. Each of sources of the NMOS transistors $M_{13}$, $M_{14}$ is connected to the ground potential feed terminal through the constant current sources $I_{12}$. The resistors $R_{11}$, $R_{12}$, the NMOS transistors $M_{13}$, $M_{14}$, and the constant current source $I_{12}$ constitute a second CML circuit. In the second CML circuit, a low-speed signal having a waveform shaped by the waveform shaping circuit 15 is inputted to each of gates of the NMOS transistors $M_{13}$, $M_{14}$. The waveform shaping circuit 15 generates a low-speed signal having, for example, a time waveform of a sine wave or a triangular wave in order to reduce the interference of the low-speed signal with the frequency band of the high-speed signal.

The resistors $R_{11}$, $R_{12}$ are shared between the first CML circuit and the second CML circuit. The signal superimposing unit 13 inputs the high-speed signal to the first CML circuit, inputs the low-speed signal to the second CML circuit, superimposes the high-speed signal and the low-speed signal, and outputs the superimposed signal as a differential signal. The amplitude of the superimposed signal outputted from the signal superimposing unit 13 corresponds to the sum of currents flowing through the constant current sources $I_{11}$, $I_{12}$. Typically, the output amplitude is limited in a CML circuit. Thus, the output amplitude is prevented from exceeding an upper limit by the sum of currents flowing through the constant current sources $I_{11}$, $I_{12}$ and a terminating resistance value.

The first filter 31 of the signal separator 21 is a high-pass filter which includes the coupling capacitors $C_{73}$, $C_{74}$ and resistors $R_{21}$, $R_{22}$. One end of the resistor $R_{21}$ is connected to a first input terminal of the amplifier 33, and a constant voltage is applied to the other end thereof. One end of the resistor $R_{22}$ is connected to a second input terminal of the amplifier 33, and a constant voltage is applied to the other end thereof. The cutoff frequency of the high-pass filter is determined on the basis of capacitance values of the coupling capacitors $C_{73}$, $C_{74}$ and resistance values of the resistors $R_{21}$, $R_{22}$. The amplifier 33 amplifies the high-speed signal outputted from the first filter 31 and outputs the amplified signal to the first phase detector 41.

The second filter 32 of the signal separator 21 is a low-pass filter which includes inductors $L_{21}$, $L_{22}$ and capacitors $C_{21}$, $C_{22}$. One end of the inductor $L_{21}$ is connected to the one signal line, and the other end thereof is connected to the ground potential feed terminal through the capacitor $C_{21}$. One end of the inductor $L_{22}$ is connected to the other signal line, and the other end thereof is connected to the ground potential feed terminal through the capacitor $C_{22}$. The cutoff frequency of the low-pass filter is determined on the basis of inductances of the inductors $L_{21}$, $L_{22}$ and capacitance values of the capacitors $C_{21}$, $C_{22}$. A Schmitt trigger buffer 34 outputs the low-speed signal outputted from the second filter 32 as a rectangular wave to the frequency divider 47.

FIGS. 24 to 29 are diagrams illustrating other circuit configuration examples of the signal superimposing unit 13. Effects of each of the configurations will be described below. In the configuration examples illustrated in FIGS. 24 and 25, it is possible to reduce the influence of parasitic capacitances of the NMOS transistors $M_{13}$, $M_{14}$ of FIG. 23 and ESD (Electro-Static Discharge) protection diodes and improve the waveform quality. In the configuration example illustrated in FIG. 26, the low-speed signal can be superimposed without using a waveform shaping circuit. Thus, the circuit area can be reduced. In the configuration example illustrated in FIG. 27, it is possible to reduce deterioration in the waveform quality of the low-speed signal caused by sneaking of the high-speed signal into the low-speed signal by the capacitors $C_{11}$, $C_{12}$. The configuration examples illustrated in FIGS. 28 and 29 eliminate the necessity of the NMOS transistors $M_{13}$, $M_{14}$ of FIG. 23 and can reduce the influence of the parasitic capacitances.

Figure 24:
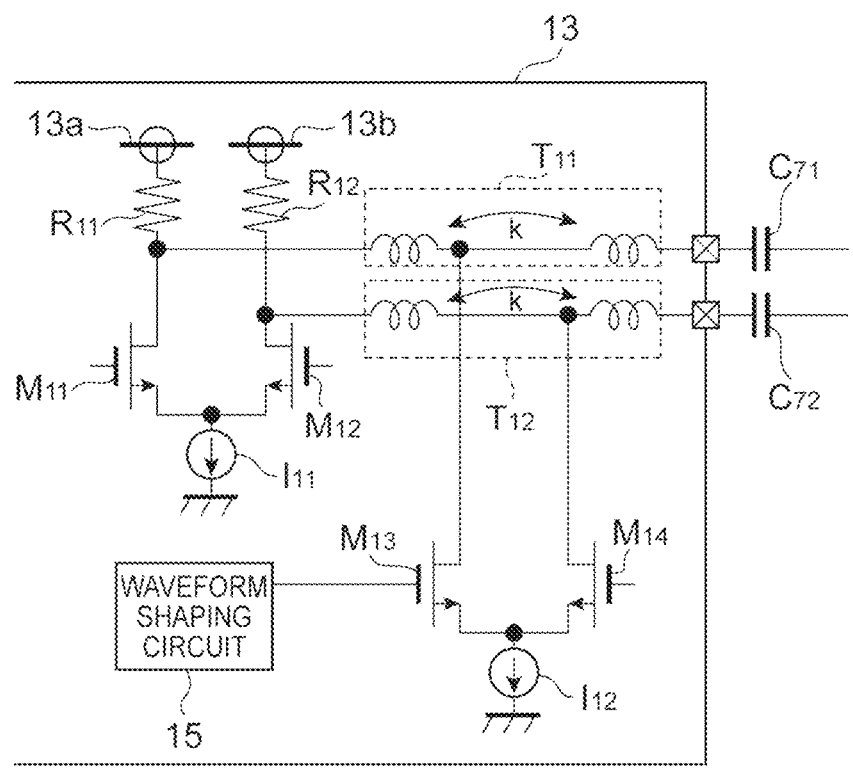
FIG. 24 is a diagram illustrating another circuit configuration example of the signal superimposing unit.

FIG. 24 is a diagram illustrating another circuit configuration example of the signal superimposing unit 13. The signal superimposing unit 13 illustrated in FIG. 24 further includes T coils $T_{11}$, $T_{12}$ in addition to the configuration of the signal superimposing unit 13 of FIG. 23. The T coil $T_{11}$ is disposed between the drain of the NMOS transistor $M_{11}$ and one output terminal of the signal superimposing unit 13. The T coil $T_{12}$ is disposed between the drain of the NMOS transistor $M_{12}$ and the other output terminal of the signal superimposing unit 13. The T coils $T_{11}$, $T_{12}$ make it possible to reduce the influence of a load of a low-speed signal buffer (second CML circuit).

Figure 25:
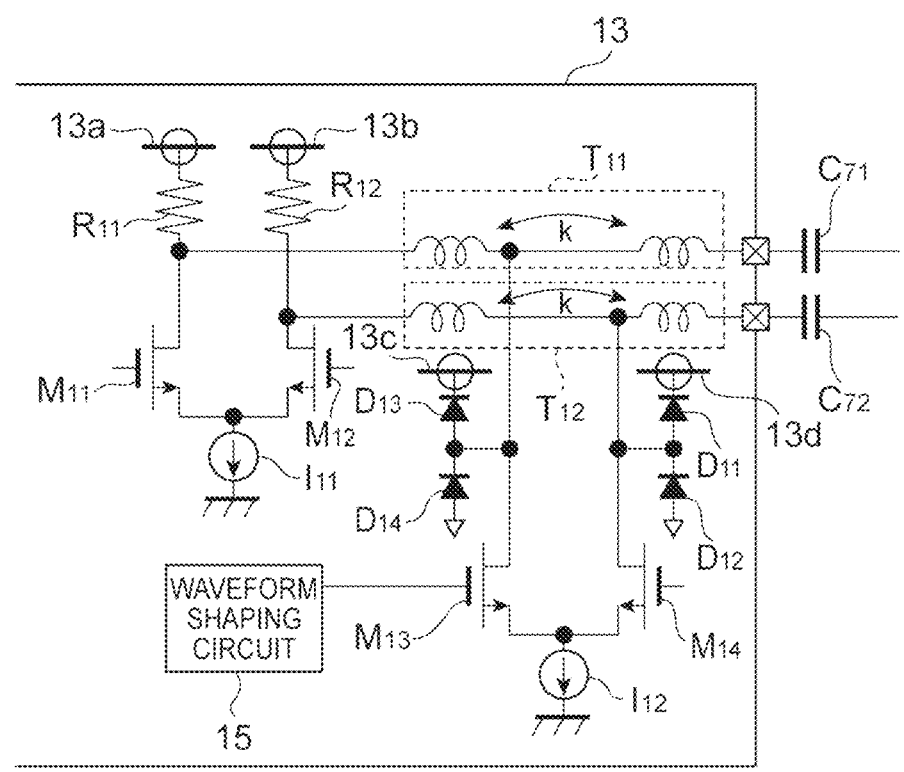
FIG. 25 is a diagram illustrating another circuit configuration example of the signal superimposing unit.

FIG. 25 is a diagram illustrating another circuit configuration example of the signal superimposing unit 13. The signal superimposing unit 13 illustrated in FIG. 25 further includes ESD protection diodes $D_{11}$ to $D_{14}$ in addition to the configuration of the signal superimposing unit 13 of FIG. 24. The ESD protection diode $D_{11}$ is disposed between the drain of the NMOS transistor $M_{14}$ and a power supply potential feed terminal 13d. The ESD protection diode $D_{12}$ is disposed between the drain of the NMOS transistor $M_{14}$ and the ground potential feed terminal. The ESD protection diode $D_{13}$ is disposed between the drain of the NMOS transistor $M_{13}$ and a power supply potential feed terminal 13c. The ESD protection diode $D_{14}$ is disposed between the drain of the NMOS transistor $M_{13}$ and the ground potential feed terminal. Such a configuration makes it possible to reduce the load of the ESD protection diode visible from a high-speed signal buffer (first CML circuit).

Figure 26:
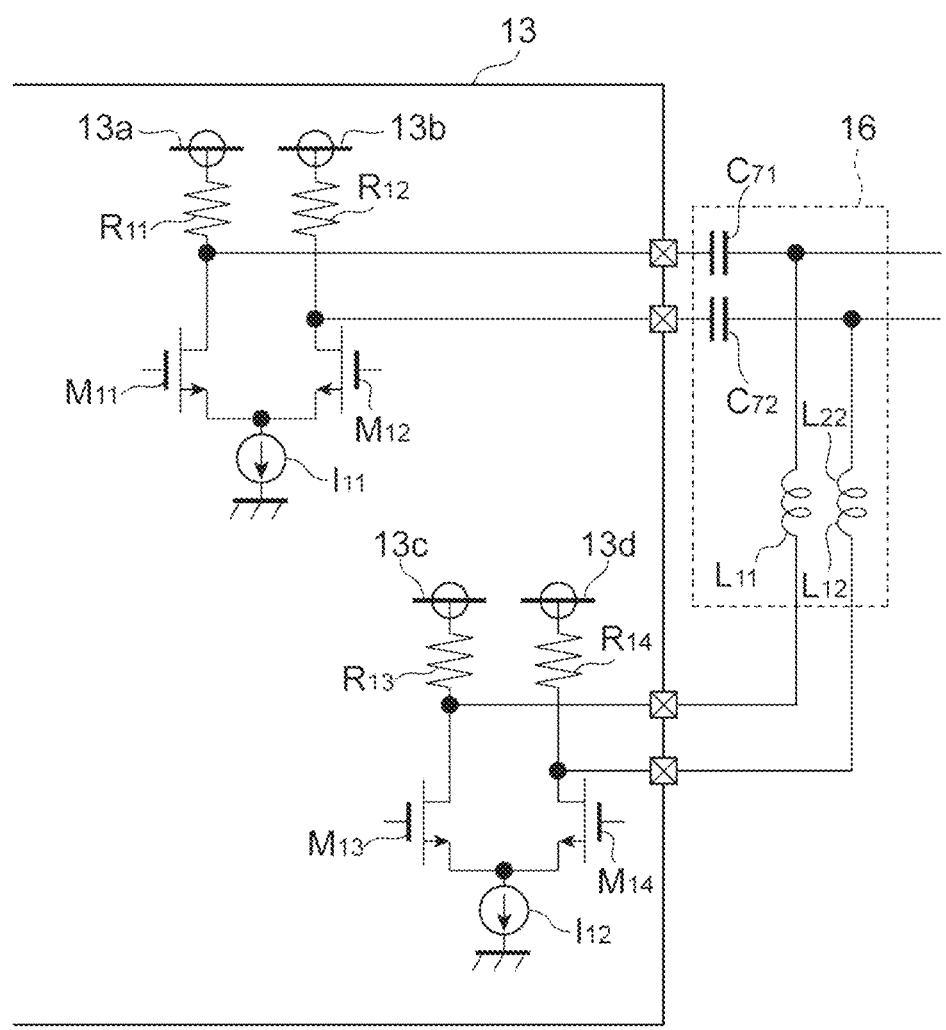
FIG. 26 is a diagram illustrating another circuit configuration example of the signal superimposing unit.

FIG. 26 is a diagram illustrating another circuit configuration example of the signal superimposing unit 13. The signal superimposing unit 13 illustrated in FIG. 26 includes resistors $R_{11}$ to $R_{14}$, NMOS transistors $M_{11}$ to $M_{14}$, constant current sources $I_{11}$, $I_{12}$, and a waveform shaping circuit 16. The resistors $R_{11}$, $R_{12}$, the NMOS transistors $M_{11}$, $M_{12}$ (drains of the NMOS transistors $M_{11}$, $M_{12}$ are respectively connected to power supply potential feed terminals 13a, 13b through the resistors $R_{11}$, $R_{12}$), and the constant current source $I_{11}$ constitute a first CML circuit. In the first CML circuit, a high-speed signal is inputted to each of the gates of the NMOS transistors $M_{11}$, $M_{12}$. The resistors $R_{13}$, $R_{14}$, the NMOS transistors $M_{13}$, $M_{14}$ (drains of the NMOS transistors $M_{13}$, $M_{14}$ are respectively connected to power supply potential feed terminals 13c, 13d through the resistors $R_{13}$, $R_{14}$), and the constant current source $I_{12}$ constitute a second CML circuit. In the second CML circuit, a low-speed signal is inputted to each of the gates of the NMOS transistors $M_{13}$, $M_{14}$. The configuration in which the resistors are not shared between the first CML circuit and the second CML circuit can reduce power consumption.

The waveform shaping circuit 16 includes coupling capacitors $C_{71}$, $C_{72}$ and inductors $L_{11}$, $L_{12}$. The inductor $L_{11}$ is disposed between the drain of the NMOS transistor $M_{13}$ and one signal line. The inductor $L_{12}$ is disposed between the drain of the NMOS transistor $M_{14}$ and the other signal line. The waveform shaping circuit 16 is capable of superimposing the high-speed signal from the first CML circuit and the low-speed signal from the second CML circuit and shaping the waveform of the low-speed signal.

Figure 27:
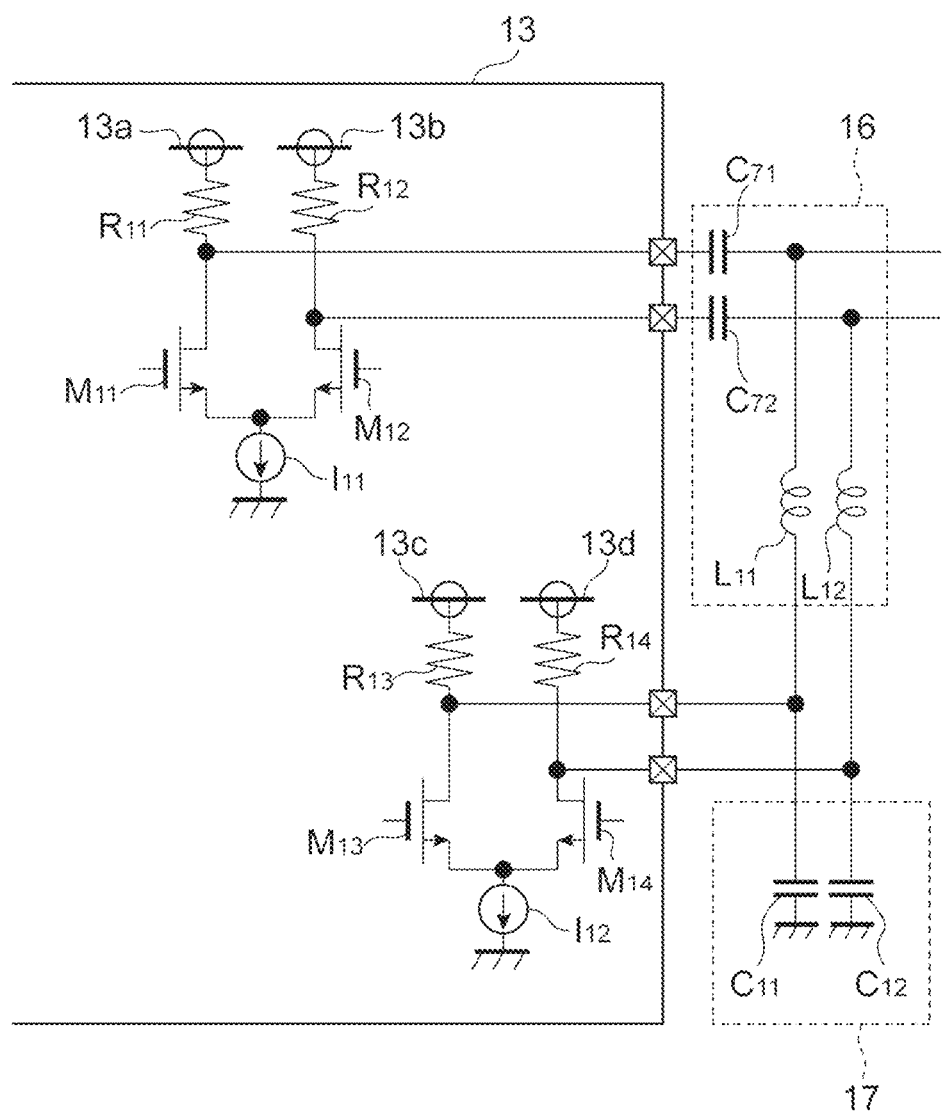
FIG. 27 is a diagram illustrating another circuit configuration example of the signal superimposing unit.

FIG. 27 is a diagram illustrating another circuit configuration example of the signal superimposing unit 13. The signal superimposing unit 13 illustrated in FIG. 27 further includes a filter circuit 17 in addition to the configuration of the signal superimposing unit 13 of FIG. 26. The filter circuit 17 includes capacitors $C_{11}$, $C_{12}$. The capacitor $C_{11}$ is disposed between the drain of the NMOS transistor $M_{13}$ and the ground potential feed terminal. The capacitor $C_{12}$ is disposed between the drain of the NMOS transistor $M_{14}$ and the ground potential feed terminal. If the filter circuit 17 is not provided, an outputtable voltage range on the low-speed signal output side is a low-speed signal outputted to which sneaking of a signal from the high-speed signal output side is added. Thus, an output voltage of the low-speed signal is reduced. The filter circuit 17 makes it possible to prevent sneaking of a signal from the high-speed signal output side to the low-speed signal output side and improve an output range on the low-speed signal output side.

Figure 28:
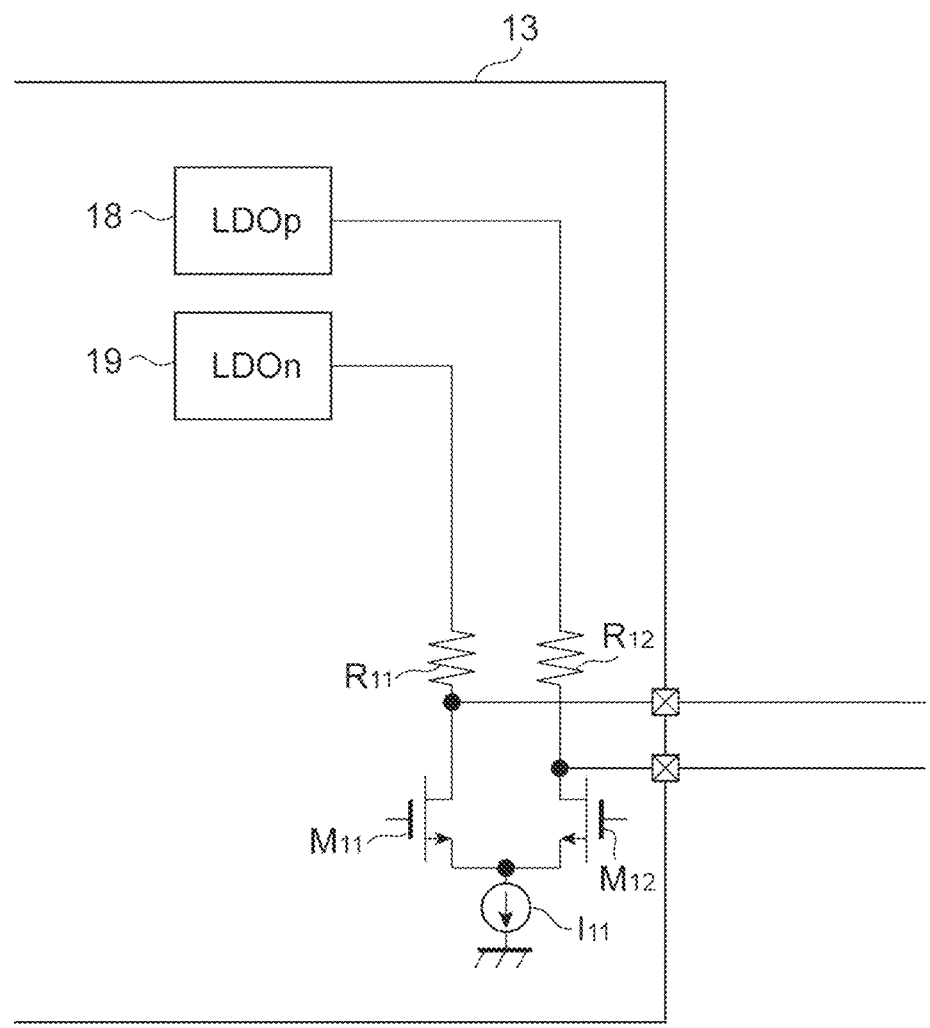
FIG. 28 is a diagram illustrating another circuit configuration example of the signal superimposing unit.

FIG. 28 is a diagram illustrating another circuit configuration example of the signal superimposing unit 13. The signal superimposing unit 13 illustrated in FIG. 28 includes resistors $R_{11}$, $R_{12}$, NMOS transistors $M_{11}$, $M_{12}$, a constant current source $I_{11}$, and power supply circuits 18, 19. The power supply circuits 18, 19 input, for example, a low-speed signal having a waveform shaped into a sine wave or a triangular wave as a reference voltage and applies a drive voltage amplitude-modulated by the reference voltage to one end of each of the resistors $R_{11}$, $R_{12}$. The resistors $R_{11}$, $R_{12}$, the NMOS transistors $M_{11}$, $M_{12}$, and the constant current source $I_{11}$ constitute a first CML circuit. The first CML circuit inputs a high-speed signal to each of gates of the NMOS transistors $Mn_{11}$, $M_{12}$. A differential signal outputted from each of drains of the NMOS transistors $M_{11}$, $M_{12}$ is obtained by superimposing the high-speed signal inputted to each of the gates of the NMOS transistors $M_{11}$, $M_{12}$ and the drive voltage (low-speed signal) applied to the resistors $R_{11}$, $R_{12}$. Each of the power supply circuits 18, 19 is preferably an LDO (Low Drop Out) power supply having a low noise characteristic. This configuration eliminates the necessity of the second CML circuit for low-speed signal and reduces the load of the first CML circuit. Although the LDO power supply is unsuitable for a high-speed operation, the LDO power supply can be preferably used for outputting a drive voltage varying in response to changes over time in the low-speed signal.

Figure 29:
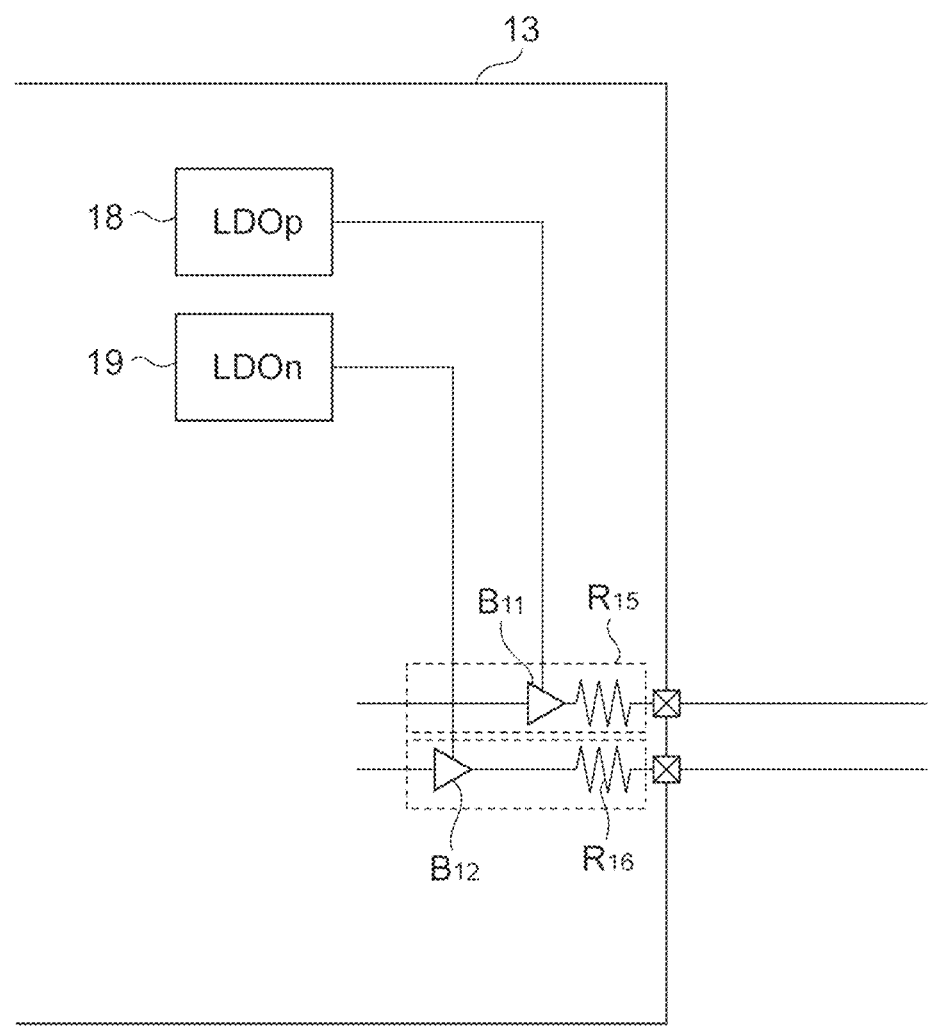
FIG. 29 is a diagram illustrating another circuit configuration example of the signal superimposing unit.

FIG. 29 is a diagram illustrating another circuit configuration example of the signal superimposing unit 13. The signal superimposing unit 13 illustrated in FIG. 29 includes buffers $B_{11}$, $B_{12}$, resistors $R_{15}$, $R_{16}$, and power supply circuits 18, 19. The power supply circuits 18, 19 input, for example, a low-speed signal having a waveform shaped into a sine wave or a triangular wave as a reference voltage and applies a drive voltage amplitude-modulated by the reference voltage to the buffers $B_{11}$, $B_{12}$. An output terminal of the buffer $B_{11}$ is connected to one signal line through the resistor $R_{15}$. An output terminal of the buffer $B_{12}$ is connected to the other signal line through the resistor $R_{16}$. The buffers $B_{11}$, $B_{12}$ are driven by the drive voltage (low-speed signal) applied from the power supply circuits 18, 19, input a high-speed signal, and output a signal obtained by superimposing the high-speed signal and the low-speed signal. Each of the buffers $B_{11}$, $B_{12}$ is, for example, a buffer (Source-Series-Terminated (SST) Buffer) which constitutes an inverter circuit including a PMOS transistor and an NMOS transistor, and the drive voltage from the power supply circuit is applied to a source of the PMOS transistor. Also this configuration eliminates the necessity of the second CML circuit for low-speed signal and reduces the load of the first CML circuit. Although the LDO power supply is unsuitable for a high-speed operation, the LDO power supply can be preferably used for outputting a drive voltage varying in response to changes over time in the low-speed signal.

FIGS. 30 to 33 are diagrams illustrating other circuit configuration examples of the signal separator 21. Effects of each of the configurations will be described below. The configuration examples illustrated in FIGS. 30 and 31 make it possible to eliminate the second filter 32 in FIG. 23 to reduce the circuit area by using a band limit comparator. The configuration examples illustrated in FIGS. 32 and 33 make it possible to reduce the influence of parasitic capacitances of a band limit comparator 36 and the Schmitt trigger buffer 34.

Figure 30:
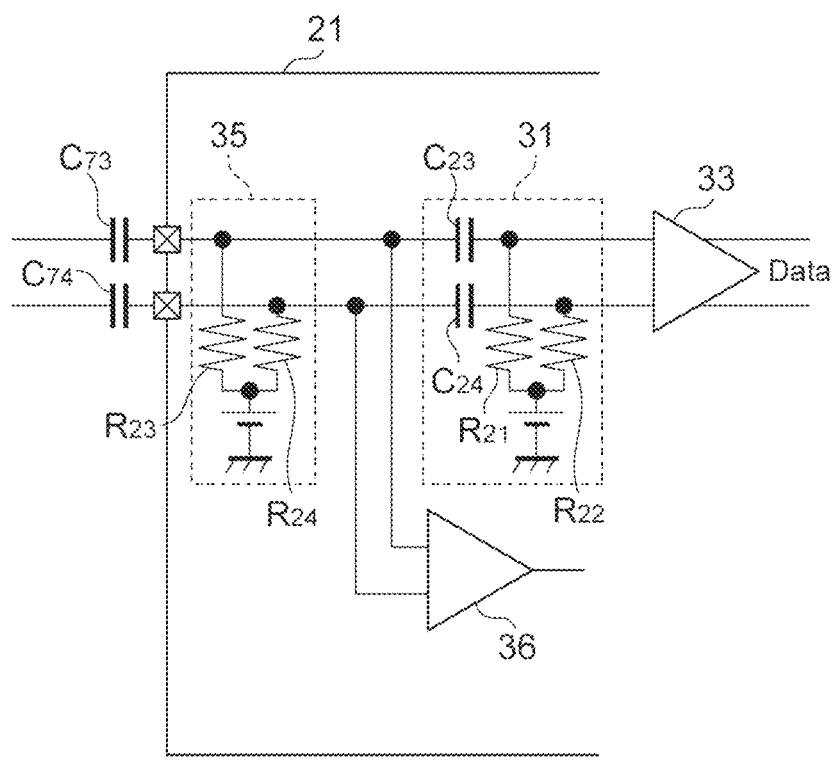
FIG. 30 is a diagram illustrating another circuit configuration example of the signal separator.

FIG. 30 is a diagram illustrating another circuit configuration example of the signal separator 21. A first filter 31 of the signal separator 21 illustrated in FIG. 30 is a high-pass filter which includes capacitors $C_{23}$, $C_{24}$ and resistors $R_{21}$, $R_{22}$. The capacitor $C_{23}$ is disposed between a coupling capacitor $C_{73}$ and the first input terminal of the amplifier 33. The capacitor $C_{24}$ is disposed between a coupling capacitor $C_{74}$ and the second input terminal of the amplifier 33. One end of the resistor $R_{21}$ is connected to the first input terminal of the amplifier 33, and a constant voltage is applied the other end thereof. One end of the resistor $R_{22}$ is connected to the second input terminal of the amplifier 33, and a constant voltage is applied the other end thereof. The cutoff frequency of the high-pass filter is determined on the basis of capacitance values of the capacitors $C_{23}$, $C_{24}$ and resistance values of the resistors $R_{21}$, $R_{22}$. The amplifier 33 amplifies a high-speed signal outputted from the first filter 31 and outputs the amplified signal to the first phase detector 41.

The second filter 32 includes a bias circuit 35 and a band limit comparator 36. A first input terminal of the band limit comparator 36 is connected to a signal line connecting the capacitor $C_{23}$ and the coupling capacitor $C_{73}$. A second input terminal of the band limit comparator 36 is connected to a signal line connecting the capacitor $C_{24}$ and the coupling capacitor $C_{74}$. The band limit comparator 36 is capable of selectively outputting a low-speed signal and has a function of a low-pass filter. The bias circuit 35 is provided for setting a common voltage of signals inputted to the first input terminal and the second input terminal of the band limit comparator 36. The bias circuit 35 includes resistors $R_{23}$, $R_{24}$. One end of the resistor $R_{23}$ is connected to the first input terminal of the band limit comparator 36, and a constant voltage is applied to the other end thereof. One end of the resistor $R_{24}$ is connected to the second input terminal of the band limit comparator 36, and a constant voltage is applied to the other end thereof.

Such a configuration makes it possible to eliminate the necessity of an external element that is required in the configuration illustrated in FIG. 23. The bias circuit 35 constitutes a high-pass filter together with the coupling capacitors $C_{73}$, $C_{74}$. Thus, it is necessary to increase resistance values of the resistors $R_{23}$, $R_{24}$ and lower the cutoff frequency of the high-pass filter to also pass a low-speed signal.

Figure 31:
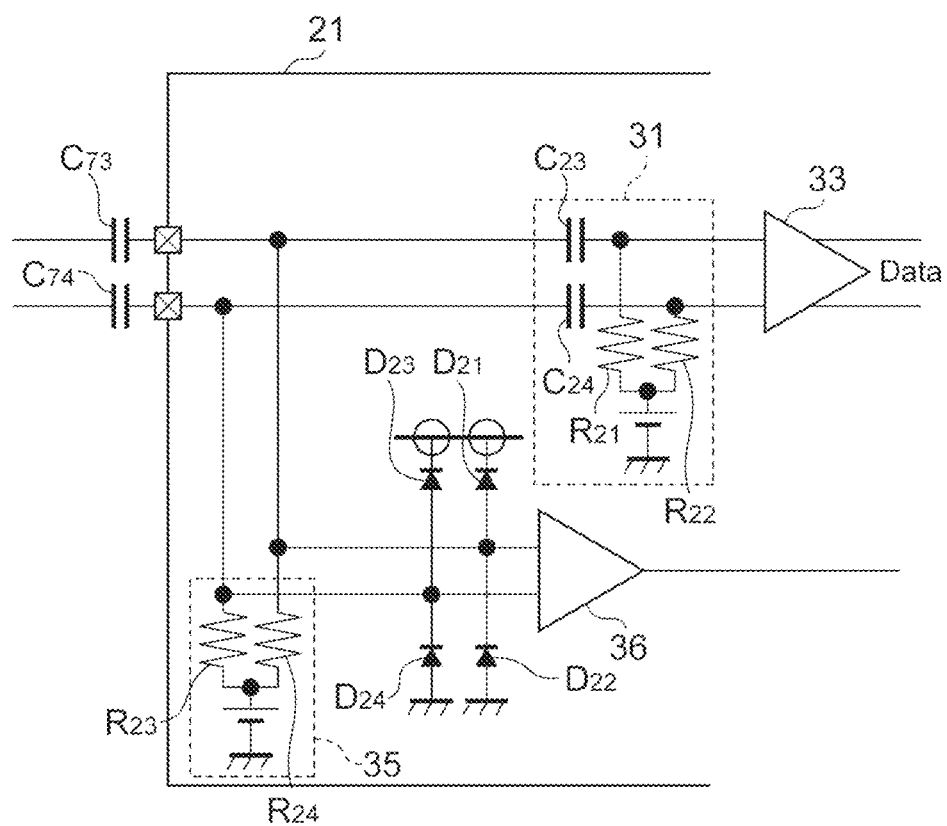
FIG. 31 is a diagram illustrating another circuit configuration example of the signal separator.

FIG. 31 is a diagram illustrating another circuit configuration example of the signal separator 21. The signal separator 21 illustrated in FIG. 31 further includes ESD protection diodes $D_{21}$ to $D_{24}$ in addition to the configuration of the signal separator 21 of FIG. 30. The ESD protection diode $D_{21}$ is disposed between the first input terminal of the band limit comparator 36 and the power supply potential feed terminal. The ESD protection diode $D_{22}$ is disposed between the first input terminal of the band limit comparator 36 and the ground potential feed terminal. The ESD protection diode $D_{23}$ is disposed between the second input terminal of the band limit comparator 36 and the power supply potential feed terminal. The ESD protection diode $D_{24}$ is disposed between the second input terminal of the band limit comparator 36 and the ground potential feed terminal.

Figure 32:
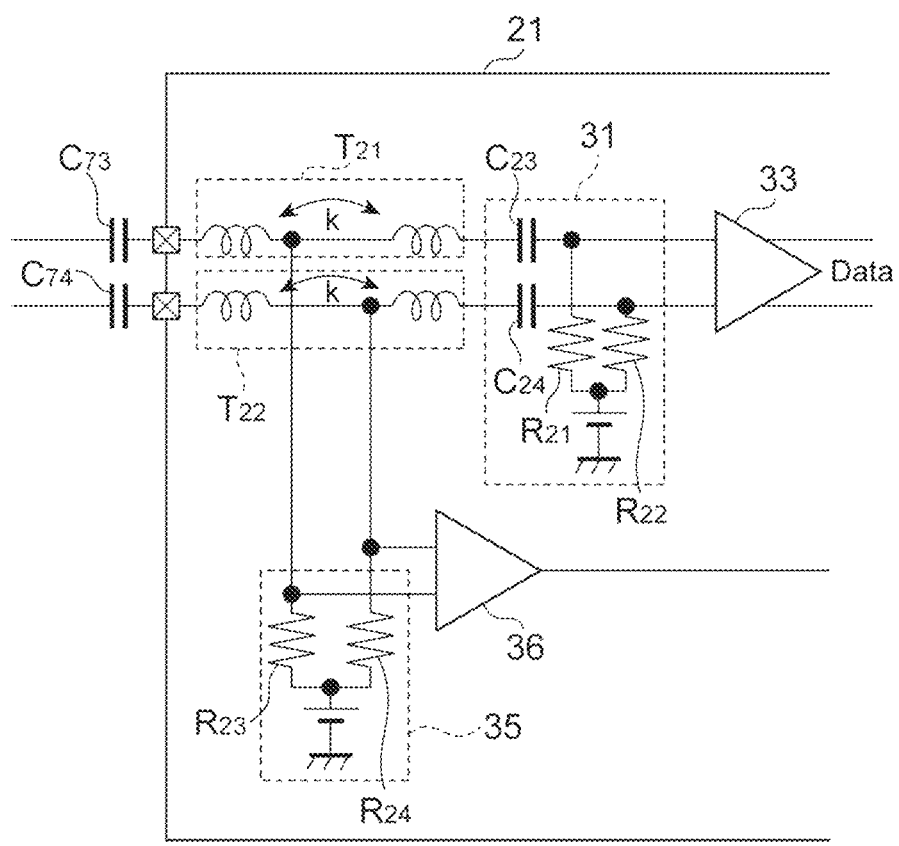
FIG. 32 is a diagram illustrating another circuit configuration example of the signal separator.
Figure 33:
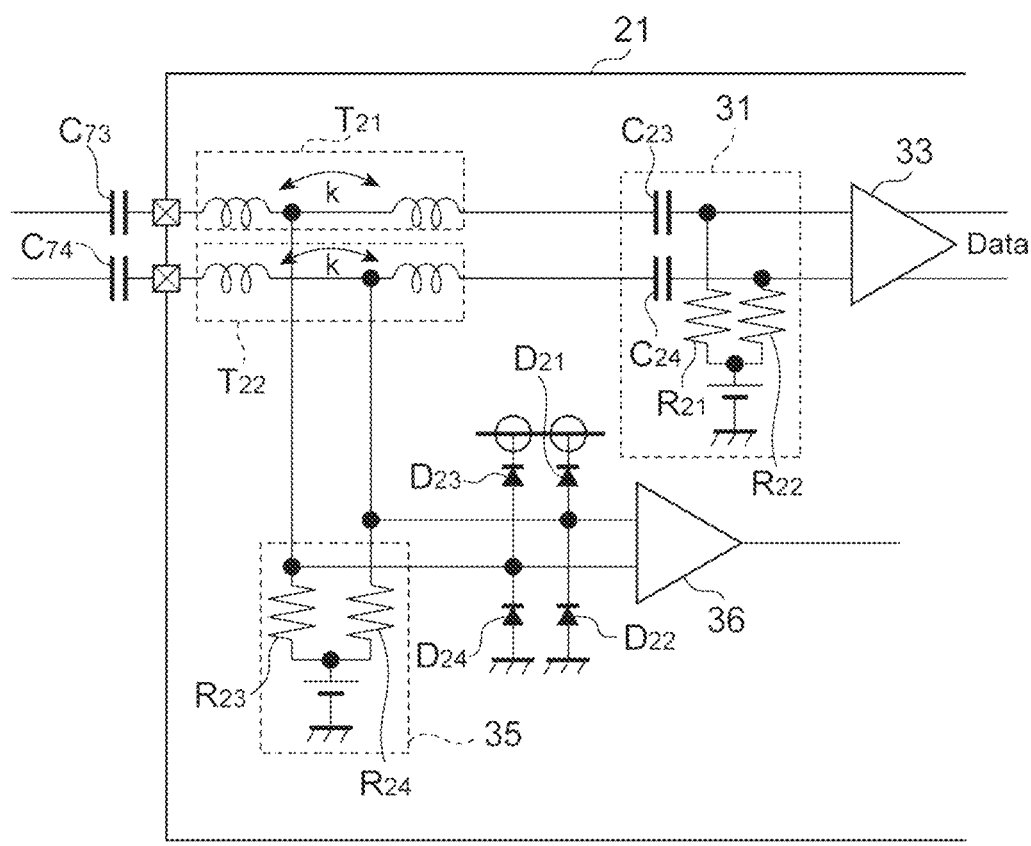
FIG. 33 is a diagram illustrating another circuit configuration example of the signal separator.

FIG. 32 is a diagram illustrating another circuit configuration example of the signal separator 21. The signal separator 21 illustrated in FIG. 32 further includes T coils $T_{21}$, $T_{22}$ in addition to the configuration of the signal separator 21 of FIG. 30. FIG. 33 is a diagram illustrating another circuit configuration example of the signal separator 21. The signal separator 21 illustrated in FIG. 33 further includes T coils $T_{21}$, $T_{22}$ in addition to the configuration of the signal separator 21 of FIG. 31. In FIGS. 32 and 33, the T coil $T_{21}$ is disposed between the capacitor $C_{23}$ and the coupling capacitor $C_{73}$. The T coil $T_{22}$ is disposed between the capacitor $C_{24}$ and the coupling capacitor $C_{74}$. Such a configuration makes it possible to reduce the load of the band limit comparator 36.

The band limit comparator 36 may include a low-speed amplifier and a Schmitt trigger buffer as illustrated in FIGS. 12A to 12D. Such a configuration enables the band limit comparator 36 to have both a function of a low-pass filter and a function of a comparator. When the amplifier has a high gain, and the threshold of the Schmitt trigger buffer is several hundred mV, a signal and noise can be separated from each other. Further, the band limit comparator 36 can also serve as the signal detector 23 which detects the presence or absence of the low-speed signal. Accordingly, it is possible to reduce the power consumption and circuit layout area.

As described above, in the configuration of the present embodiment, a high-speed signal and a low-speed signal are superimposed and transmitted from the transmitting device to the receiving device. Thus, when phase lock is released in the receiving device, it is not necessary to notify the release of the phase lock from the receiving device to the transmitting device. Thus, the configuration of the present embodiment can also be applicable to a system that can transmit a signal only in one direction from a transmitting device to a receiving device. Further, frequency tracking can be immediately performed in the receiving device. A highly precise phase adjustment is not required between the high-speed signal and the low-speed signal which are transmitted in a superimposed state from the transmitting device to the receiving device. Thus, it is possible to reduce circuit design man hours and power consumption. Further, the superimposed signal is separated into the high-speed signal and the low-speed signal by the signal separator in the receiving device. Thus, the high-speed signal and the low-speed signal may have any phase relationship, and the phase of the high-speed signal and the phase of the low-speed signal do not have to coincide with each other. Thus, it is also not necessary to make the level transition times (Tr, Tf) of the high-speed signal and the low-speed signal coincide with each other. Thus, it is possible to prevent an increase in the number of communication links, prevent an increase in the power consumption of circuits, and also prevent an increase in the circuit layout area. Further, the configuration of the present embodiment is also applicable to long-haul transmission.

As described above, the present invention makes it possible to prevent increases in the number of communication links, power consumption, and circuit layout area, and is also applicable to long-haul transmission.

It is apparent from the above description of the present invention that the present invention can be variously modified. Such modifications should not be recognized as departing from the idea and range of the present invention. All improvements obvious for those skilled in the art are included in the following claims.

What is claimed is:

1. A transmitting device comprising:
   a high-speed signal generator which generates a high-speed electric data signal whose frequency band is limited, the high-speed electric data signal generator having an output terminal provided to output the high-speed electric data signal;
   a low-speed signal generator which generates a low-speed electric clock signal of a frequency lower than the frequency band of the high-speed signal, the low-speed electric clock signal generator having an output terminal provided to output the low-speed electric clock signal; and
   a signal superimposing unit which generates a superimposed signal by superimposing the high-speed electric data signal and the low-speed electric clock signal, the signal superimposing unit having a first input terminal electrically connected to the output terminal of the high-speed signal generator and provided to take the high-speed electric data signal in, a second input terminal electrically connected to the output terminal of the low-speed signal generator and provided to take the low-speed electric clock signal in, and an output terminal provided to output the superimposed signal,
   wherein the transmitting device further comprises:
   a first coupling capacitor coupled to a first terminal; and
   a second coupling capacitor coupled to a second terminal,
   wherein the output terminal comprises the first terminal and the second terminal.

2. The transmitting device according to claim 1, wherein a ratio between a data rate of the high-speed electric data signal and the frequency of the low-speed electric clock signal is an integer ratio.

3. The transmitting device according to claim 1, wherein the low-speed signal generator generates the low-speed electric clock signal with a time waveform of a sine wave or a triangular wave.

4. The transmitting device according to claim 1, wherein the high-speed signal generator generates the high-speed electric data signal whose frequency band is limited by encoding.

5. The transmitting device according to claim 4, wherein the high-speed signal generator generates the high-speed electric data signal whose frequency band is limited by mBnB encoding ensuring a DC balance.

6. The transmitting device according to claim 1, wherein the low-speed signal generator generates the low-speed electric clock signal with spread spectrum.

7. The transmitting device according to claim 1, wherein the low-speed electric clock signal and the high-speed electric data signal have an independent phase relationship.

8. The transmitting device of claim 1,
   wherein the superimposed signal is a first electric signal, and the output terminal is configured to output the first electric signal.

9. The transmitting device of claim 1,
   wherein a phase of the clock signal is not controlled by the low-speed signal generator with respect to the high-speed electric data signal.

10. A transmitting device comprising:
a high-speed signal generator which generates a high-speed electric signal whose frequency band is limited, the high-speed electric signal generator having an output terminal provided to output the high-speed electric signal;
a low-speed signal generator which generates a low-speed electric signal of a frequency lower than the frequency band of the high-speed signal, the low-speed electric signal generator having an output terminal provided to output the low-speed electric signal; and
a signal superimposing unit which generates a superimposed signal by superimposing the high-speed electric signal and the low-speed electric signal, the signal superimposing unit having a first input terminal electrically connected to the output terminal of the high-speed signal generator and provided to take the high-speed electric signal in, a second input terminal electrically connected to the output terminal of the low-speed signal generator and provided to take the low-speed electric signal in, and an output terminal provided to output the superimposed signal,
wherein
the low-speed signal generator generates the low-speed electric signal with spread spectrum, and
wherein
the high-speed signal generator generates the high-speed electric signal with spread spectrum.

11. A transmitting device comprising:
a high-speed signal generator which generates a high-speed electric signal whose frequency band is limited, the high-speed electric signal generator having an output terminal provided to output the high-speed electric signal;
a low-speed signal generator which generates a low-speed electric signal of a frequency lower than the frequency band of the high-speed signal, the low-speed electric signal generator having an output terminal provided to output the low-speed electric signal; and
a signal superimposing unit which generates a superimposed signal by superimposing the high-speed electric signal and the low-speed electric signal, the signal superimposing unit having a first input terminal electrically connected to the output terminal of the high-speed signal generator and provided to take the high-speed electric signal in, a second input terminal electrically connected to the output terminal of the low-speed signal generator and provided to take the low-speed electric signal in, and an output terminal provided to output the superimposed signal,
wherein
the high-speed signal generator includes a serializer which converts parallel data to serial data and outputs the serial data as the high-speed electric signal through the output terminal of the high-speed signal generator, and
the low-speed signal generator includes a phase locked loop circuit which generates a designation clock designating a timing of each bit of the serial data outputted from the serializer and supplies the designation clock to the serializer, and a wiring structure for outputting, as the low-speed electric signal, a clock inputted to the phase locked loop circuit or a clock outputted from the phase locked loop circuit to the signal superimposing unit through the output terminal of the low-speed signal generator.

12. A transmitting device comprising:
a high-speed signal generator which generates a high-speed electric signal whose frequency band is limited, the high-speed electric signal generator having an output terminal provided to output the high-speed electric signal;
a low-speed signal generator which generates a low-speed electric signal of a frequency lower than the frequency band of the high-speed signal, the low-speed electric signal generator having an output terminal provided to output the low-speed electric signal; and
a signal superimposing unit which generates a superimposed signal by superimposing the high-speed electric signal and the low-speed electric signal, the signal superimposing unit having a first input terminal electrically connected to the output terminal of the high-speed signal generator and provided to take the high-speed electric signal in, a second input terminal electrically connected to the output terminal of the low-speed signal generator and provided to take the low-speed electric signal in, and an output terminal provided to output the superimposed signal,
wherein
the signal superimposing unit includes a first current mode logic circuit and a second current mode logic circuit which shares a resistor disposed between a power supply potential feed terminal and a ground potential feed terminal, the first current mode logic circuit and the second current mode logic circuit being disposed between the resistor and the ground potential feed terminal,
the first current mode logic circuit has an input terminal provided to take the high-speed electric signal in, and an output terminal electrically connected to the output terminal of the signal superimposing unit, and
the second current mode logic circuit has an input terminal provided to take the low-speed electric signal in, and an output terminal electrically connected to the output terminal of the signal superimposing unit.

13. A transmitting device comprising:
a high-speed signal generator which generates a high-speed electric signal whose frequency band is limited, the high-speed electric signal generator having an output terminal provided to output the high-speed electric signal;
a low-speed signal generator which generates a low-speed electric signal of a frequency lower than the frequency band of the high-speed signal, the low-speed electric signal generator having an output terminal provided to output the low-speed electric signal; and
a signal superimposing unit which generates a superimposed signal by superimposing the high-speed electric signal and the low-speed electric signal, the signal superimposing unit having a first input terminal electrically connected to the output terminal of the high-speed signal generator and provided to take the high-speed electric signal in, a second input terminal electrically connected to the output terminal of the low-speed signal generator and provided to take the low-speed electric signal in, and an output terminal provided to output the superimposed signal,
wherein
the signal superimposing unit includes
a power supply circuit which outputs a drive voltage amplitude-modulated by the low-speed electric signal, and
a buffer driven to superimpose the high-speed electric signal and the low-speed electric signal by the drive voltage applied from the power supply circuit, the buffer having an input terminal provided to take the high-speed electric signal in, and an output terminal electrically connected to the output terminal of the signal superimposing unit and provided to output the superimposed signal.

14. A receiving device comprising:

a signal separator which separates a superimposed signal, obtained by superimposing a high-speed electric signal whose frequency band is limited and a low-speed electric signal of a frequency lower than the frequency band of the high-speed electric signal, into the high-speed electric signal and the low-speed electric signal, the signal separator having an input terminal provided to receive the superimposed signal, a first output terminal provided to output the high-speed electric signal separated from the superimposed signal, and a second output terminal provided to output the low-speed electric signal separated from the superimposed signal; and a recovery unit which performs frequency tracking on the basis of the low-speed electric signal outputted from the second output terminal of the signal separator, performs phase tracking on the basis of the high-speed electric signal outputted from the first output terminal of the signal separator, and recovers a clock and data, the recovery unit having a first input terminal electrically connected to the first output terminal of the signal separator and provided to take the high-speed electric signal in, and a second input terminal electrically connected to the second output terminal of the signal separator and provided to take the low-speed electric signal in, wherein a data rate DR of the high-speed electric signal, a coefficient K corresponding to a data communication system of the high-speed electric signal, a frequency F of the low-speed electric signal, and a ratio (M/N) of a frequency of the clock to the frequency of the low-speed electric signal at an end of frequency tracking by the recovery unit satisfy a relationship represented by the following Formula (1).

$$\frac{DR}{K} = F \cdot \frac{M}{N}. \qquad (1)$$

15. The receiving device according to claim 14, wherein the signal separator includes a first filter disposed between the input terminal and the first output terminal of the signal separator to selectively output the high-speed electric signal from the received superimposed signal, and a second filter disposed between the input terminal and the second output terminal of the signal separator to selectively output the low-speed electric signal from the received superimposed signal.

16. The receiving device according to claim 15, wherein a frequency F of the low-speed electric signal, a data rate DR of the high-speed electric signal, a coefficient L corresponding to a data encoding system of the high-speed electric signal, a ratio Vr of an amplitude of the high-speed electric signal to an amplitude of the low-speed electric signal, and an allowable interference amount Gd of the low-speed electric signal with the frequency band of the high-speed electric signal satisfy a relationship represented by the following Formula (2).

$$F \leq \frac{DR}{L} \cdot \frac{1}{\sqrt{\left(\frac{1}{Gd \cdot Vr}\right)^2 - 1}}. \qquad (2)$$

17. The receiving device according to claim 14, wherein the recovery unit includes a first phase detector having a third input terminal electrically connected to the first output terminal of the signal separator and provided to take in the high-speed electric signal as the first input terminal of the recovery unit, a fourth input terminal provided to take an oscillation signal in, and an output terminal provided to output a first phase difference signal indicating a phase difference between the high-speed electric signal and the oscillation signal, a second phase detector having a fifth input terminal electrically connected to the second output terminal of the signal separator and provided to take in the low-speed electric signal or a signal obtained by frequency-dividing the low-speed electric signal as the second input terminal of the recovery unit, a sixth input terminal provided to take in the oscillation signal or a signal obtained by frequency-dividing the oscillation signal, and an output terminal provided to output a second phase difference signal indicating a phase difference between a first input signal took-in through the fifth input terminal and a second input signal took-in through the sixth input terminal, a lock detector which detects whether frequency lock is established between the first input signal and the second input signal, a charge pump having an input terminal provided to take in the second phase difference signal during a period in which the lock detector detects that frequency lock is not established or take in the first phase difference signal during a period in which the lock detector detects that frequency lock is established and an output terminal provided to output a corrected voltage value for reducing the phase difference indicated by the first phase difference signal or the second phase difference signal, a loop filter having an input terminal electrically connected to the output terminal of the charge pump and provided to take the corrected voltage value in and an output terminal provided to output a controlled voltage value increased or reduced in response to fluctuations in the took-in corrected voltage value, and a voltage controlled oscillator including an input terminal electrically connected to the output terminal of the loop filter and provided to take the controlled voltage value in and an output terminal provided to output the oscillation signal having a frequency corresponding to the took-in controlled voltage value, and the first phase detector outputs the recovered data and the voltage controlled oscillator outputs the recovered clock as the oscillation signal during the period in which the lock detector detects that frequency lock is established.

18. The receiving device according to claim 14, further comprising a signal detector which detects presence or absence of the low-speed electric signal, the signal detector having an input terminal electrically connected to the second output terminal of the signal separator and provided to take the low-speed electric signal in.

19. The receiving device according to claim 14, further comprising
- an error detector which detects whether the low-speed electric signal is normal, the error detector having an input terminal electrically connected to the second output terminal of the signal separator and provided to take the low-speed electric signal in, wherein
- the recovery unit stops a recovery operation when the error detector detects that the low-speed electric signal is abnormal and resumes the recovery operation when the error detector detects that the low-speed electric signal is normal after the stop of the recovery operation.

20. The receiving device according to claim 14, further comprising
- a first error detector which detects whether the high-speed electric signal is normal, the first error detector having an input terminal electrically connected to the first output terminal of the signal separator and provided to take the high-speed electric signal in, and a second error detector which detects whether the low-speed electric signal is normal, the second error detector having an input terminal electrically connected to the second output terminal of the signal separator and provided to take the low-speed electric signal in, wherein
- the recovery unit stops a recovery operation when the first error detector detects that the high-speed electric signal is abnormal and resumes the recovery operation when the second error detector detects that the low-speed electric signal is normal after the stop of the recovery operation.

21. The receiving device according to claim 14, wherein the low-speed electric signal and the high-speed electric signal have an independent phase relationship.

22. A repeating device comprising:
- a signal separator which separates a superimposed signal, obtained by superimposing a high-speed electric signal whose frequency band is limited and a low-speed electric signal of a frequency lower than the frequency band of the high-speed electric signal, into the high-speed electric signal and the low-speed electric signal, the signal separator having an input terminal provided to receive the superimposed signal, a first output terminal provided to output the high-speed electric signal separated from the superimposed signal, and a second output terminal provided to output the low-speed electric signal separated from the superimposed signal;
- a recovery unit which performs frequency tracking on the basis of the low-speed electric signal outputted from the second output terminal of the signal separator, performs phase tracking on the basis of the high-speed electric signal outputted from the first output terminal of the signal separator, and recovers a clock and data, the recovery unit having a first input terminal electrically connected to the first output terminal of the signal separator and provided to take the high-speed electric signal in and a second input terminal electrically connected to the second output terminal of the signal separator and provided to take the low-speed electric signal in; and
- a signal superimposing unit which outputs a superimposed signal, the superimposed signal being obtained by superimposing the high-speed electric signal obtained from the recovered data and a signal generated on the basis of the recovered clock or the low-speed electric signal outputted from the second output terminal of the signal separator, the signal superimposing unit having a first input terminal provided to take the high-speed electric signal in, a second input terminal provided to take in the signal generated on the basis of the recovered clock or the low-speed electric signal, and an output terminal provided to output the superimposed signal.

23. A transmission/reception system comprising:
(1) a transmitting device comprising:
- a high-speed signal generator which generates a high-speed electric signal whose frequency band is limited, the high-speed signal generator having an output terminal provided to output the high-speed electric signal;
- a low-speed signal generator which generates a low-speed electric signal of a frequency lower than the frequency band of the high-speed electric signal, the low-speed electric signal generator having an output terminal provided to output the low-speed electric signal; and
- a signal superimposing unit which generates a superimposed signal by superimposing the high-speed electric signal and the low-speed electric signal, the signal superimposing unit having a first input terminal electrically connected to the output terminal of the high-speed signal generator and provided to take the high-speed electric signal in, a second input terminal electrically connected to the output terminal of the low-speed signal generator and provided to take the low-speed electric signal in, and an output terminal provided to output the superimposed signal; and
(2) a receiving device which receives the superimposed signal outputted from the transmitting device and then arrived at the receiving device through a communication link, the receiving device comprising:
- a signal separator which separates the superimposed signal into the high-speed electric signal and the low-speed electric signal, the signal separator having an input terminal provided to receive the superimposed signal, a first output terminal provided to output the high-speed electric signal separated from the superimposed signal, and a second output terminal provided to output the low-speed electric signal separated from the superimposed signal; and
- a recovery unit which performs frequency tracking on the basis of the low-speed electric signal outputted from the second output terminal of the signal separator, performs phase tracking on the basis of the high-speed electric signal outputted from the first output terminal of the signal separator, and recovers a clock and data, the recovery unit having a first input terminal electrically connected to the first output terminal of the signal separator and provided to take the high-speed electric signal in, and a second input terminal electrically connected to the second output terminal of the signal separator and provided to take the low-speed electric signal in.

24. The transmission/reception system according to claim 23, wherein
- the transmission/reception system includes a plurality of communication units each having the same structure as a unit including the transmitting device and the receiving device connected through a communication link,
- any of the transmitting devices included in the communication units outputs a superimposed signal obtained by superimposing the high-speed electric signal and the low-speed electric signal, and the rest of the transmitting devices outputs the high-speed electric signal in a non-superimposed state, and any of the receiving devices included in the communication units receives the superimposed signal, separates the received superimposed signal into the high-speed electric signal and the low-speed electric signal, and supplies the separated low-speed electric signal to the rest of the receiving devices.

25. The transmission/reception system according to claim 24, wherein
each of the receiving devices included in the communication units detects whether the superimposed signal has been received using a signal detector which detects the presence or absence of the low-speed electric signal.

26. A transmission/reception system comprising:
(1) a transmitting device comprising:
a high-speed signal generator which generates a high-speed signal whose frequency band is limited, the high-speed signal generator having an output terminal provided to output the high-speed signal;
a low-speed signal generator which generates a low-speed signal of a frequency lower than the frequency band of the high-speed signal, the low-speed signal generator having an output terminal provided to output the low-speed signal; and
a first signal superimposing unit which generates a superimposed signal by superimposing the high-speed signal and the low-speed signal, the first signal superimposing unit having a first input terminal electrically connected to the output terminal of the high-speed signal generator and provided to take the high-speed signal in, a second input terminal electrically connected to the output terminal of the low-speed signal generator and provided to take the low-speed signal in, and an output terminal provided to output the superimposed signal;
(2) one or more repeating devices each receiving the superimposed signal outputted from the transmitting device and then arrived at the repeating device through a communication link and output a received superimposed signal, each of one or more repeating devices comprising:
a first signal separator which separates the superimposed signal into the high-speed signal and the low-speed signal, the first signal separator having an input terminal provided to receive the superimposed signal, a first output terminal provided to output the high-speed signal separated from the superimposed signal, and a second output terminal provided to output the low-speed signal separated from the superimposed signal;
a first recovery unit which performs frequency tracking on the basis of the low-speed signal outputted from the second output terminal of the first signal separator, performs phase tracking on the basis of the high-speed signal outputted from the first output terminal of the first signal separator, and recovers a clock and data, the first recovery unit having a first input terminal electrically connected to the first output terminal of the first signal separator and provided to take the high-speed signal in and a second input terminal electrically connected to the second output terminal of the first signal separator and provided to take the low-speed signal in; and
a second signal superimposing unit which outputs a superimposed signal, the superimposed signal being obtained by superimposing the high-speed signal obtained from the recovered data and a signal generated on the basis of the recovered clock or the low-speed signal outputted from the second output terminal of the first signal separator, the second signal superimposing unit having a first input terminal provided to take the high-speed signal in, a second input terminal provided to take in the signal generated on the basis of the recovered clock or the low-speed signal, and an output terminal provided to output the superimposed signal; and
(3) a receiving device which receiving the superimposed signal arrived at the receiving device through the communication link on which the one or more repeating devices are disposed, the receiving device comprising:
a second signal separator which separates the superimposed signal into the high-speed signal and the low-speed signal, the second signal separator having an input terminal provided to receive the superimposed signal, a first output terminal provided to output the high-speed signal separated from the superimposed signal, and a second output terminal provided to output the low-speed signal separated from the superimposed signal; and
a second recovery unit which performs frequency tracking on the basis of the low-speed signal outputted from the second output terminal of the second signal separator, performs phase tracking on the basis of the high-speed signal outputted from the first output terminal of the second signal separator, and recovers a clock and data, the second recovery unit having a first input terminal electrically connected to the first output terminal of the second signal separator and provided to take the high-speed signal in, and a second input terminal electrically connected to the second output terminal of the second signal separator and provided to take the low-speed signal in.

27. The transmission/reception system according to claim 26, wherein
the transmission/reception system includes a plurality of communication units each having the same structure as a unit including the transmitting device and the receiving device connected through a communication link,
any of the transmitting devices included in the communication units outputs a superimposed signal obtained by superimposing the high-speed signal and the low-speed signal, and the rest of the transmitting devices outputs the high-speed signal in a non-superimposed state, and
any of the receiving devices included in the communication units receives the superimposed signal, separates the received superimposed signal into the high-speed signal and the low-speed signal, and supplies the separated low-speed signal to the rest of the receiving devices.

28. The transmission/reception system according to claim 27, wherein
each of the receiving devices included in the communication units detects whether the superimposed signal has been received using a signal detector which detects the presence or absence of the low-speed signal.

29. A transmitting device comprising:
a high-speed signal generator which generates a high-speed electric data signal whose frequency band is limited, the high-speed electric data signal generator having an output terminal provided to output the high-speed electric data signal;
a low-speed signal generator which generates a low-speed electric clock signal of a frequency lower than the frequency band of the high-speed signal, the low-speed electric clock signal generator having an output terminal provided to output the low-speed electric clock signal; and a signal superimposing unit which generates a superimposed signal by superimposing the high-speed electric data signal and the low-speed electric clock signal, the signal superimposing unit having a first input terminal electrically connected to the output terminal of the high-speed signal generator and provided to take the high-speed electric data signal in, a second input terminal electrically connected to the output terminal of the low-speed signal generator and provided to take the low-speed electric clock signal in, and an output terminal provided to output the superimposed signal, wherein the signal superimposing unit further comprises:

a first resistor coupled to a first terminal; and a second resistor coupled to a second terminal, wherein the output terminal comprises the first terminal and the second terminal, the first terminal is coupled to a power supply via the first resistor, and the second terminal is coupled to the power supply via the second resistor.

30. The transmitting device according to claim 29, wherein a ratio between a data rate of the high-speed electric data signal and the frequency of the low-speed electric clock signal is an integer ratio.

31. The transmitting device according to claim 29, wherein the low-speed signal generator generates the low-speed electric clock signal with a time waveform of a sine wave or a triangular wave.

32. The transmitting device according to claim 29, wherein the high-speed signal generator generates the high-speed electric data signal whose frequency band is limited by encoding.

33. The transmitting device according to claim 32, wherein the high-speed signal generator generates the high-speed electric data signal whose frequency band is limited by mBnB encoding ensuring a DC balance.

34. The transmitting device according to claim 29, wherein the low-speed signal generator generates the low-speed electric clock signal with spread spectrum.

35. The transmitting device according to claim 29, wherein the low-speed electric clock signal and the high-speed electric data signal have an independent phase relationship.

36. The transmitting device of claim 29, wherein the superimposed signal is a first electric signal, and the output terminal is configured to output the first electric signal.

37. The transmitting device of claim 29, wherein a phase of the clock signal is not controlled by the low-speed signal generator with respect to the high-speed electric data signal.

* * * * *